United States Patent
Scheible et al.

(10) Patent No.: US 10,651,388 B2
(45) Date of Patent: May 12, 2020

(54) COMPOSITIONS COMPRISING AT LEAST ONE POLYMER AND AT LEAST ONE METAL COMPLEX AND TO ELECTROLUMINESCENT DEVICES CONTAINING SAID COMPOSITIONS

(71) Applicant: Merck Patent GmbH, Darmstadt (DE)

(72) Inventors: Katja Maria Scheible, Darmstadt (DE); Fabrice Eckes, Saint Louis (FR); Holger Heil, Frankfurt am Main (DE); Henning Seim, Darmstadt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 15/540,762

(22) PCT Filed: Dec. 4, 2015

(86) PCT No.: PCT/EP2015/002452
§ 371 (c)(1),
(2) Date: Jun. 29, 2017

(87) PCT Pub. No.: WO2016/107667
PCT Pub. Date: Jul. 7, 2016

(65) Prior Publication Data
US 2017/0365786 A1    Dec. 21, 2017

(30) Foreign Application Priority Data
Dec. 30, 2014  (EP) .................................... 14004448

(51) Int. Cl.
| H01L 51/00 | (2006.01) |
| C08G 61/12 | (2006.01) |
| C08K 5/098 | (2006.01) |
| H01L 51/50 | (2006.01) |

(52) U.S. Cl.
CPC .......... *H01L 51/0043* (2013.01); *C08G 61/12* (2013.01); *C08G 61/121* (2013.01); *C08K 5/098* (2013.01); *H01L 51/0035* (2013.01); *H01L 51/0077* (2013.01); *C08G 2261/124* (2013.01); *C08G 2261/142* (2013.01); *C08G 2261/148* (2013.01); *C08G 2261/1412* (2013.01); *C08G 2261/312* (2013.01); *C08G 2261/3142* (2013.01); *C08G 2261/3162* (2013.01); *C08G 2261/334* (2013.01); *C08G 2261/411* (2013.01); *C08G 2261/51* (2013.01); *C08G 2261/512* (2013.01); *C08G 2261/5222* (2013.01); *C08G 2261/95* (2013.01); *H01L 51/0003* (2013.01); *H01L 51/5088* (2013.01); *Y02E 10/549* (2013.01); *Y02P 70/521* (2015.11)

(58) Field of Classification Search
CPC ............ H01L 51/0043; H01L 51/5088; H01L 51/0077; H01L 51/0035; H01L 51/0003; C08G 61/121; C08G 61/12; C08G 2261/334; C08G 2261/148; C08G 2261/312; C08G 2261/124; C08G 2261/142; C08G 2261/51; C08G 2261/5222; C08G 2261/95; C08G 2261/411; C08G 2261/3162; C08G 2261/3142; C08G 2261/1412; C08G 2261/512; C08K 5/098; Y02P 70/521; Y02E 10/549
USPC ........................................... 252/518.1, 519.3
See application file for complete search history.

(56) References Cited

U.S. PATENT DOCUMENTS

| 9,685,624 | B2 | 6/2017 | Reusch et al. |
| 9,815,940 | B2 * | 11/2017 | Eckes .................... C08G 61/12 |
| 2004/0138455 | A1 * | 7/2004 | Stossel ................ C07F 15/0033 546/2 |
| 2011/0303876 | A1 | 12/2011 | Ludemann et al. |
| 2015/0069303 | A1 | 3/2015 | Eckes et al. |
| 2015/0123047 | A1 | 5/2015 | Maltenberger et al. |

FOREIGN PATENT DOCUMENTS

| EP | 1239526 A2 * | 9/2002 | .......... C07F 15/0033 |
| EP | 2314639 A1 | 4/2011 | |
| JP | 2009522273 A | 6/2009 | |
| JP | 2010065213 A | 3/2010 | |
| JP | 2012519214 A | 8/2012 | |
| JP | 2015514839 A | 5/2015 | |
| JP | 2015516487 A | 6/2015 | |
| JP | 2015526882 A | 9/2015 | |
| WO | WO-2002068435 A1 * | 9/2002 | .............. C07F 15/00 |
| WO | WO-2004026886 A2 * | 4/2004 | .......... C07F 15/0033 |
| WO | 2007079101 A2 | 7/2007 | |
| WO | 2013156129 A1 | 10/2013 | |
| WO | WO-2013156130 A1 * | 10/2013 | ............. C08G 61/12 |
| WO | 2013182389 A2 | 12/2013 | |
| WO | 2014023478 A1 | 2/2014 | |

OTHER PUBLICATIONS

CAS reg. No. 1469899-03-3, Nov. 6, 2013. (Year: 2013).*
"Metalloid", Wikipedia, p. 1, Aug. 19, 2019. (Year: 2019).*
English Translation of Office Action dated Oct. 15, 2019 in Japanese Patent Application No. 2017-535071.

* cited by examiner

*Primary Examiner* — Douglas J McGinty
(74) *Attorney, Agent, or Firm* — Kim IP Law Group PLLC

(57) ABSTRACT

The present invention relates to compositions comprising at least one polymer which contains triarylamine repeating units, and at least one metal complex, to methods for the production thereof, and the use thereof in electronic devices, especially in organic electroluminescent devices, so-called OLEDs (OLED=Organic Light Emitting Diode). The present invention also relates to organic electroluminescent devices which contain said compositions.

33 Claims, No Drawings

COMPOSITIONS COMPRISING AT LEAST ONE POLYMER AND AT LEAST ONE METAL COMPLEX AND TO ELECTROLUMINESCENT DEVICES CONTAINING SAID COMPOSITIONS

CROSS-REFERENCE TO RELATED APPLICATIONS

This patent application is a U.S. national stage application, filed pursuant to 35 U.S.C. § 371, of PCT Application No. PCT/EP2015/002452, filed Dec. 4, 2015, which claims priority to European Patent Application No. 14004448.8, filed Dec. 30, 2014, both of which are incorporated by reference herein in their entirety.

The present invention relates to compositions comprising at least one polymer and at least one metal complex, to processes for production thereof and to the use thereof in electronic or optoelectronic devices, especially in organic electroluminescent devices, called OLEDs (OLED=organic light-emitting diodes). The present invention also further relates to organic electroluminescent devices comprising these compositions.

In electronic or optoelectronic devices, especially in organic electroluminescent devices (OLEDs), components of various functionality are required. In OLEDs, the different functionalities are normally present in different layers. Reference is made in this case to multilayer OLED systems. The layers in these multilayer OLED systems include charge-injecting layers, for example electron- and hole-injecting layers, charge-transporting layers, for example electron- and hole-conducting layers, and layers containing light-emitting components. These multilayer OLED systems are generally produced by successive layer by layer application.

If two or more layers are applied from solution, it has to be ensured that any layer already applied, after drying, is not destroyed by the subsequent application of the solution for production of the next layer. This can be achieved, for example, by rendering a layer insoluble, for example by crosslinking. Methods of this kind are disclosed, for example, in EP 0 637 899 and WO 96/20253.

Furthermore, it is also necessary to match the functionalities of the individual layers in terms of the material such that very good results, for example in terms of lifetime, efficiency, etc., are achieved. For instance, particularly the layers that directly adjoin an emitting layer, especially the hole-transporting layer (HTL=hole transport layer) have a significant influence on the properties of the adjoining emitting layer.

Known electronic devices and the methods for production thereof have a usable profile of properties. However, there is a constant need to improve the properties of these devices and the methods for production of these devices.

These properties of the devices especially include the energy efficiency with which an electronic device solves the problem defined. In the case of organic light-emitting diodes, the light yield in particular should be sufficiently high that a minimum amount of electrical power has to be applied to achieve a particular luminous flux. In addition, a minimum voltage should also be necessary to achieve a defined luminance. A further particular problem is the lifetime of the electronic devices.

One of the problems addressed by the present invention was therefore that of providing compositions which can firstly be processed as a solution and which secondly lead to an improvement in the properties of the device, especially of the OLED, when used in electronic or optoelectronic devices, preferably in OLEDs, and here especially in the hole injection and/or hole transport layer thereof.

It has been found that, surprisingly, compositions including polymers having repeat triarylamine units and metal complexes, especially when used for production of the hole-injecting layer and/or hole-transporting layer of OLEDs, lead to a distinct lowering of the voltage for achievement of a given luminance, a reduction in the electrical power needed to achieve a particular luminous flux, and an increase in the lifetime of these OLEDs. It has been found here that, surprisingly, the components of the composition, i.e. the polymers and the metal complexes, interact in a synergistic manner without having any adverse effect on other properties. Particular advantages can especially be achieved by using an inventive composition in a hole injection layer.

The present application thus provides a composition comprising at least one polymer and at least one metal complex, which is characterized in that the polymer which has at least one structural unit of the following formula (I):

where $Ar^1$, $Ar^2$ and $Ar^3$ are the same or different at each instance and are a mono- or polycyclic, aromatic or heteroaromatic ring system which may be substituted by one or more R radicals;

R is the same or different at each instance and is H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C=CR^1$, $C≡C$, $Si(R^1)_2$, $C=O$, $C=S$, $C=NR^1$, $P(=O)(R^1)$, SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; where two or more R radicals together may also form a mono- or polycyclic, aliphatic, aromatic and/or benzofused ring system;

$R^1$ is the same or different at each instance and is H, D, F or an aliphatic hydrocarbyl radical having 1 to 20 carbon atoms, an aromatic and/or a heteroaromatic hydrocarbyl radical having 5 to 20 carbon atoms, in which one or more hydrogen atoms may also be replaced by F; where two or more $R^1$ substituents together may also form a mono- or polycyclic, aliphatic or aromatic ring system; and the dotted lines represent bonds to adjacent structural units in the polymer; and the metal complex comprises a metal atom of groups 13 to 15 and a ligand of the structure (L-I):

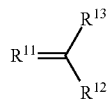

(L-I)

in which $R^{11}$ and $R^{12}$ may independently be oxygen, sulfur, selenium, NH or $NR^{14}$ where $R^{14}$ is selected from the group comprising alkyl or aryl and may be bonded to $R^{13}$; and $R^{13}$ is a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; where the $R^{13}$ radical may also form a ring system with one or both of the $R^{11}$ and $R^{12}$ radicals, where $R^1$ may assume the definition detailed above.

Preferably, at least one of the $Ar^1$, $Ar^2$ and $Ar^3$ radicals in formula (I) comprises at least one R substituent having at least 2 carbon atoms, preferably at least 4 and most preferably at least 6 carbon atoms.

Particularly advantageously, this substituent having 2 carbon atoms displays a C—C double bond between these 2 carbon atoms or this substituent having 2 carbon atoms is part of a mono- or polycyclic, aromatic or heteroaromatic ring system having 5 to 60 aromatic ring atoms.

In a first particularly preferred configuration, it may be the case that the $Ar^3$ radical of formula (I) is substituted by $Ar^4$ in at least one ortho position, preferably in exactly one of the two ortho positions, based on the position of the nitrogen atom shown in formula (I), where $Ar^4$ is a mono- or polycyclic, aromatic or heteroaromatic ring system which has 5 to 60 aromatic ring atoms and may be substituted by one or more R radicals, where R may be as defined above, especially for formula (I).

$Ar^4$ may be joined to $Ar^3$ either directly, i.e. by a single bond, or else via a linking group X.

The structural unit of the formula (I) may thus preferably have the structure of the following formula (Ia):

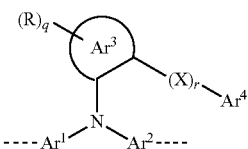

(Ia)

where $Ar^1$, $Ar^2$, $Ar^3$, $Ar^4$ and R may each be as defined above, q=0, 1, 2, 3, 4, 5 or 6, preferably 0, 1, 2, 3 or 4, X=$CR_2$, NR, $SiR_2$, O, S, C=O or P=O, preferably $CR_2$, NR, O or S, and r=0 or 1, preferably 0.

In the polymeric compounds have preferably 10 to 10 000, more preferably present application, the term "polymer" is understood to mean polymeric compounds, oligomeric compounds and dendrimers. The inventive 10 to 5000 and most preferably 10 to 2000 structural units (i.e. repeat units). The inventive oligomeric compounds preferably have 3 to 9 structural units. The branching factor of the polymers is between 0 (linear polymer, no branching sites) and 1 (fully branched dendrimer).

The polymers usable in accordance with the invention preferably have a molecular weight $M_w$ in the range from 1000 to 2 000 000 g/mol, more preferably a molecular weight $M_w$ in the range from 10 000 to 1 500 000 g/mol and most preferably a molecular weight $M_w$ in the range from 50 000 to 1 000 000 g/mol. The molecular weight $M_w$ is determined by means of GPC (=gel permeation chromatography) against an internal polystyrene standard.

The inventive polymers are conjugated, semi-conjugated or non-conjugated polymers. Preference is given to conjugated or semi-conjugated polymers.

According to the invention, the structural units of the formula (I) may be incorporated into the main chain or side chain of the polymer. Preferably, however, the structural units of the formula (I) are incorporated into the main chain of the polymer. In the case of incorporation into the side chain of the polymer, the structural units of the formula (I) may either be mono- or bivalent, meaning that they have either one or two bonds to adjacent structural units in the polymer.

"Conjugated polymers" in the context of the present application are polymers containing mainly $sp^2$-hybridized (or else optionally sp-hybridized) carbon atoms in the main chain, which may also be replaced by correspondingly hybridized heteroatoms. In the simplest case, this means the alternating presence of double and single bonds in the main chain, but polymers having units such as a meta-bonded phenylene, for example, should also be regarded as conjugated polymers in the context of this application. "Mainly" means that defects that occur naturally (involuntarily) and lead to interrupted conjugation do not make the term "conjugated polymer" inapplicable. Conjugated polymers are likewise considered to be polymers having a conjugated main chain and non-conjugated side chains. In addition, the present application likewise refers to conjugation when, for example, arylamine units, arylphosphine units, particular heterocycles (i.e. conjugation via nitrogen, oxygen or sulphur atoms) and/or organometallic complexes (i.e. conjugation by the metal atom) are present in the main chain. The same applies to conjugated dendrimers. In contrast, units such as simple alkyl bridges, (thio)ether, ester, amide or imide linkages, for example, are unambiguously defined as non-conjugated segments.

A semi-conjugated polymer shall be understood in the present application to mean a polymer containing conjugated regions separated from one another by non-conjugated sections, deliberate conjugation breakers (for example spacer groups) or branches, for example in which comparatively long conjugated sections in the main chain are interrupted by non-conjugated sections, or containing comparatively long conjugated sections in the side chains of a polymer non-conjugated in the main chain. Conjugated and semiconjugated polymers may also contain conjugated, semi-conjugated or non-conjugated dendrimers.

The term "dendrimer" in the present application shall be understood to mean a highly branched compound formed from a multifunctional core to which monomers branched in a regular structure are bonded, such that a tree-like structure is obtained. In this case, both the core and the monomers may assume any desired branched structures consisting both of purely organic units and organometallic compounds or coordination compounds. "Dendrimeric" shall generally be understood here as described, for example, by M. Fischer and F. Vögtle (*Angew. Chem., Int.* Ed. 1999, 38, 885).

The term "structural unit" in the present application is understood to mean a unit which, proceeding from a monomer unit having at least two, preferably two, reactive groups, by a bond-forming reaction, is incorporated into the polymer base skeleton as a portion thereof and is present thus bonded as a repeat unit within the polymer prepared.

The term "mono- or polycyclic aromatic ring system" is understood in the present application to mean an aromatic ring system which has 6 to 60, preferably 6 to 30 and more preferably 6 to 24 aromatic ring atoms and does not necessarily contain only aromatic groups, but in which it is also possible for two or more aromatic units to be interrupted by a short nonaromatic unit (<10% of the atoms other than H, preferably <5% of the atoms other than H), for example an $sp^3$-hybridized carbon atom or oxygen or nitrogen atom, a CO group, etc. For example, systems such as 9,9'-spirobifluorene, 9,9-diarylfluorene and 9,9-dialkylfluorene, for example, shall also be regarded as aromatic ring systems.

The aromatic ring systems may be mono- or polycyclic, meaning that they may have one ring (e.g. phenyl) or two or more rings which may also be fused (e.g. naphthyl) or covalently bonded (e.g. biphenyl), or contain a combination of fused and bonded rings.

Preferred aromatic ring systems are, for example, phenyl, biphenyl, terphenyl, [1,1':3',1"] terphenyl-2'-yl, quarterphenyl, naphthyl, anthracene, binaphthyl, phenanthrene, dihydrophenanthrene, pyrene, dihydropyrene, chrysene, perylene, tetracene, pentacene, benzpyrene, fluorene, indene, indenofluorene and spirobifluorene.

The term "mono- or polycyclic heteroaromatic ring system" is understood in the present application to mean an aromatic ring system having 5 to 60, preferably 5 to 30 and more preferably 5 to 24 aromatic ring atoms, where one or more of these atoms is/are a heteroatom. The "mono- or polycyclic heteroaromatic ring system" does not necessarily contain only aromatic groups, but may also be interrupted by a short nonaromatic unit (<10% of the atoms other than H, preferably <5% of the atoms other than H), for example an $sp^3$-hybridized carbon atom or oxygen or nitrogen atom, a CO group, etc.

The heteroaromatic ring systems may be mono- or polycyclic, meaning that they may have one ring or two or more rings which may also be fused or covalently bonded (e.g. pyridylphenyl), or contain a combination of fused and bonded rings. Preference is given to fully conjugated heteroaryl groups.

Preferred heteroaromatic ring systems are, for example, 5-membered rings such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or groups having several rings, such as carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups.

The mono- or polycyclic, aromatic or heteroaromatic ring system may be unsubstituted or substituted. "Substituted" in the present application means that the mono- or polycyclic, aromatic or heteroaromatic ring system has one or more R substituents.

R is preferably the same or different at each instance and is H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; at the same time, two or more R radicals together may also form a mono- or polycyclic, aliphatic, aromatic and/or benzofused ring system.

R is more preferably the same or different at each instance and is H, D, F, Cl, Br, I, $N(R^1)_2$, $Si(R^1)_3$, $B(OR^1)_2$, $C(=O)R^1$, $P(=O)(R^1)_2$, a straight-chain alkyl or alkoxy group having 1 to 20 carbon atoms or an alkenyl or alkynyl group having 2 to 20 carbon atoms or a branched or cyclic alkyl or alkoxy group having 3 to 20 carbon atoms, each of which may be substituted by one or more $R^1$ radicals, where one or more nonadjacent $CH_2$ groups may be replaced by $R^1C=CR^1$, $C\equiv C$, $Si(R^1)_2$, $C=O$, $C=NR^1$, $P(=O)(R^1)$, $NR^1$, O or $CONR^1$ and where one or more hydrogen atoms may be replaced by F, Cl, Br or I, or an aromatic or heteroaromatic ring system which has 5 to 30 aromatic ring atoms and may be substituted in each case by one or more $R^1$ radicals, or an aryloxy or heteroaryloxy group which has 5 to 30 aromatic ring atoms and may be substituted by one or more $R^1$ radicals, or an aralkyl or heteroaralkyl group which has 5 to 30 aromatic ring atoms and may be substituted by one or more $R^1$ radicals, or a diarylamino group, diheteroarylamino group or arylheteroarylamino group which has 10 to 20 aromatic ring atoms and may be substituted by one or more $R^1$ radicals; at the same time, two or more R radicals together may also form a mono- or polycyclic, aliphatic, aromatic and/or benzofused ring system.

R is even more preferably the same or different at each instance and is H, a straight-chain alkyl or alkoxy group having 1 to 10 carbon atoms or an alkenyl or alkynyl group having 2 to 10 carbon atoms or a branched or cyclic alkyl or alkoxy group having 3 to 10 carbon atoms, each of which may be substituted by one or more $R^1$ radicals, where one or more nonadjacent $CH_2$ groups may be replaced by $R^1C=CR^1$, $C\equiv C$, $C=O$, $C=NR^1$, $NR^1$, O or $CONR^1$, or an aromatic or heteroaromatic ring system which has 5 to 20 aromatic ring atoms and may be substituted in each case by one or more $R^1$ radicals, or an aryloxy or heteroaryloxy group which has 5 to 20 aromatic ring atoms and may be substituted by one or more $R^1$ radicals, or an aralkyl or heteroaralkyl group which has 5 to 20 aromatic ring atoms and may be substituted by one or more $R^1$ radicals, or a diarylamino group, diheteroarylamino group or arylheteroarylamino group which has 10 to 20 aromatic ring atoms and may be substituted by one or more $R^1$ radicals; at the same time, two or more R radicals together may also form a mono- or polycyclic, aliphatic, aromatic and/or benzofused ring system.

Preferred alkyl groups having 1 to 10 carbon atoms are depicted in the following table:

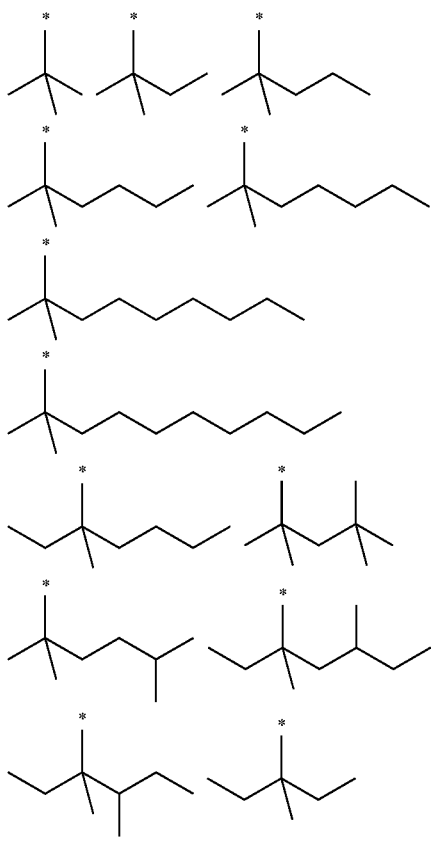

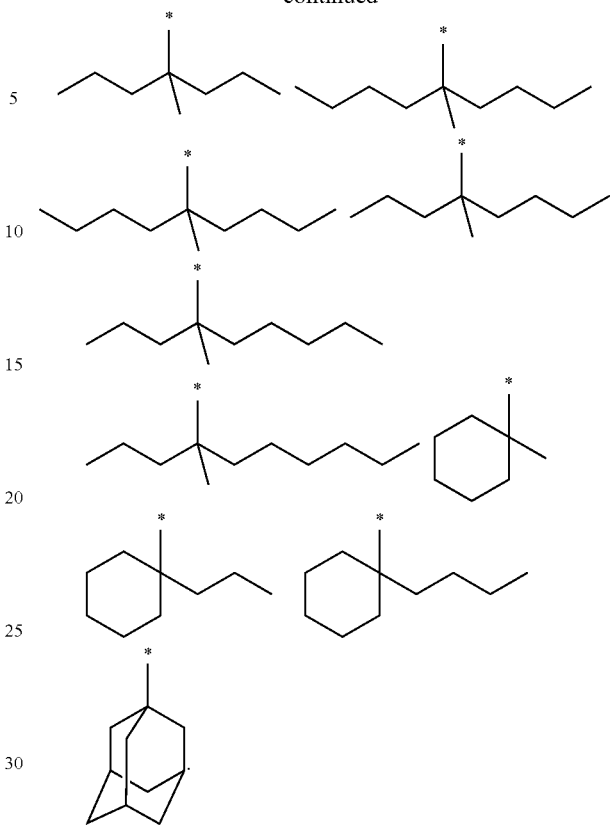

$R^1$ is preferably the same or different at each instance and is H, D, F or an aliphatic hydrocarbyl radical having 1 to 20 carbon atoms, an aromatic and/or a heteroaromatic hydrocarbyl radical having 5 to 20 carbon atoms, in which one or more hydrogen atoms may also be replaced by F; at the same time, two or more $R^1$ substituents together may also form a mono- or polycyclic, aliphatic or aromatic ring system.

$R^1$ is more preferably the same or different at each instance and is H, D or an aliphatic hydrocarbyl radical having 1 to 20 carbon atoms, an aromatic and/or a heteroaromatic hydrocarbyl radical having 5 to 20 carbon atoms; at the same time, two or more $R^1$ substituents together may also form a mono- or polycyclic, aliphatic or aromatic ring system.

$R^1$ is even more preferably the same or different at each instance and is H or an aliphatic hydrocarbyl radical having 1 to 10 carbon atoms, an aromatic and/or a heteroaromatic hydrocarbyl radical having 5 to 10 carbon atoms.

In a further embodiment of the present invention, the at least one structural unit of the formula (I) in the inventive polymer is characterized in that $Ar^3$ is substituted by $Ar^4$ in one of the two ortho positions, and $Ar^3$ is additionally joined to $Ar^4$ in the meta position adjacent to the substituted ortho position.

It may additionally be the case that the sum total of the ring atoms of the $Ar^4$ radical together with the ring atoms of the $Ar^3$ group bonded to said radical of formulae (Ia) and/or (Ib) is at least 10, preferably at least 12. Preferably, the $Ar^4$ radical together with the ring atoms of the $Ar^3$ group bonded to said radical of formulae (Ia) and/or (Ib) does not form a fused ring system. In addition, preferred radicals are $Ar^4$ groups having a low condensation level, and so preference is given to monocyclic, aromatic or heteroaromatic ring systems or to polycyclic, aromatic or heteroaromatic ring systems wherein the aromatic or heteroaromatic rings are bonded via groups which minimize or eliminate conjugation of the rings.

The structural unit of the formula (I) may thus preferably have the structure of the following formula (Ib):

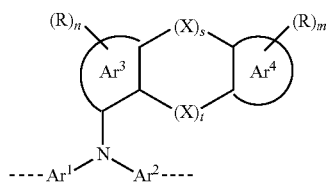
(Ib)

where $Ar^1$, $Ar^2$, $Ar^3$, $Ar^4$ and R may each be as defined above, m=0, 1, 2, 3 or 4, n=0, 1, 2 or 3, X=$CR_2$, NR, $SiR_2$, O, S, C=O or P=O, preferably $CR_2$, NR, O or S, and s and t are each 0 or 1, where the sum of (s+t)=1 or 2, preferably 1.

In a preferred embodiment, the at least one structural unit of the formula (I) is selected from the structural units of the following formulae (II), (III) and (IV):

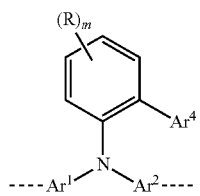
(II)

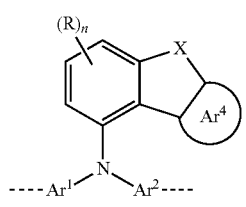
(III)

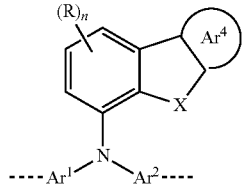
(IV)

where $Ar^1$, $Ar^2$, $Ar^4$ and R may each be as defined above, m=0, 1, 2, 3 or 4, n=0, 1, 2 or 3, and X=$CR_2$, NR, $SiR_2$, O, S, C=O or P=O, preferably $CR_2$, NR, O or S.

In a particularly preferred embodiment, the at least one structural unit of the formula (II) is selected from the structural unit of the following formula (V):

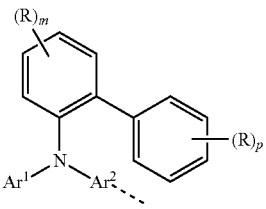
(V)

where $Ar^1$, $Ar^2$, R, m and the dotted lines may each be as defined above for formulae (I) and/or (Ib), and p=0, 1, 2, 3, 4 or 5.

Examples of preferred structural units of the formula (V) are depicted in the following table:

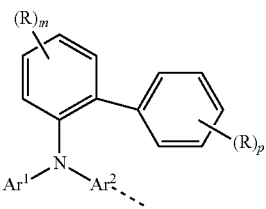
(Va)

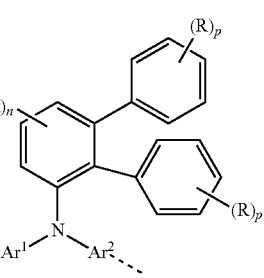
(Vb)

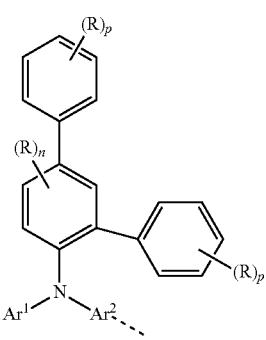
(Vc)

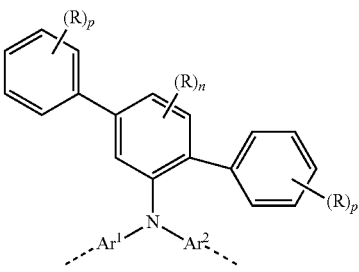
(Vd)

-continued

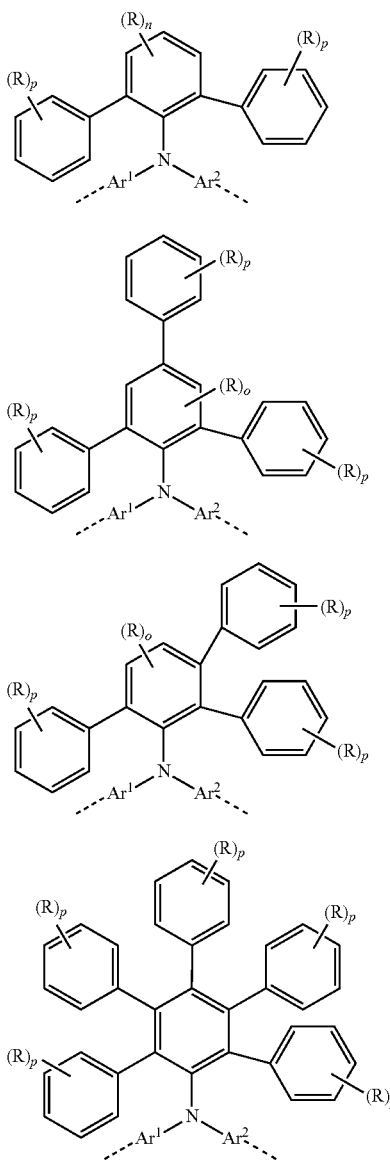

where Ar$^1$, Ar$^2$, R, m, n, p and the dotted lines may each be as defined above for formulae (I), (Ib) and/or (V), and o=0, 1 or 2.

In a further particularly preferred embodiment, the at least one structural unit of the formula (III) is selected from the structural unit of the following formula (VI):

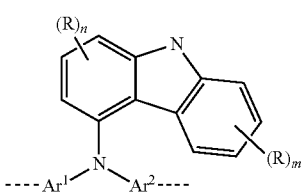

where Ar$^1$, Ar$^2$, R, X, m, n and the dotted lines may each be as defined above for formulae (I) and/or (Ib).

Examples of preferred structural units of the formula (VI) are depicted in the following table:

where Ar$^1$, Ar$^2$, R, m, n and p may each be as defined above for formulae (I), (Ib) and/or (V).

In yet a further particularly preferred embodiment, the at least one structural unit of the formula (IV) is selected from the structural unit of the following formula (VII):

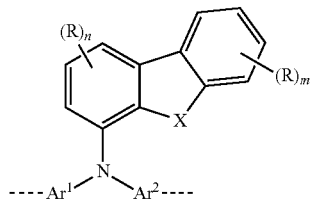
(VII)

where $Ar^1$, $Ar^2$, R, X, m, n and the dotted lines may each be as defined above for formulae (I) and/or (Ib).

Examples of preferred structural units of the formula (VII) are depicted in the following table:

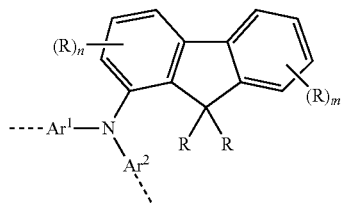
(VIIa)

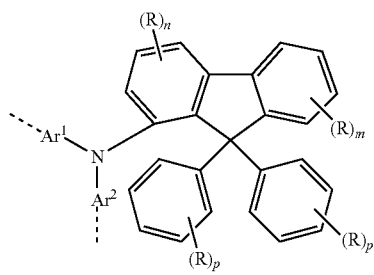
(VIIb)

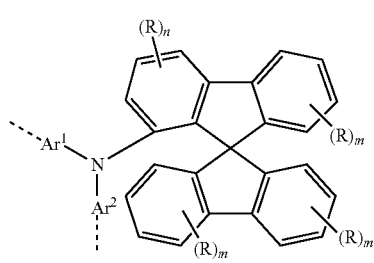
(VIIc)

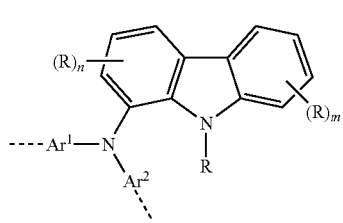
(VIId)

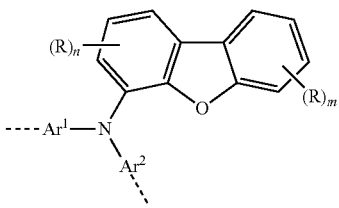
(VIIe)

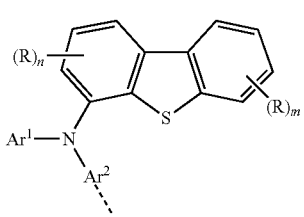
(VIIf)

where $Ar^1$, $Ar^2$, R, m, n, p and the dotted lines may each be as defined above for formulae (I), (Ib) and/or (V).

In a very particularly preferred embodiment, the at least one structural unit of the formula (V) is selected from the structural unit of the following formula (Vj):

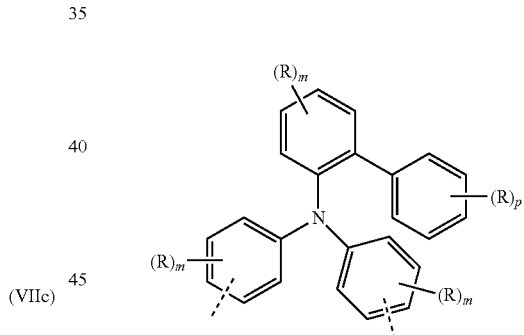
(Vj)

where R, m, p and the dotted lines may each be as defined above for formula (V).

Examples of preferred structural units of the formula (Vj) are depicted in the following table:

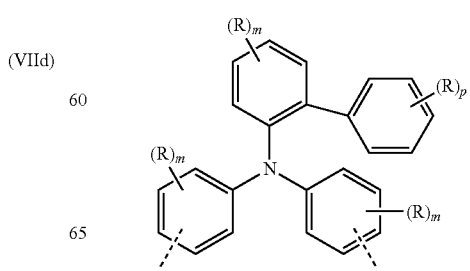
(Vj-1)

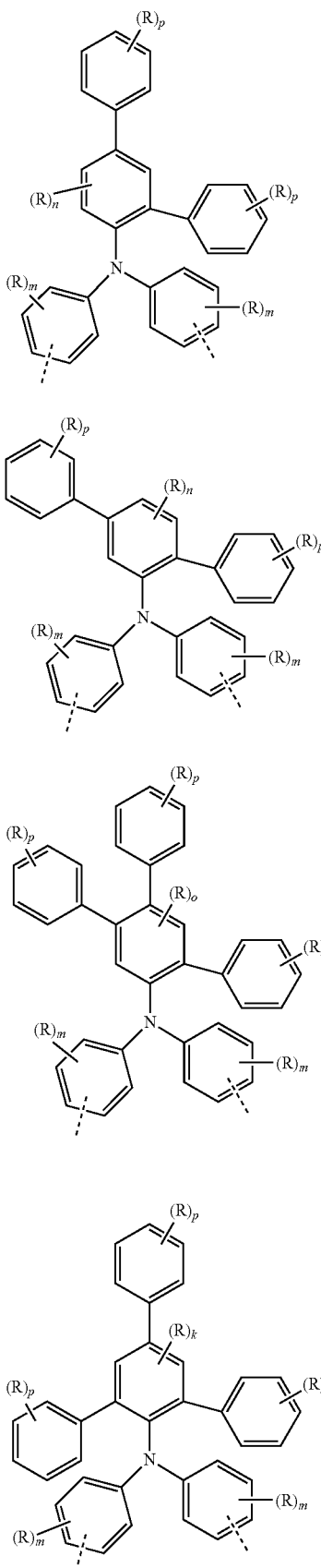
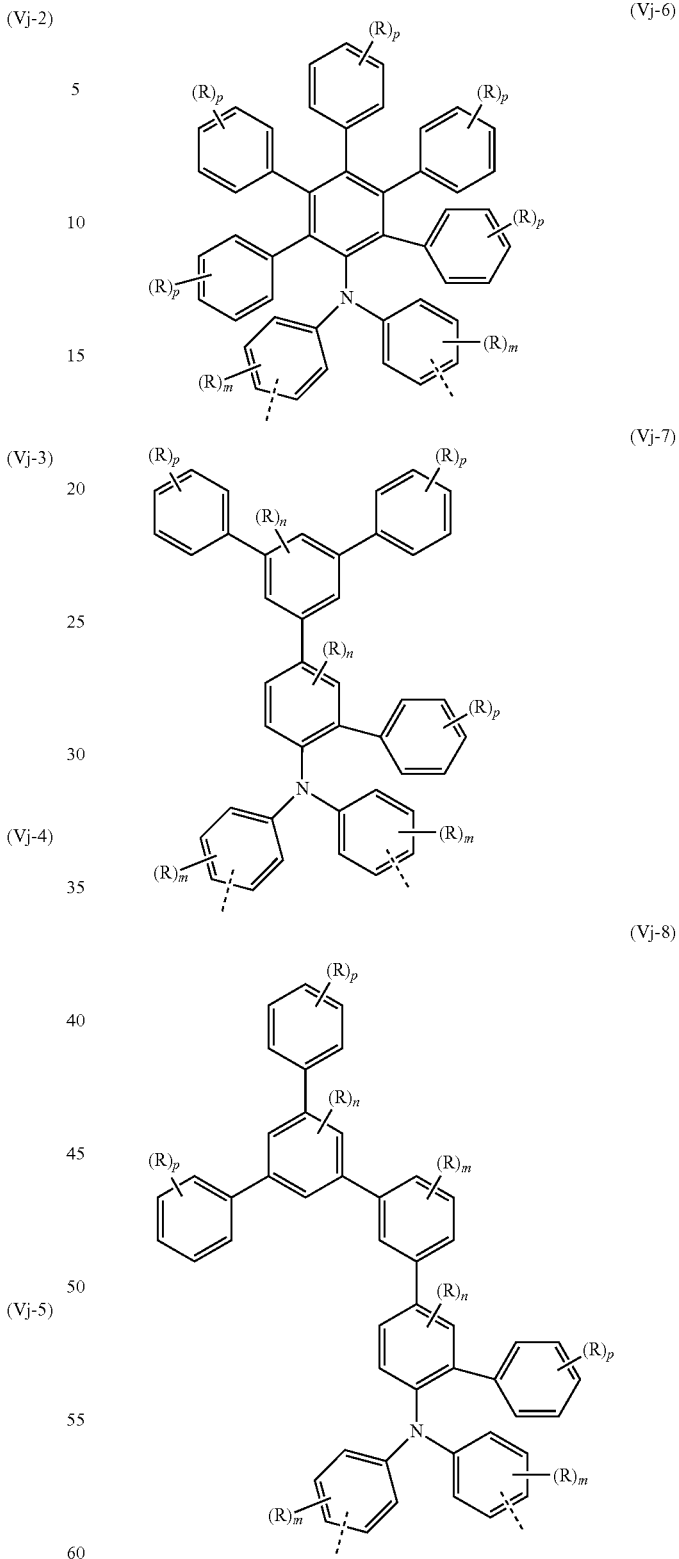
where R, m, n, p and the dotted lines may each be as defined for formula (V) and o is 0, 1 or 2.
In a further very particularly preferred embodiment, the at least one structural unit of the formula (VI) is selected from the structural unit of the following formula (VIg):

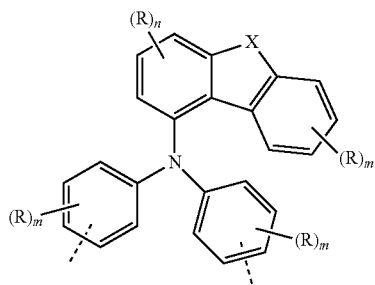

(VIg)

where R, X, m, n and the dotted lines may each be as defined above for formula (VI).

Examples of preferred structural units of the formula (VIg) are depicted in the following table:

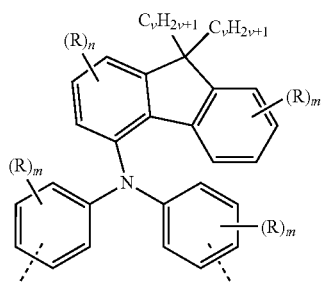

(VIg-1)

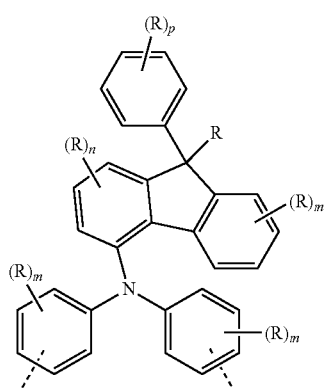

(VIg-2)

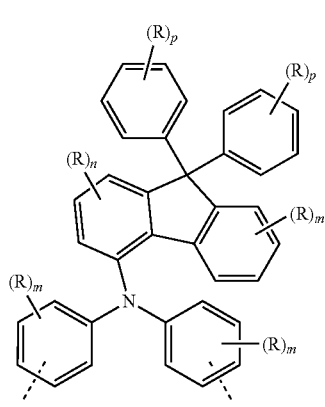

(VIg-3)

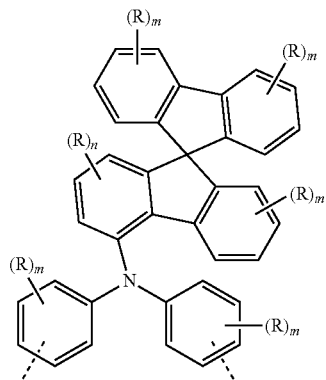

(VIg-4)

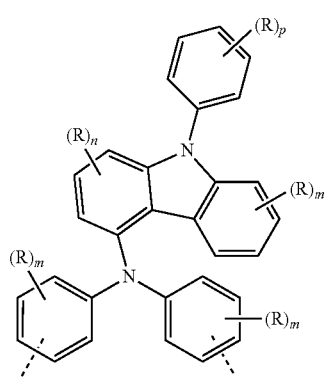

(VIg-5)

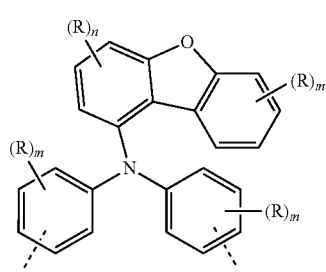

(VIg-6)

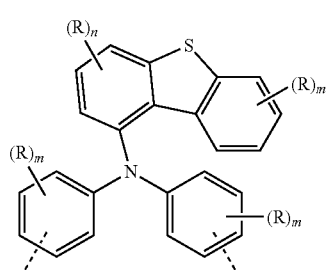

(VIg-7)

where R, m, n, p and the dotted lines may each be as defined above for formulae (V) and/or (VI), and v=1 to 20, preferably 1 to 10.

In yet a further very particularly preferred embodiment, the at least one structural unit of the formula (VII) is selected from the structural unit of the following formula (VIIg):

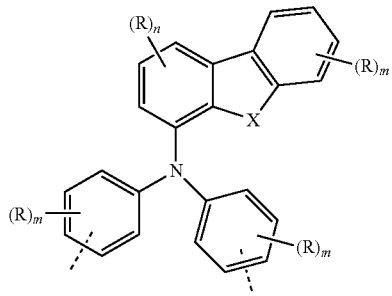

(VIIg)

where R, X, m, n and the dotted lines may each be as defined above for formula (VII).

Examples of preferred structural units of the formula (VIIg) are depicted in the following table:

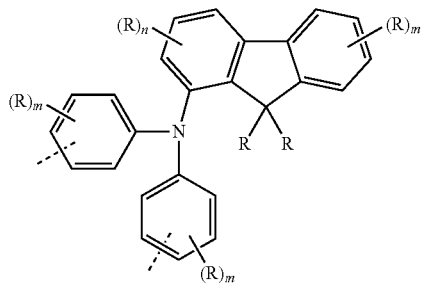

(VIIg-1)

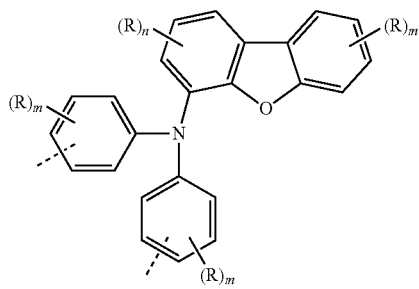

(VIIg-2)

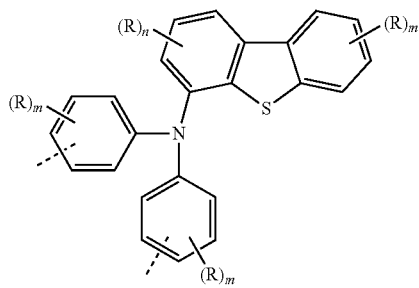

(VIIg-3)

where R, m and n may each be as defined above for formulae (I) and/or (Ib).

In the formulae (Vj), (VIg) and (VIIg) and their preferred embodiments of the formulae (Vj-1) to (Vj-7), (VIg-1) to (VIg-7) and (VIIg-1) to (VIIg-3), the dotted lines represent the bonds to the adjacent structural units in the polymer. They may independently be arranged identically or differently in the ortho, meta or para positions, preferably identically in the ortho, meta or para position, more preferably in the meta or para position and most preferably in the para position.

In a second preferred configuration of the present invention, it may be the case that the polymer comprises at least one structural unit of the formula (I) selected from the structural unit of the following formula (VIIIa):

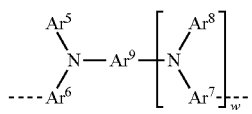

(VIIIa)

or the structural unit of the following formula (VIIIb):

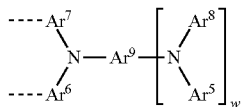

(VIIIb)

where w=1, 2 or 3, $Ar^5$ to $Ar^9$ are each the same or different at each instance and are a mono- or polycyclic, aromatic or heteroaromatic ring system which may be substituted by one or more R radicals, where R may be as defined above, especially for formula (I); the dotted lines represent bonds to adjacent structural units in the polymer.

Preferably, at least one of the $Ar^5$ to $Ar^9$ radicals comprises at least one R substituent having at least 2 carbon atoms, preferably at least 4 and most preferably at least 6 carbon atoms.

Preferably, it may be the case that the structural units of the formulae (VIIIa) and/or (VIIIb) correspond to the structural units of the formula (I).

Preferably, at least one of the $Ar^5$ and/or $Ar^8$ radicals of formulae (VIIIa) and/or (VIIIb) comprises substituted by $Ar^4$ in at least one ortho position, preferably in exactly one of the two ortho positions, based on the position of the nitrogen atom shown in formula (VIIIa) and/or (VIIIb), where $Ar^4$ is a mono- or polycyclic, aromatic or heteroaromatic ring system which has 5 to 60 aromatic ring atoms and may be substituted by one or more R radicals, where R may be as defined above, especially for formula (I).

It may additionally be the case that the sum total of the ring atoms of the $Ar^4$ radical together with the ring atoms of the $Ar^5$ or $Ar^8$ group bonded to said radical of formulae (VIIIa) and/or (VIIIb) is at least 12. Preferably, the $Ar^4$ radical together with the ring atoms of the $Ar^5$ or $Ar^8$ group bonded to said radical of formulae (VIIIa) and/or (VIIIb) does not form a fused ring system. In addition, preferred radicals are $Ar^4$ groups having a low condensation level, and so preference is given to monocyclic, aromatic or heteroaromatic ring systems or to polycyclic, aromatic or heteroaromatic ring systems wherein the aromatic or heteroaromatic rings are bonded via groups which minimize or eliminate conjugation of the rings.

$Ar^4$ can be bonded to at least one of the $Ar^5$ and/or $Ar^8$ radicals of formulae (VIIIa) and/or (VIIIb) either directly, i.e. via a single bond, or else via a linking group X.

The structural unit of the formula (VIIIa) and/or (VIIIb) may thus preferably have the structure of the following formulae (VIIIa-1a), (VIIIa-1b), (VIIIa-1c) and/or (VIIIa-1d):

(VIIIa-1a)
(VIIIa-1b)
(VIIIa-1c)
(VIIIa-1d)

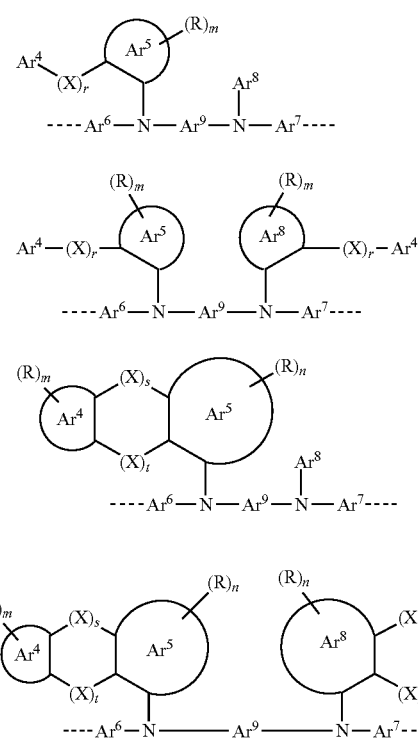

where $Ar^4$, $Ar^y$, $Ar^6$, $Ar^7$, $Ar^8$, $Ar^9$, X, m, n, r, s, t and R may each be as defined above, especially for the formulae (I), (Ia), (Ib), (VIIIa) and/or (VIIIb).

In addition, the structural unit of the formula (VIIIa) and/or (VIIIb) may thus have the structure of the following formulae (VIIIb-a), (VIIIb-b), (VIIIb-c) and/or (VIIIb-d):

(VIIIb-a)
(VIIIb-b)
(VIIIb-c)

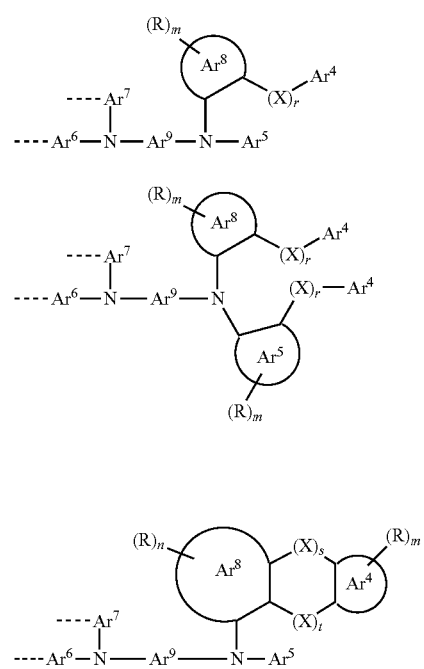

(VIIIb-d)

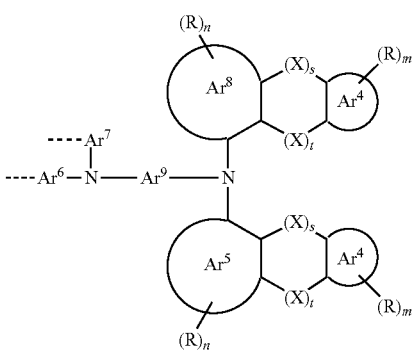

where $Ar^4$, $Ar^5$, $Ar^6$, $Ar^7$, $Ar^8$, $Ar^9$, X, m, n, s, t and R may each be as defined above, especially for the formulae (I), (Ia), (Ib), (VIIIa) and/or (VIIIb).

In a preferred embodiment, the at least one structural unit of the formula (VIIIa) is selected from the structural units of the following formulae (IX), (X), (XI), (XII), (XIII), (XIV), (XV) and (XVI):

(IX)

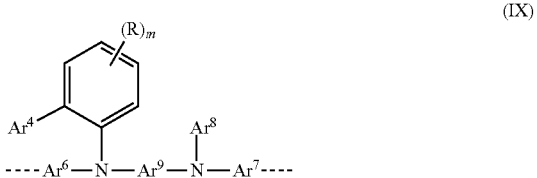

(X)

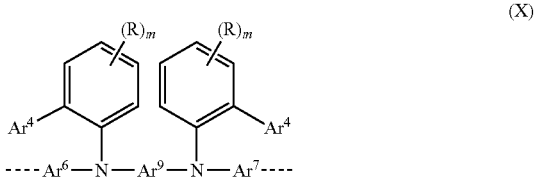

(XI)

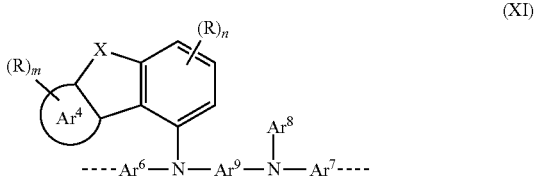

(XII)

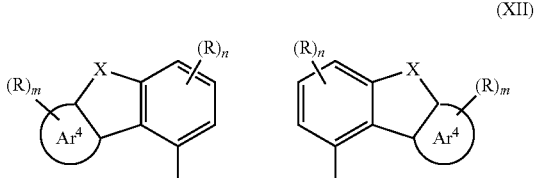

(XIII)

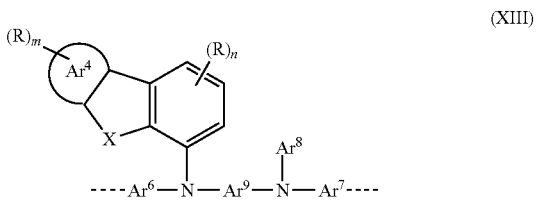

-continued

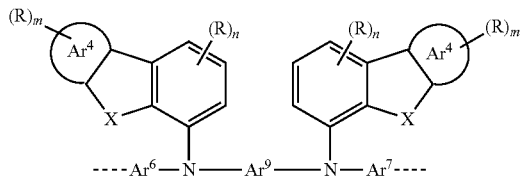
(XIV)

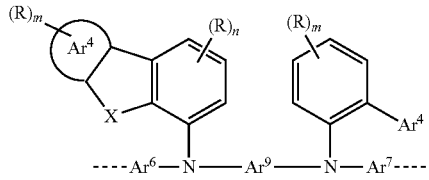
(XV)

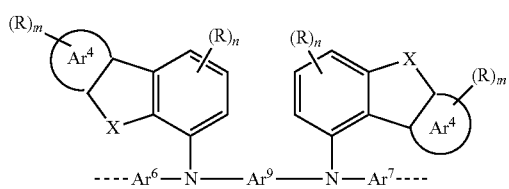
(XVI)

where $Ar^4$, $Ar^y$, $Ar^6$, $Ar^7$, $Ar^8$, $Ar^9$, X, m, n, p, R and the dotted lines may each be as defined above, especially for the formulae (I), (Ia), (Ib), (VIIIa) and/or (VIIIb).

In a particularly preferred embodiment, the structural units of the formulae (IX) and (X) are selected from the structural units of the following formulae (IXa) and (Xa):

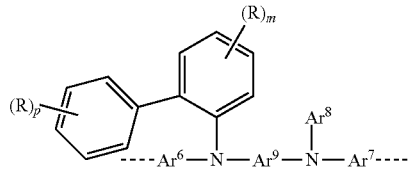
(IXa)

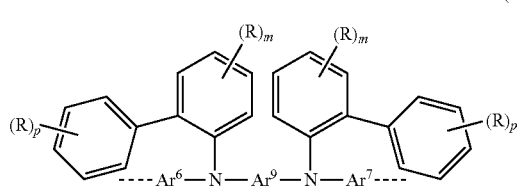
(Xa)

where $Ar^6$, $Ar^7$, $Ar^8$, $Ar^9$, R, m, p and the dotted lines may each be as defined above, especially for the formulae (I), (Ia), (Ib), (VIIIa) and/or (VIIIb).

Examples of preferred structural units of the formulae (IXa) and (Xa) are depicted in the following table:

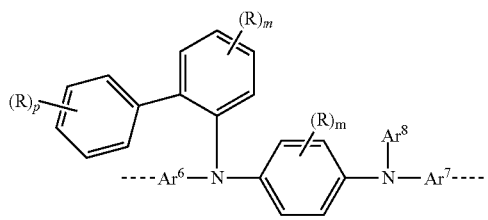

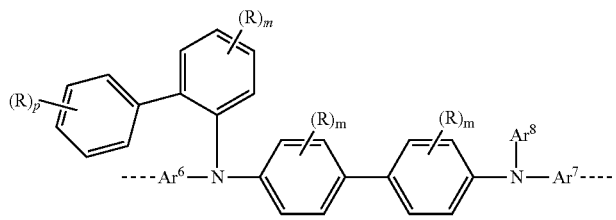

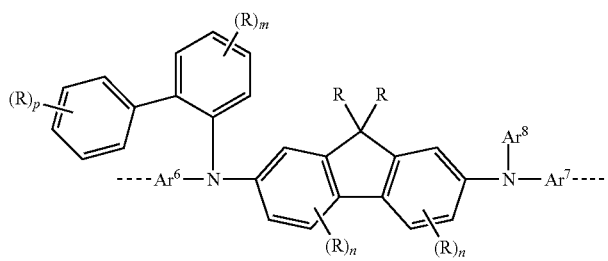

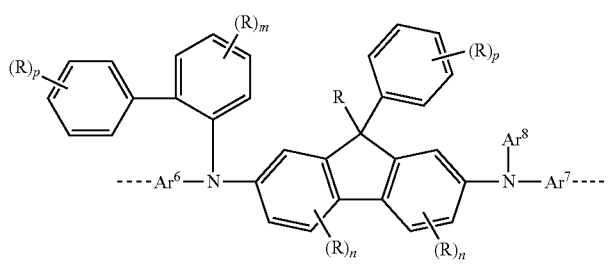

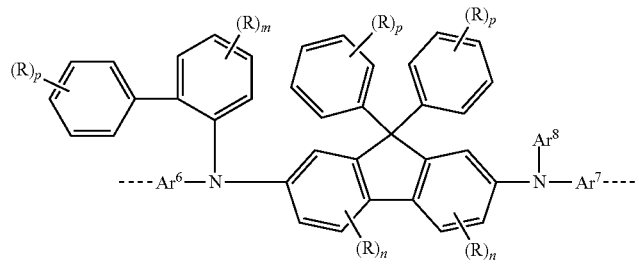
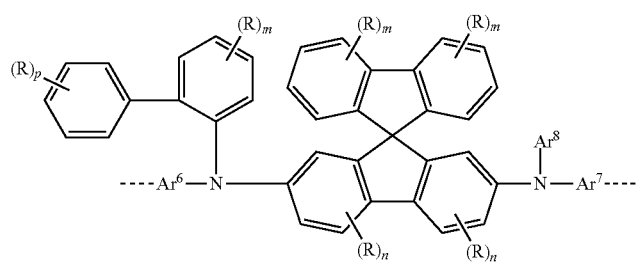
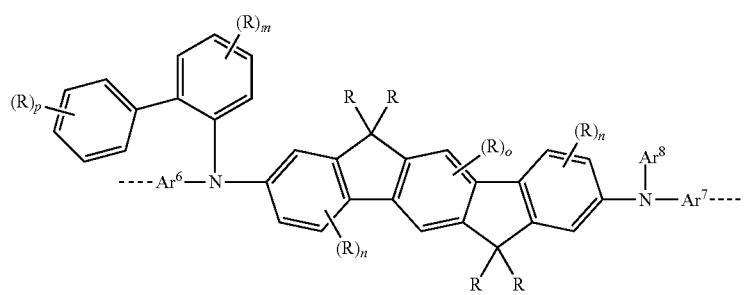
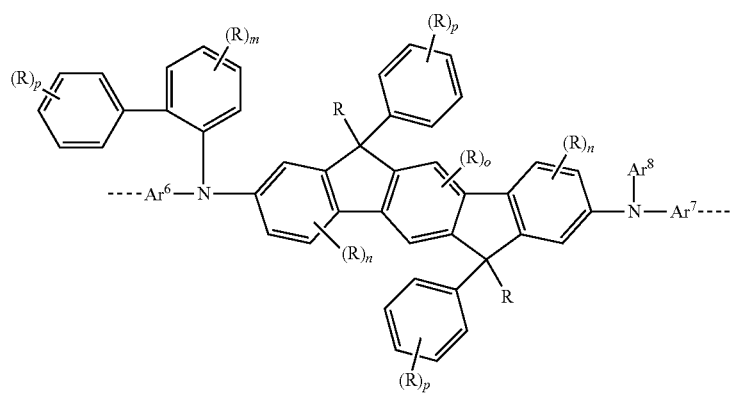
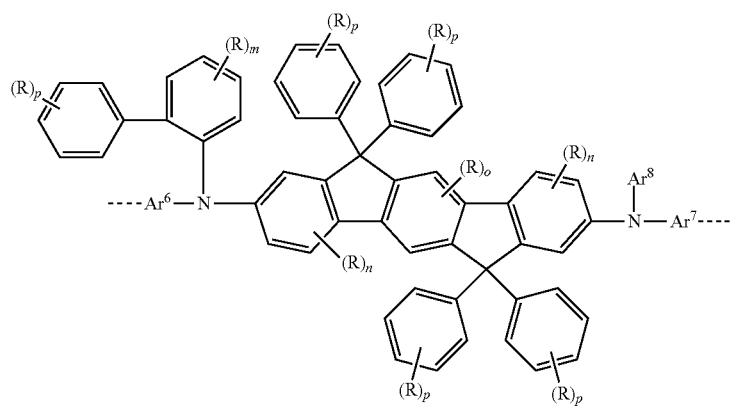

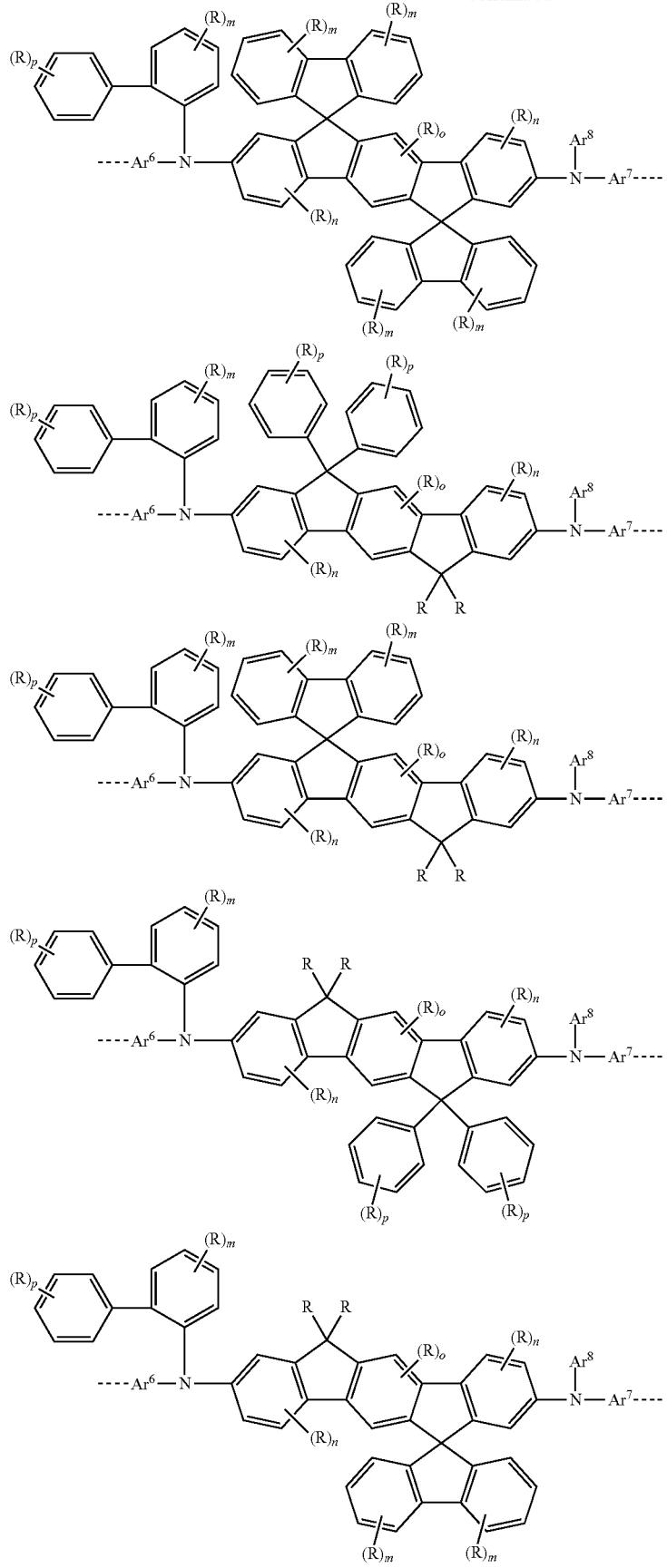

-continued
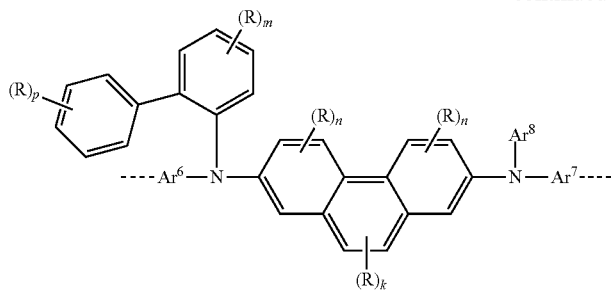
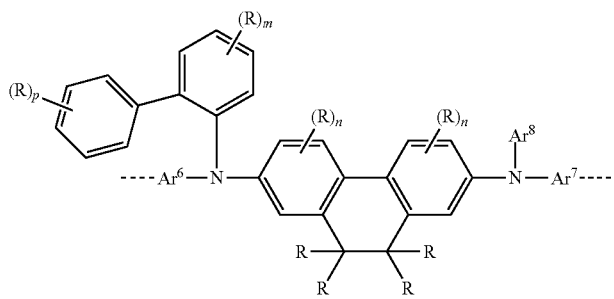
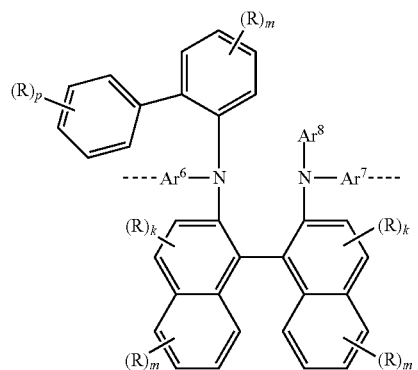
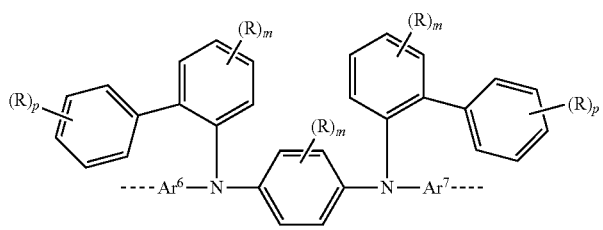
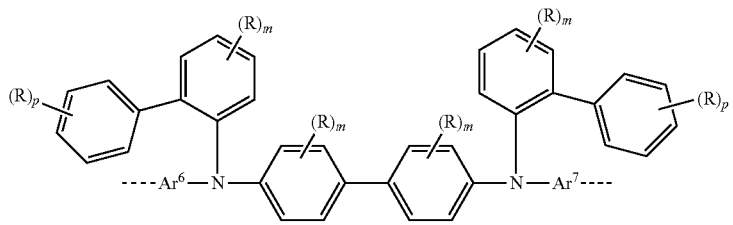
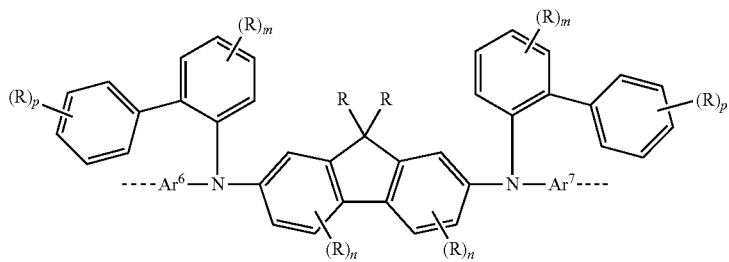
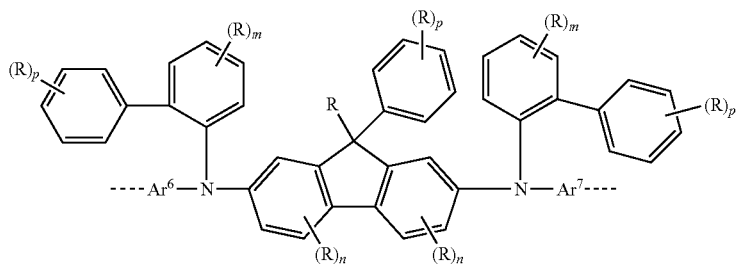

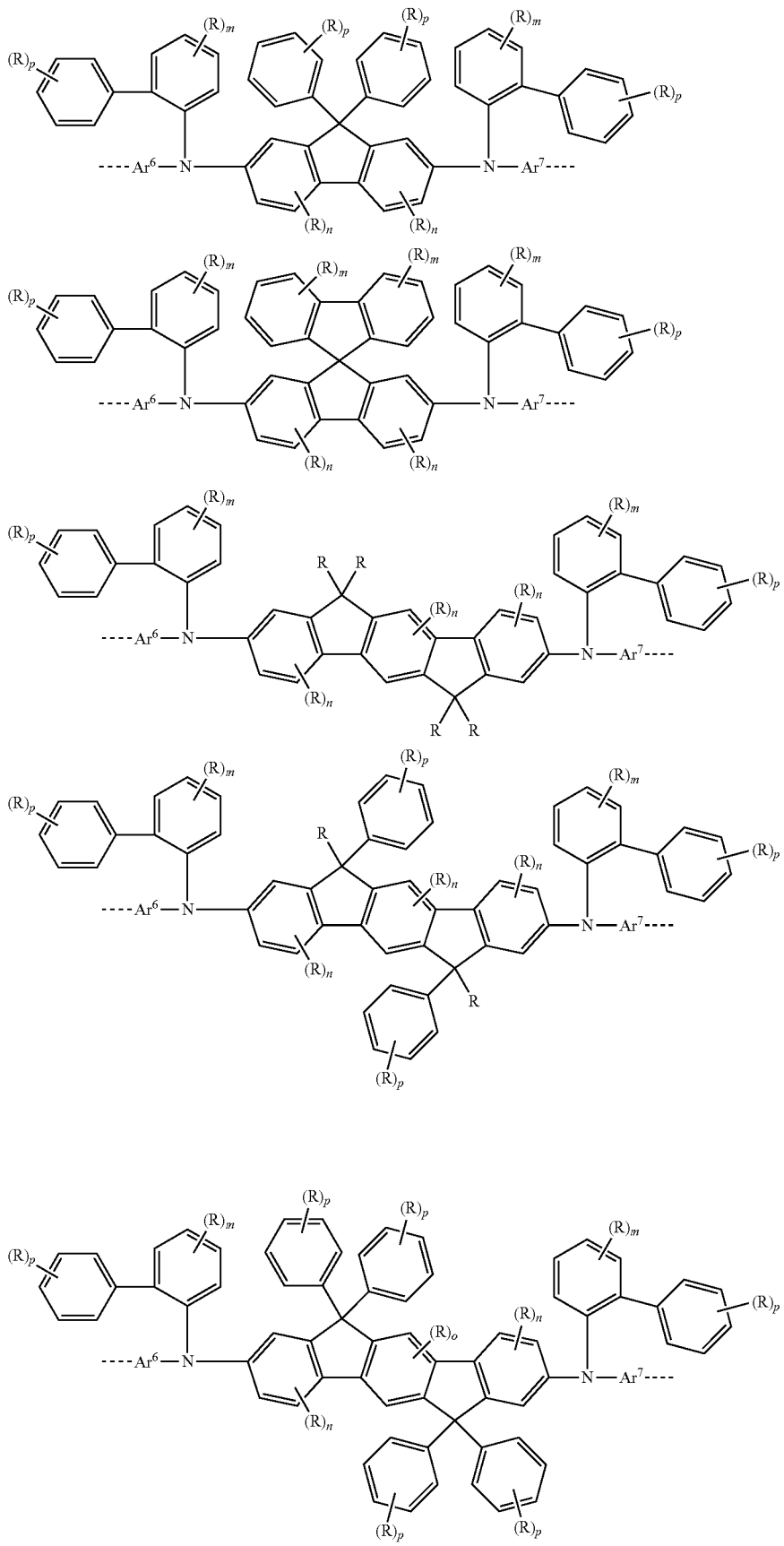

-continued
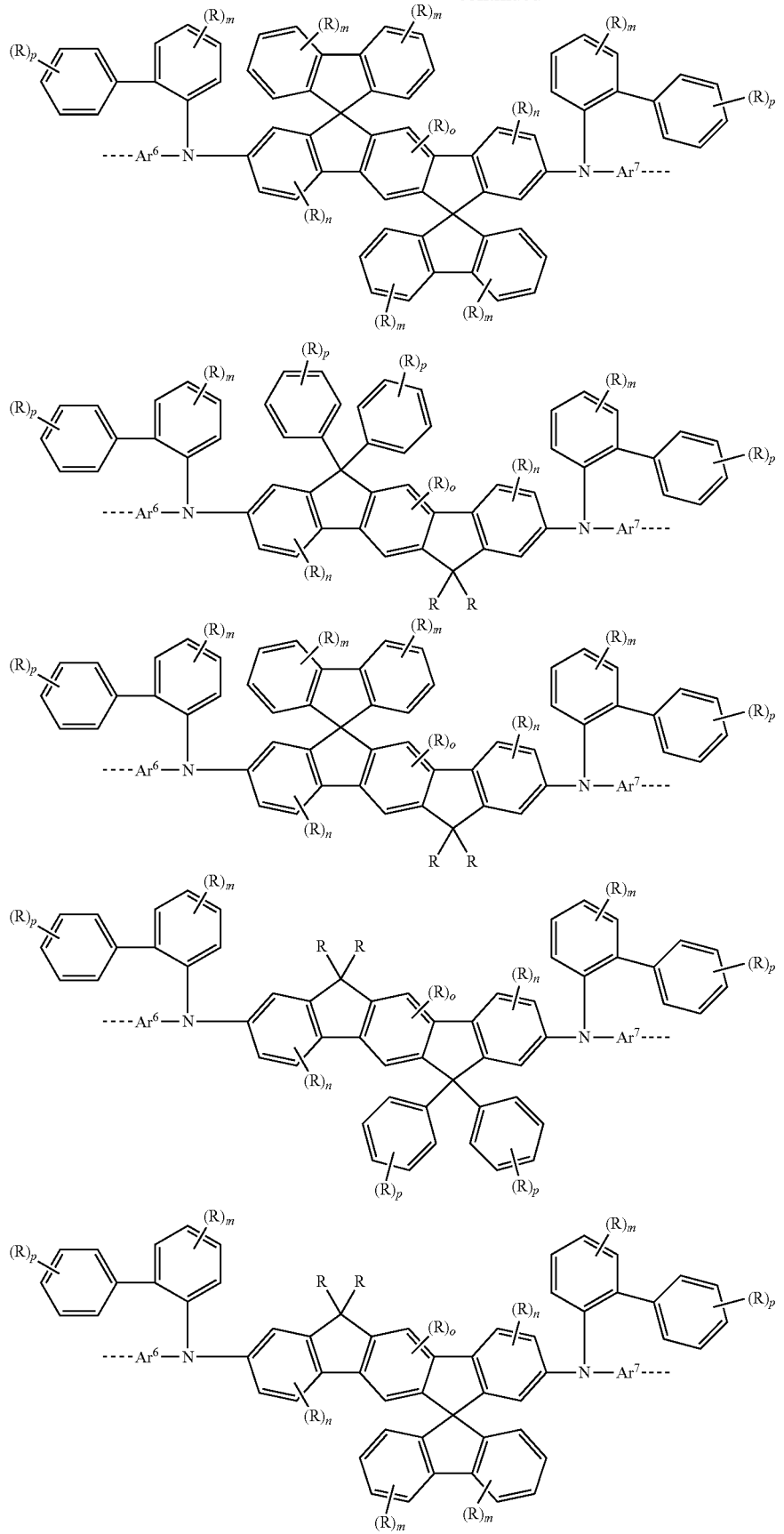

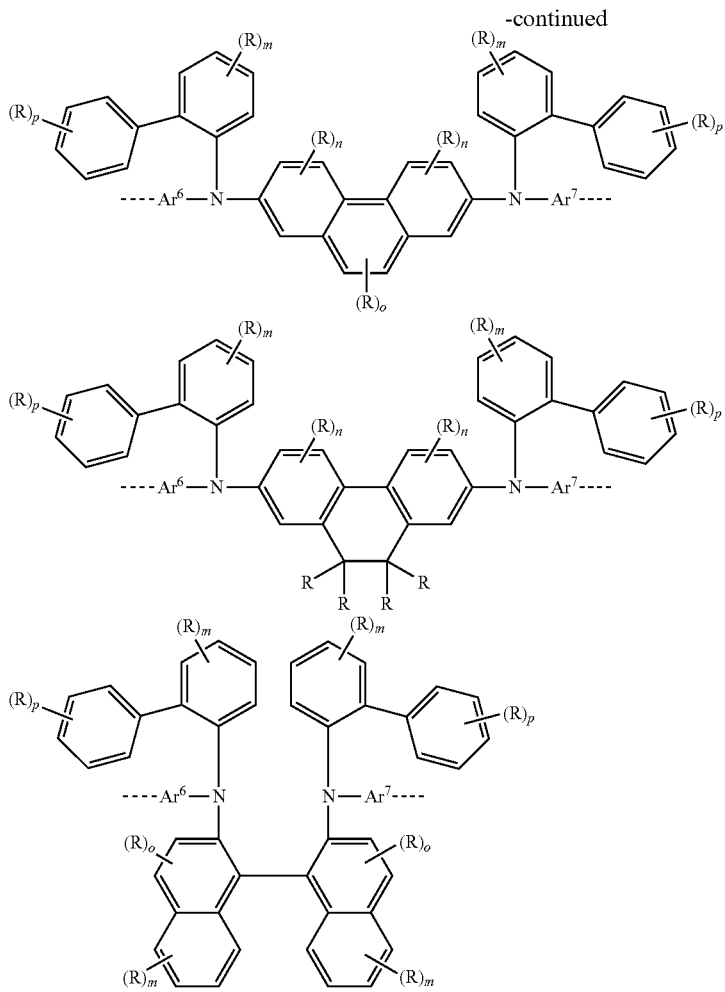

where Ar⁶, Ar⁷, Ar⁸, R, m, n, p and the dotted lines may each be as defined above, especially for the formulae (I), (Ia), (Ib), (VIIIa) and/or (VIIIb), and o=0, 1 or 2.

In a further particularly preferred embodiment, the structural units of the formulae (XI) and (XII) are selected from the structural units of the following formulae (XIa) and (XIIa):

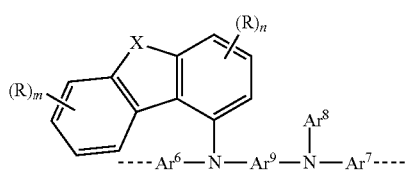
(XIa)

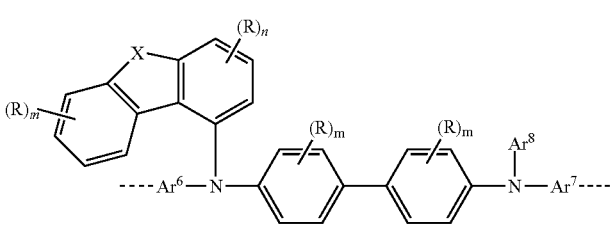
(XIIa)

where Ar⁶, Ar⁷, Ar⁸, Ar⁹, R, m, n and X may each be as defined above, especially for the formulae (I), (Ia), (Ib), (VIIIa) and/or (VIIIb).

Examples of preferred structural units of the formulae (XIa) and (XIIa) are depicted in the following table:

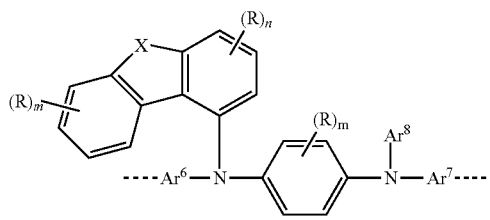

-continued
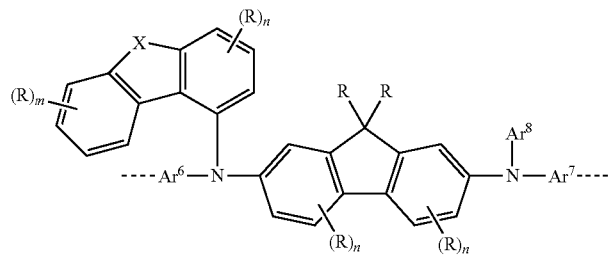
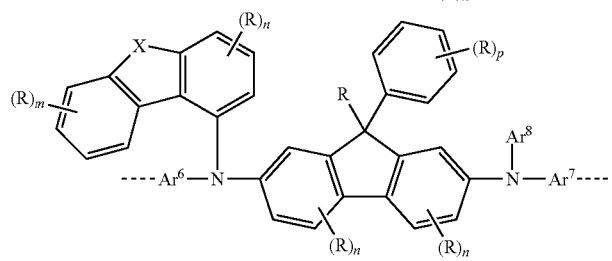
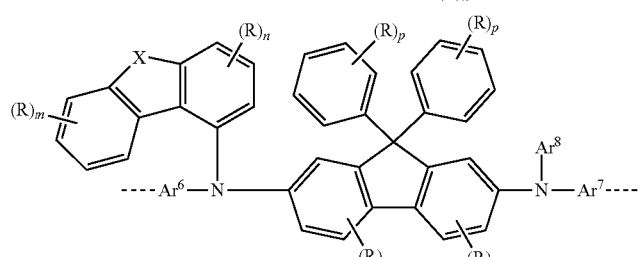
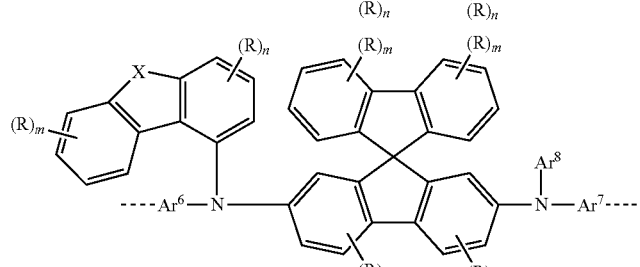
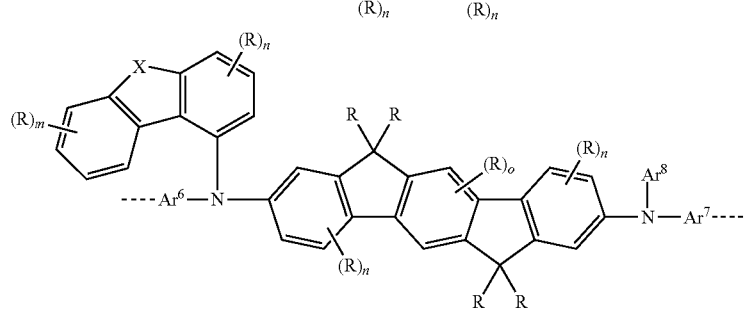
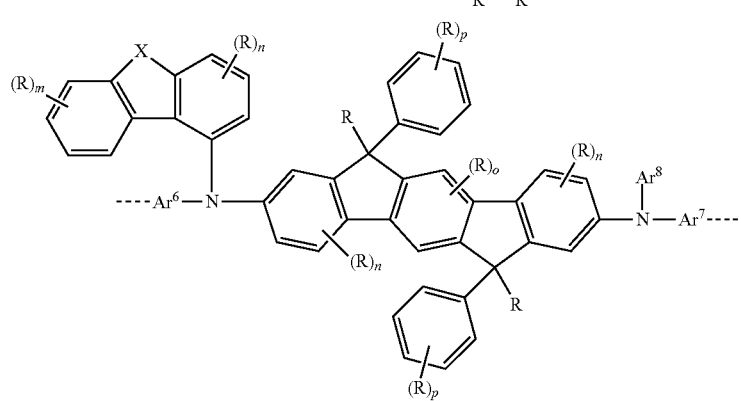

-continued
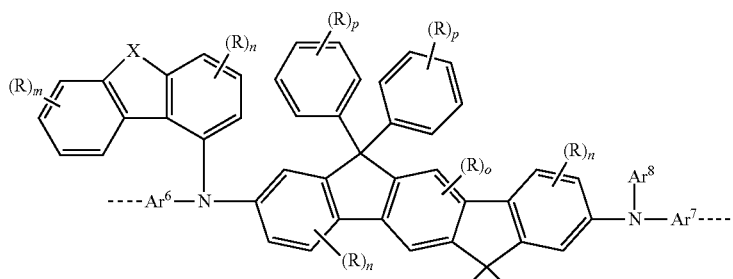
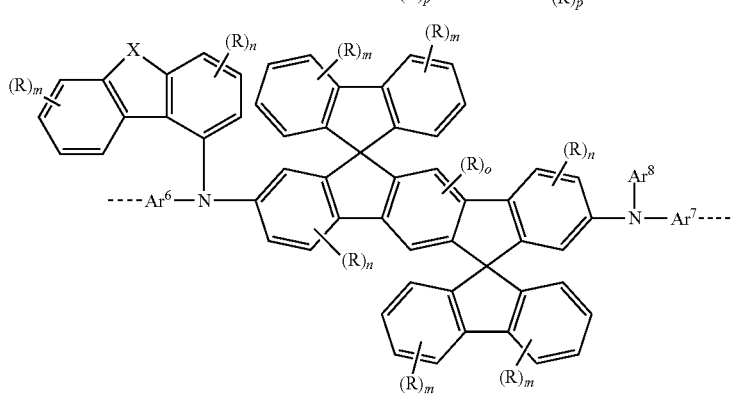
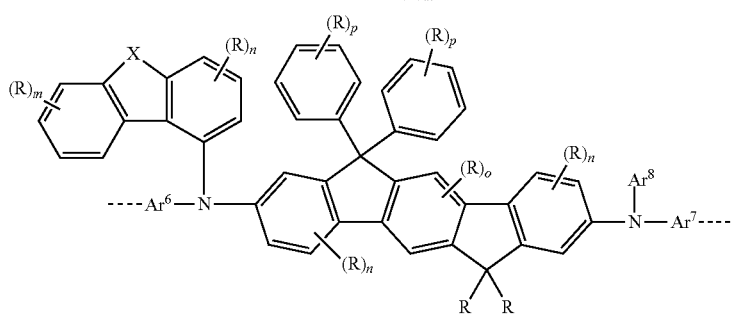
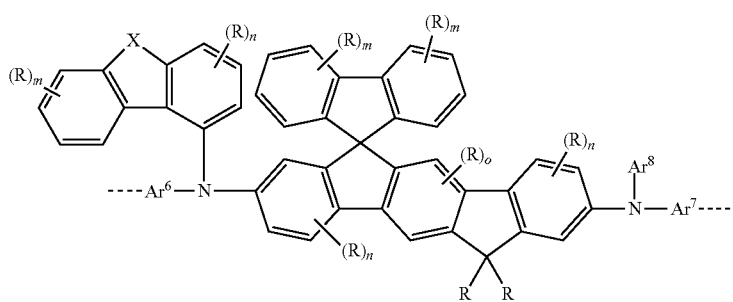

-continued
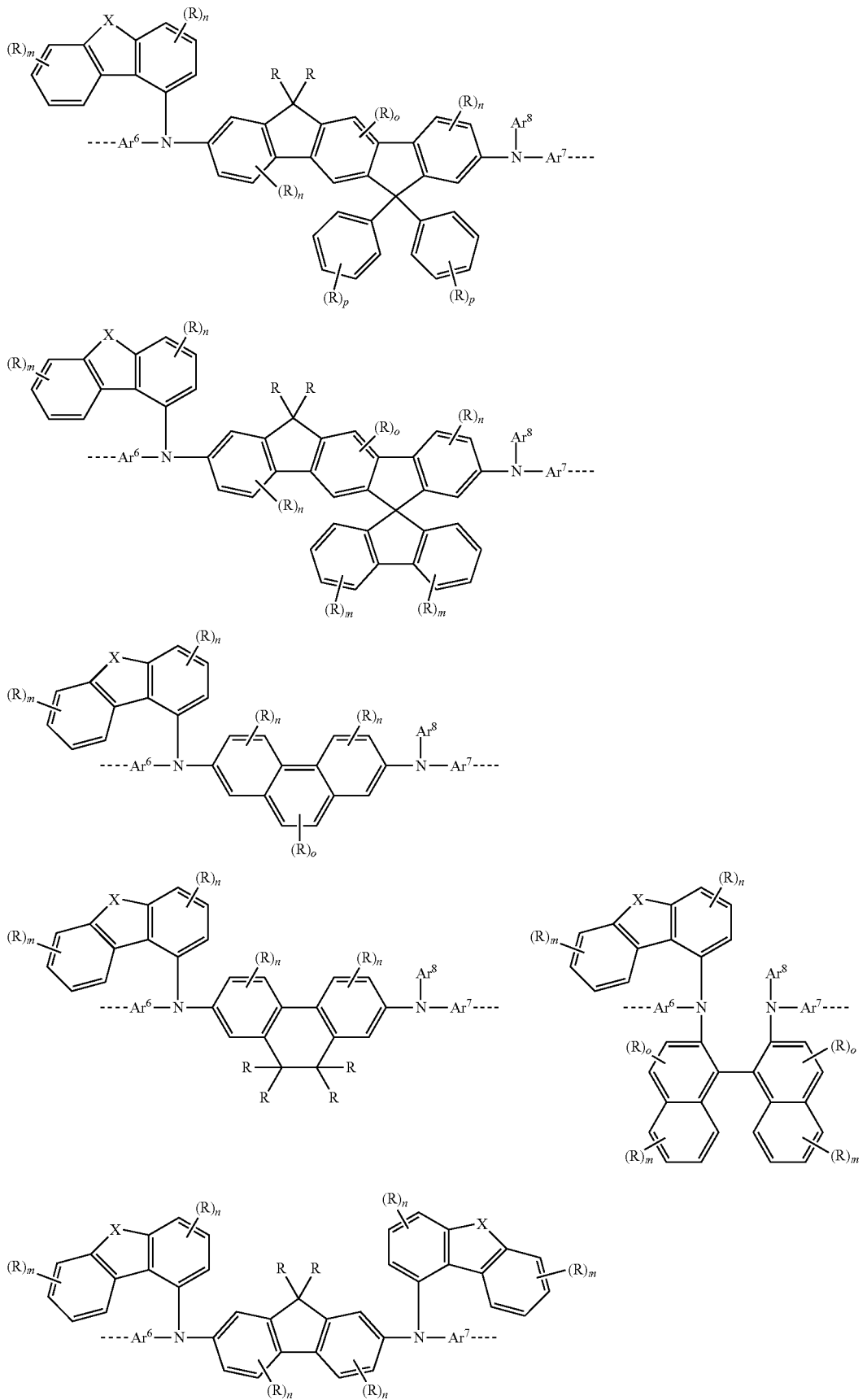

-continued
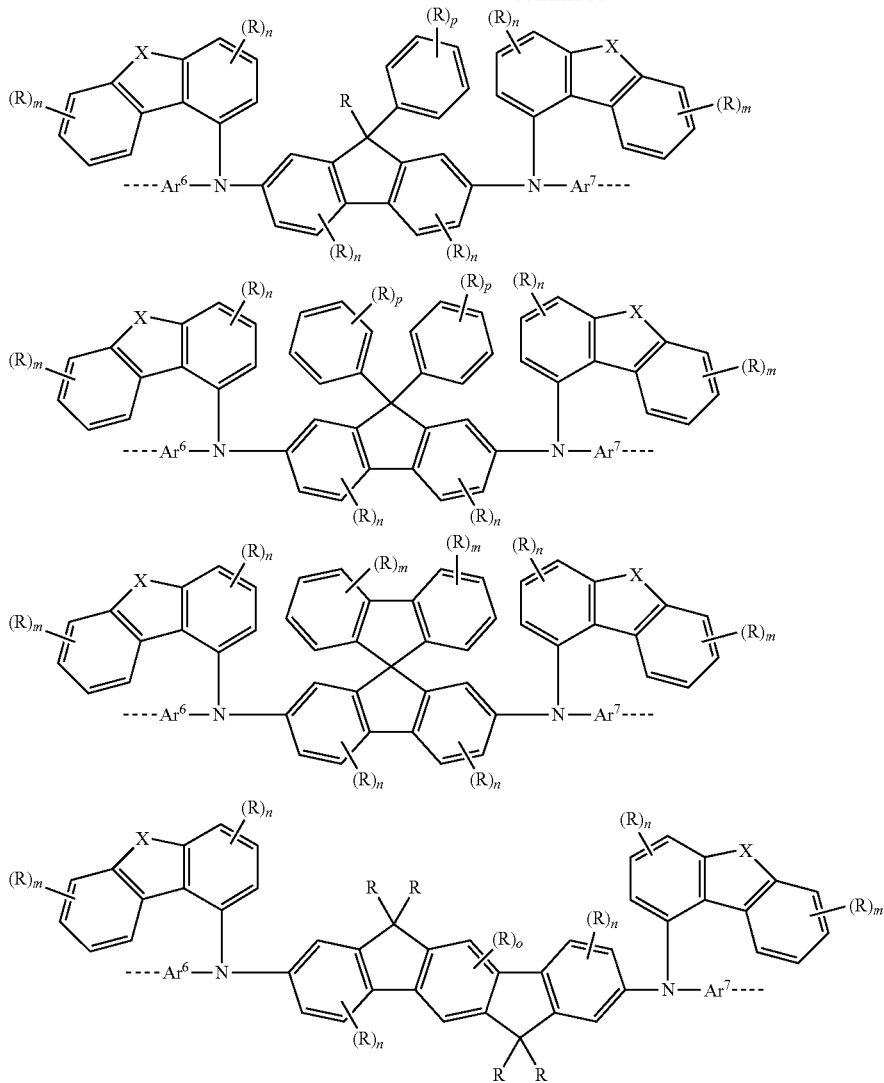
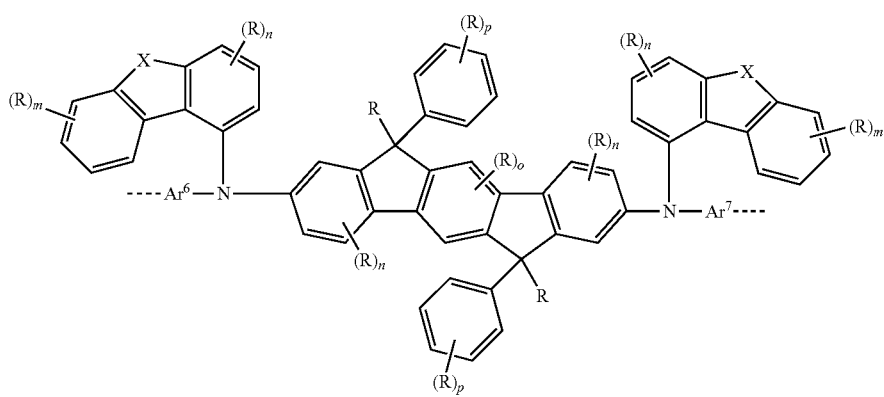

-continued
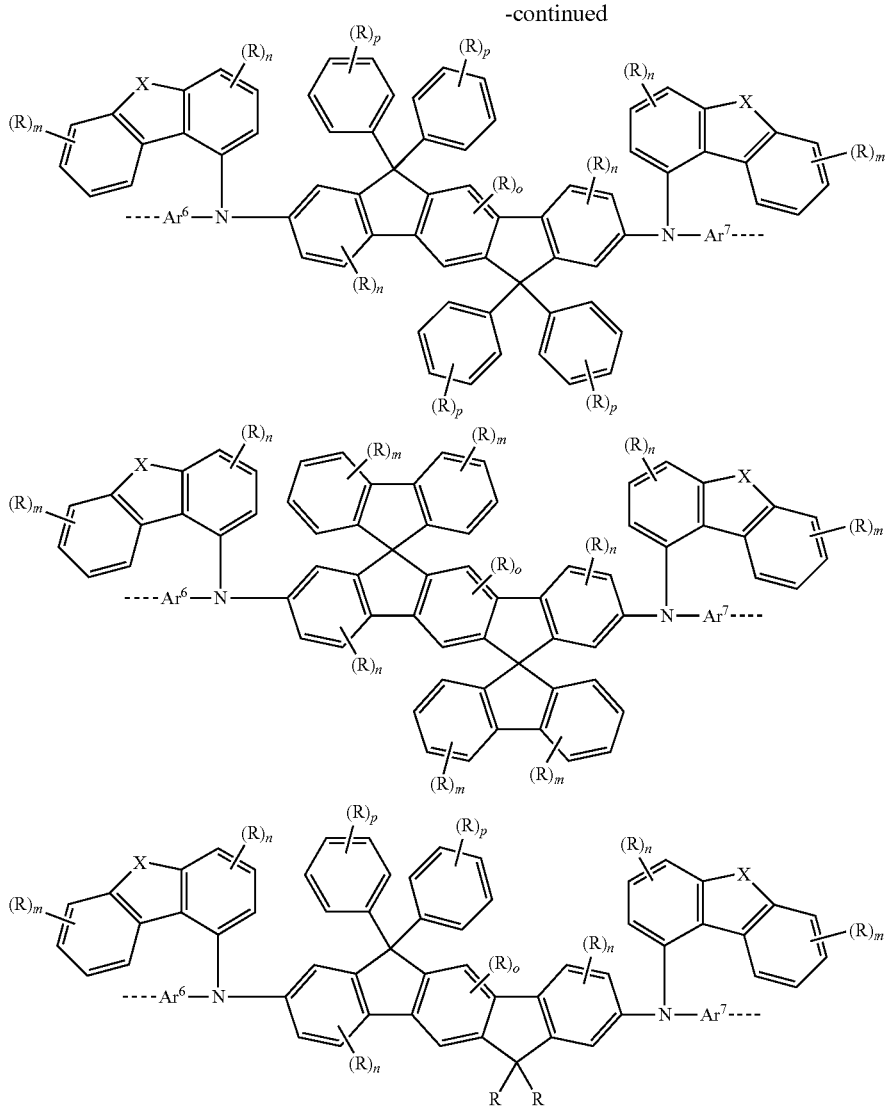
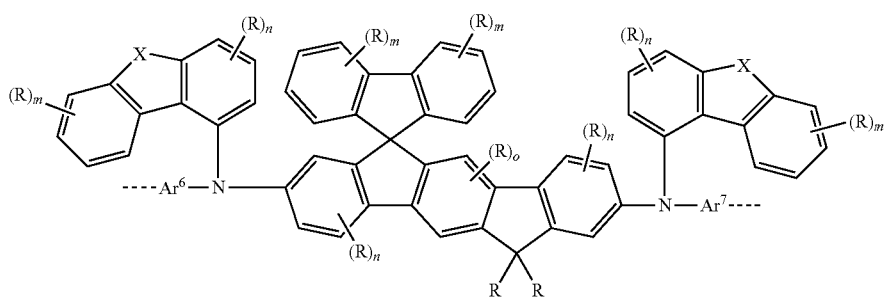

-continued
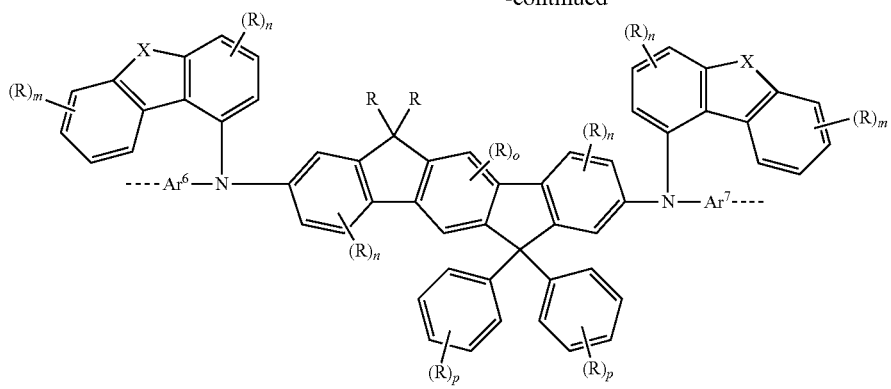
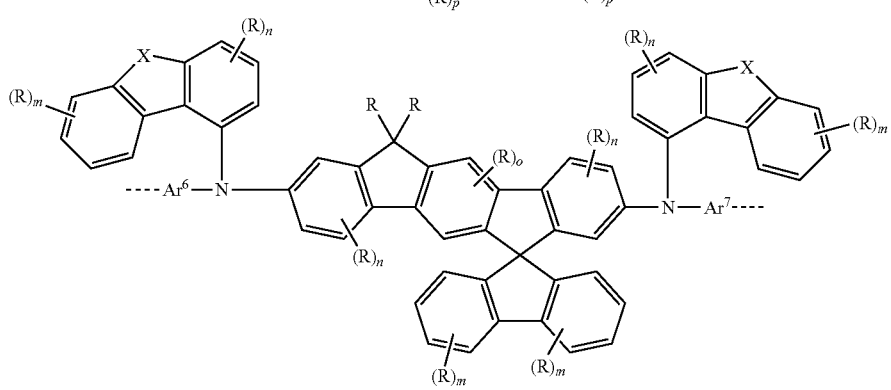
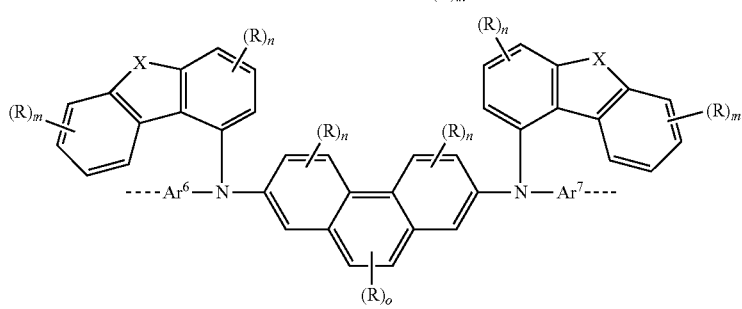
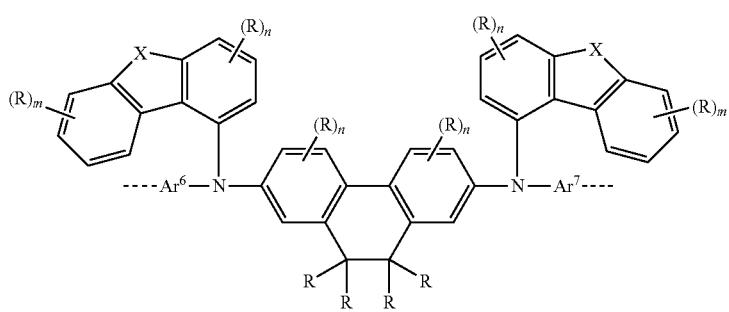

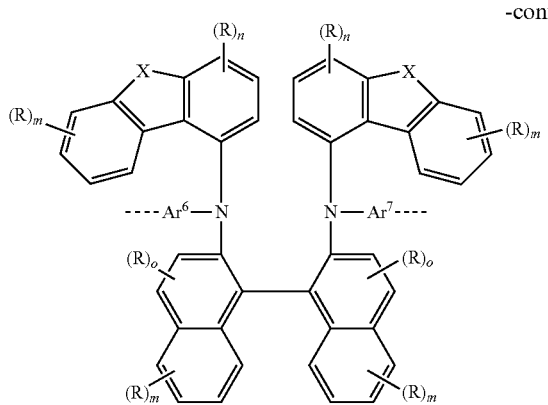

where $Ar^6$, $Ar^7$, $Ar^8$, R, m, n and p may each be as defined above, especially for the formulae (I), (Ia), (Ib), (VIIIa) and/or (VIIIb), and o=0, 1 or 2.

In another further particularly preferred embodiment, the structural elements of the formulae (XIII) and (XIV) are selected from the structural units of the following formulae (XIIIa) and (XIVa):

(XIIIa)

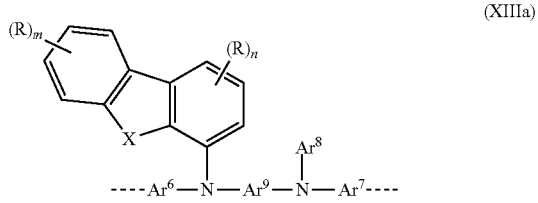

(XIVa)

where $Ar^6$, $Ar^7$, $Ar^8$, $Ar^9$, R, m, n and X may each be as defined above, especially for the formulae (I), (Ia), (Ib), (VIIIa) and/or (VIIIb).

Examples of preferred structural units of the formulae (XIIIa) and (XIVa) are depicted in the following table:

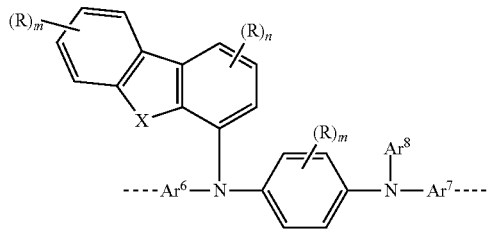 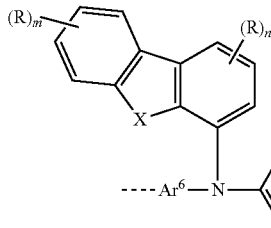

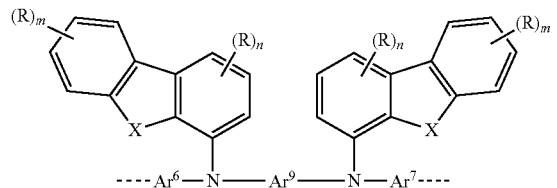

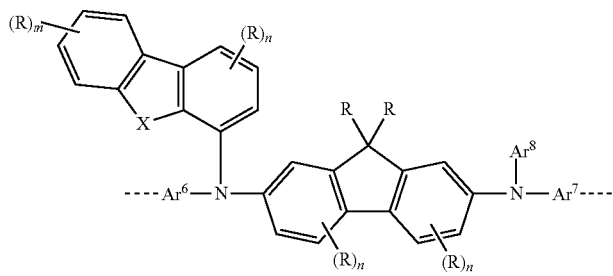

-continued
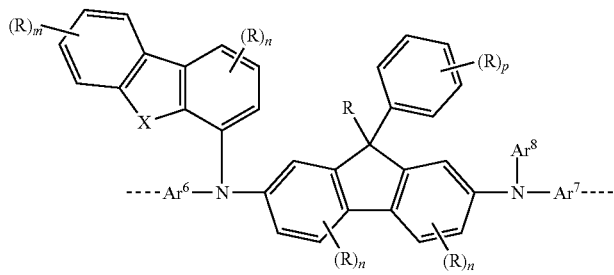
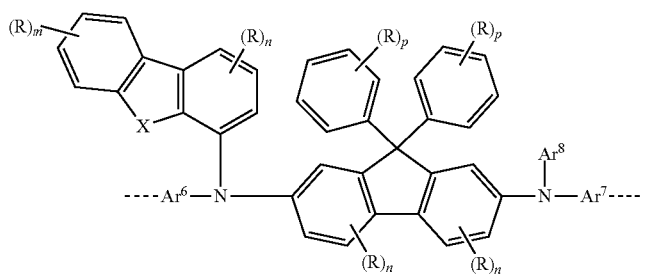
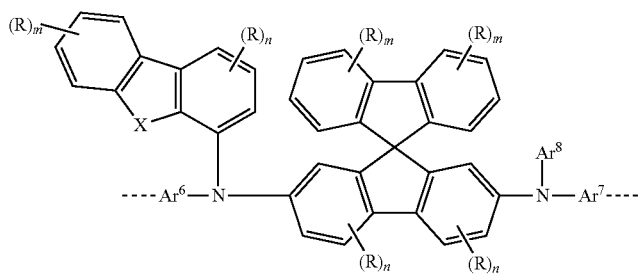
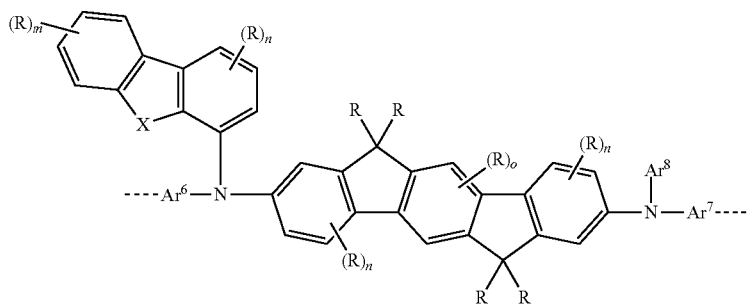
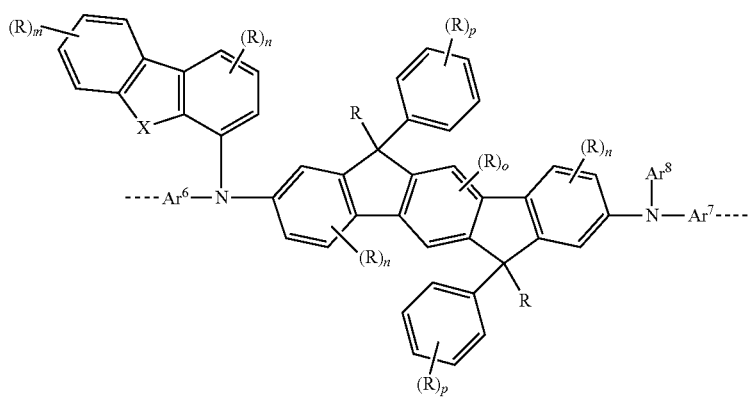

-continued
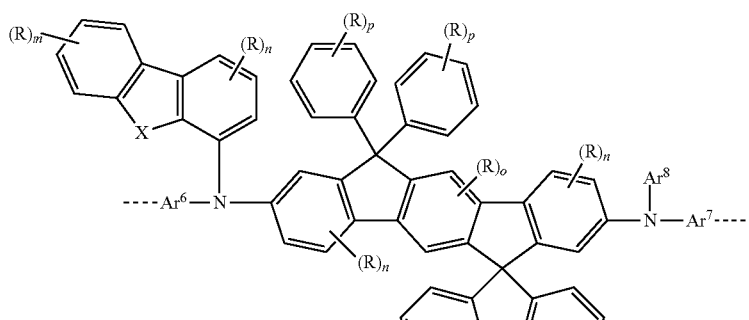
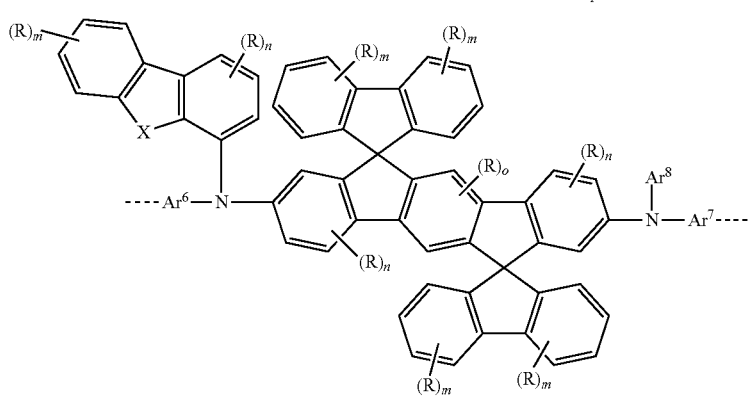
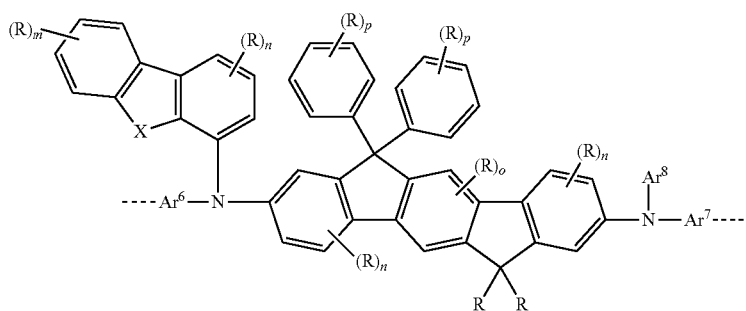
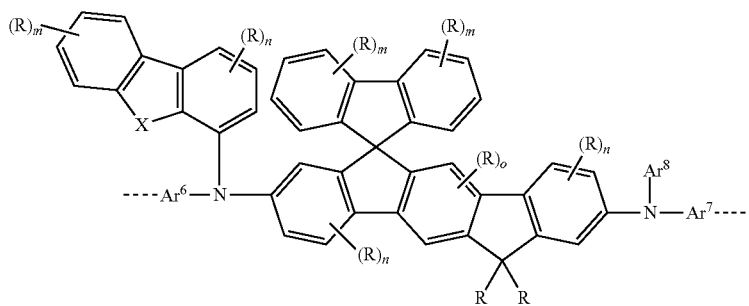

-continued
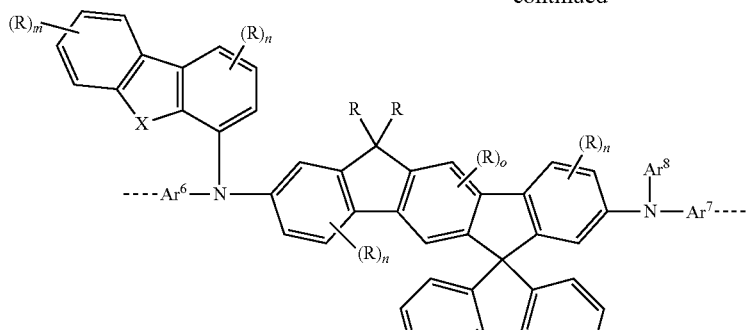
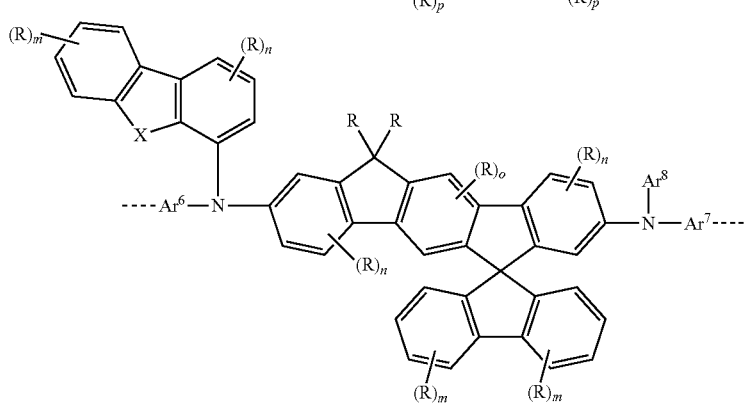
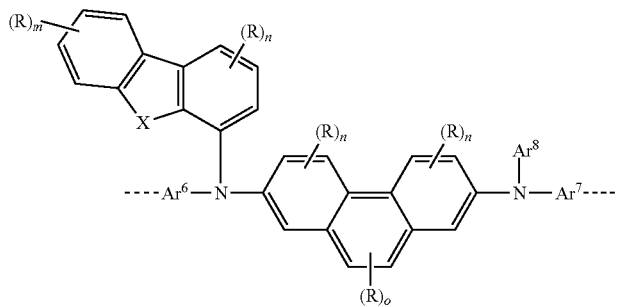
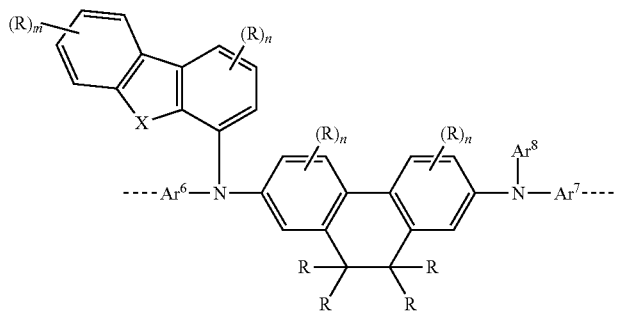
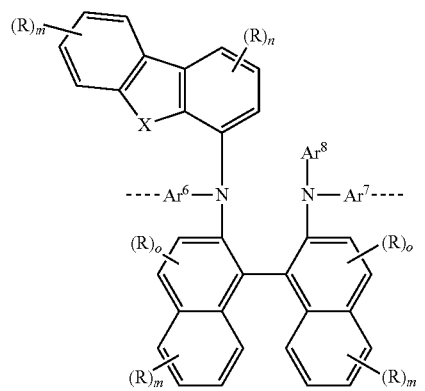
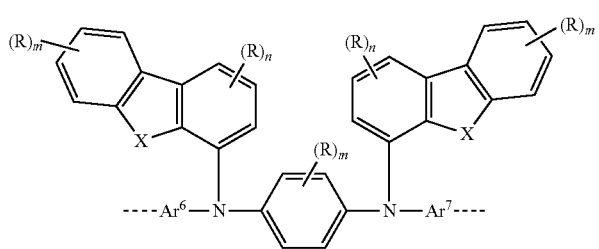

-continued
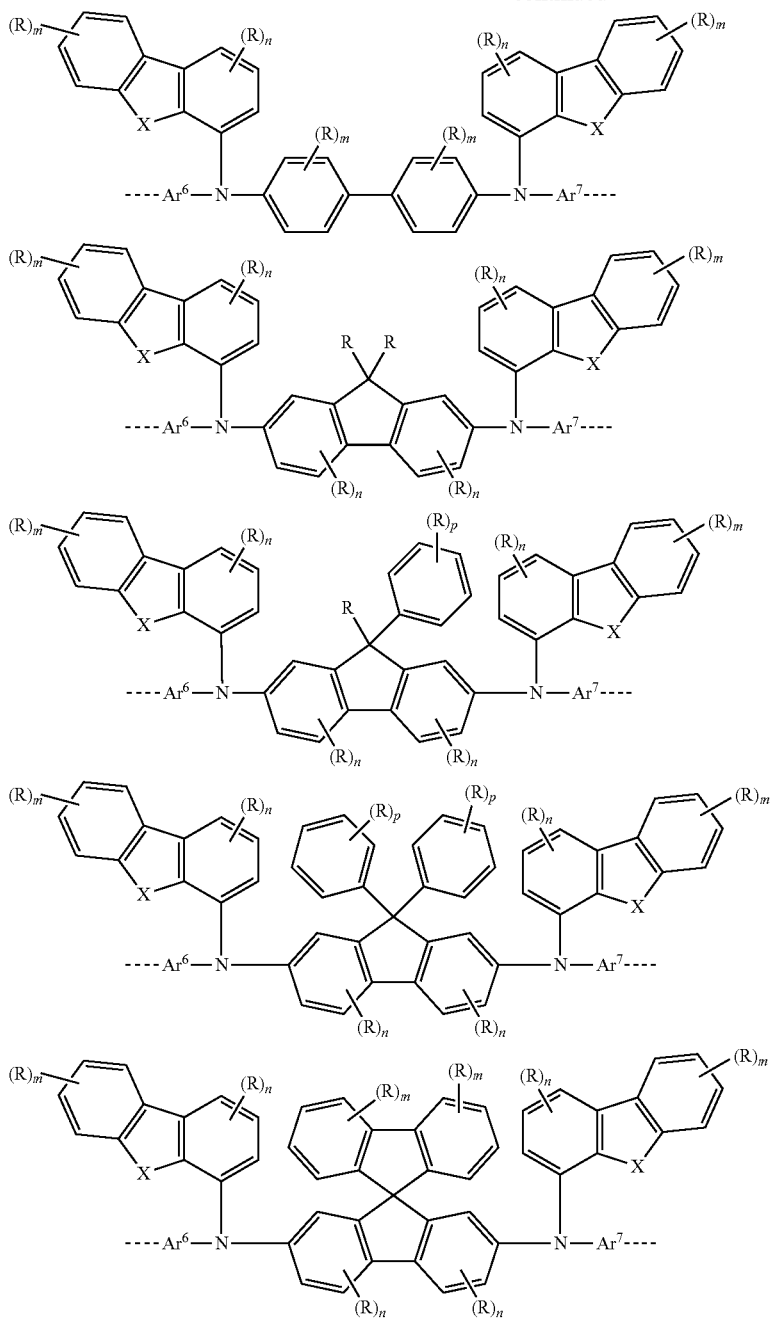
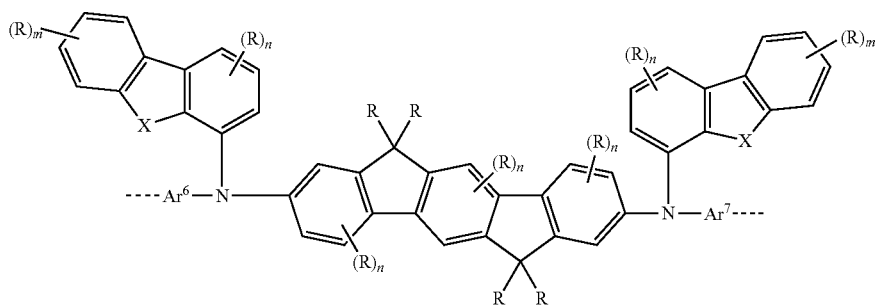

-continued
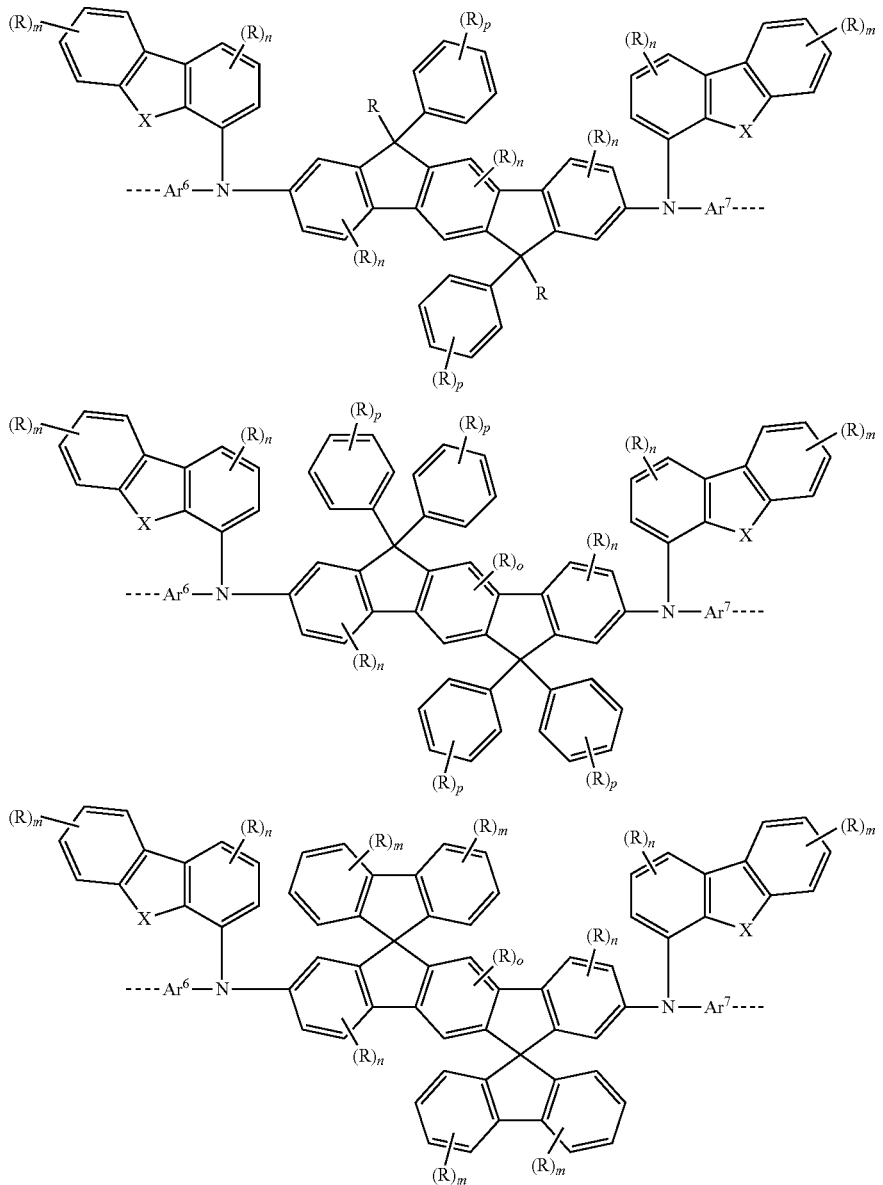
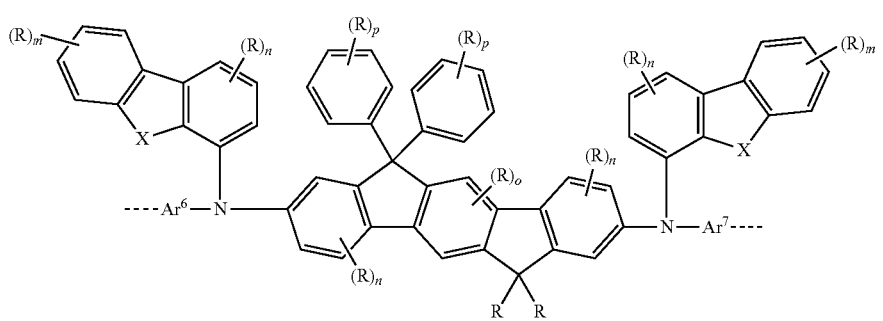

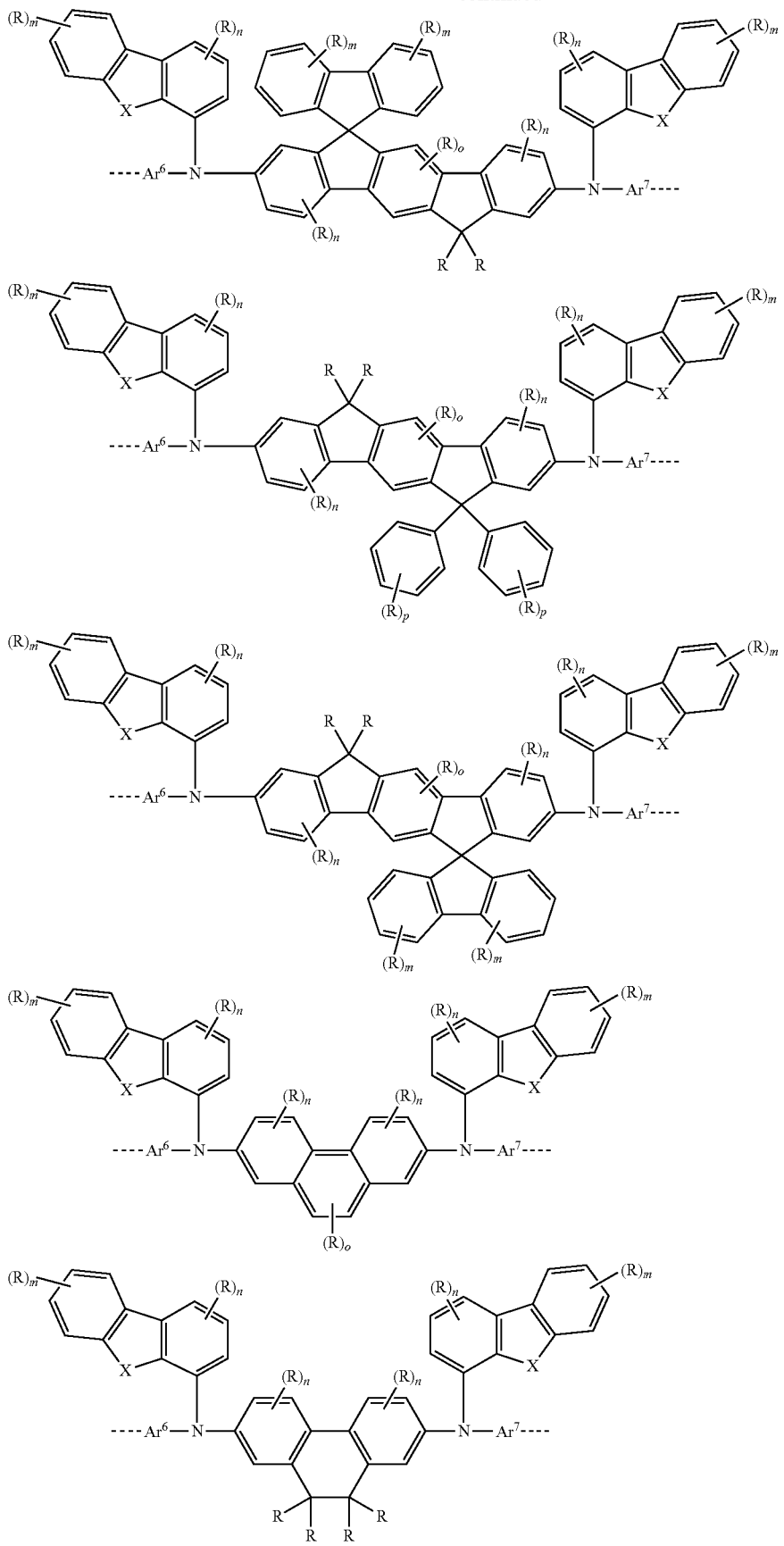

-continued

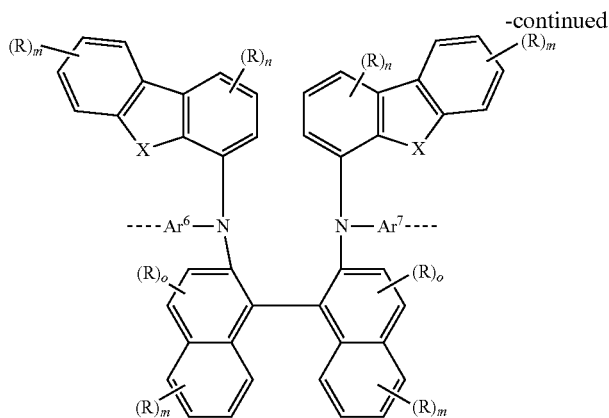

where $Ar^6$, $Ar^7$, $Ar^8$, R, m, n and p may each be as defined above, especially for the formulae (I), (Ia), (Ib), (VIIIa) and/or (VIIIb), and o=0, 1 or 2.

In a very particularly preferred embodiment, the structural units of the formulae (IXa) and (Xa) are selected from the structural units of the following formulae (IXb) and (Xb):

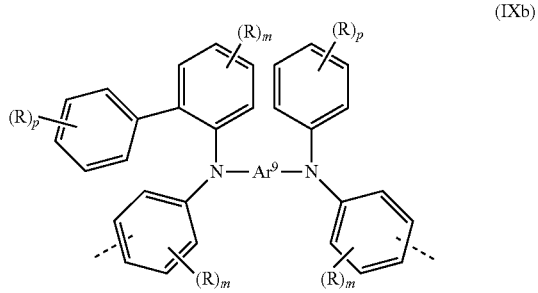
(IXb)

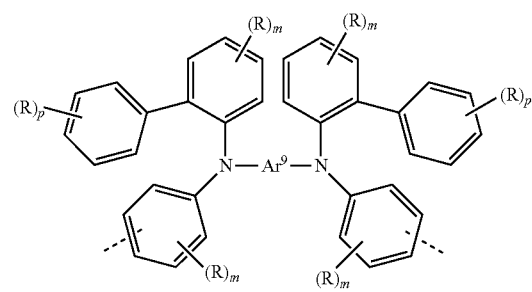
(Xb)

where $Ar^9$, R, m and p may each be as defined above, especially for the formulae (I), (Ia), (Ib), (VIIIa) and/or (VIIIb).

Examples of preferred structural units of the formulae (IXb) and (Xb) are depicted in the following table:

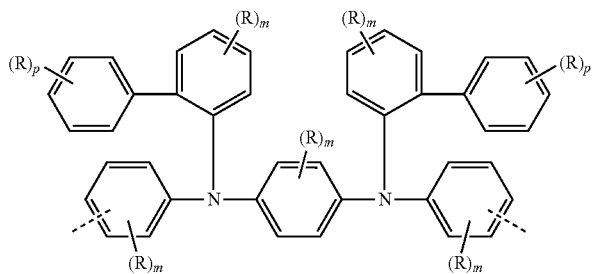

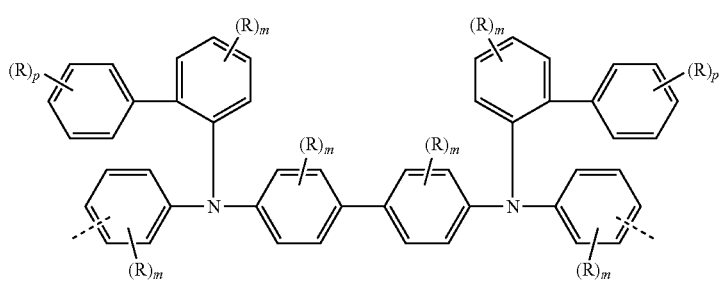

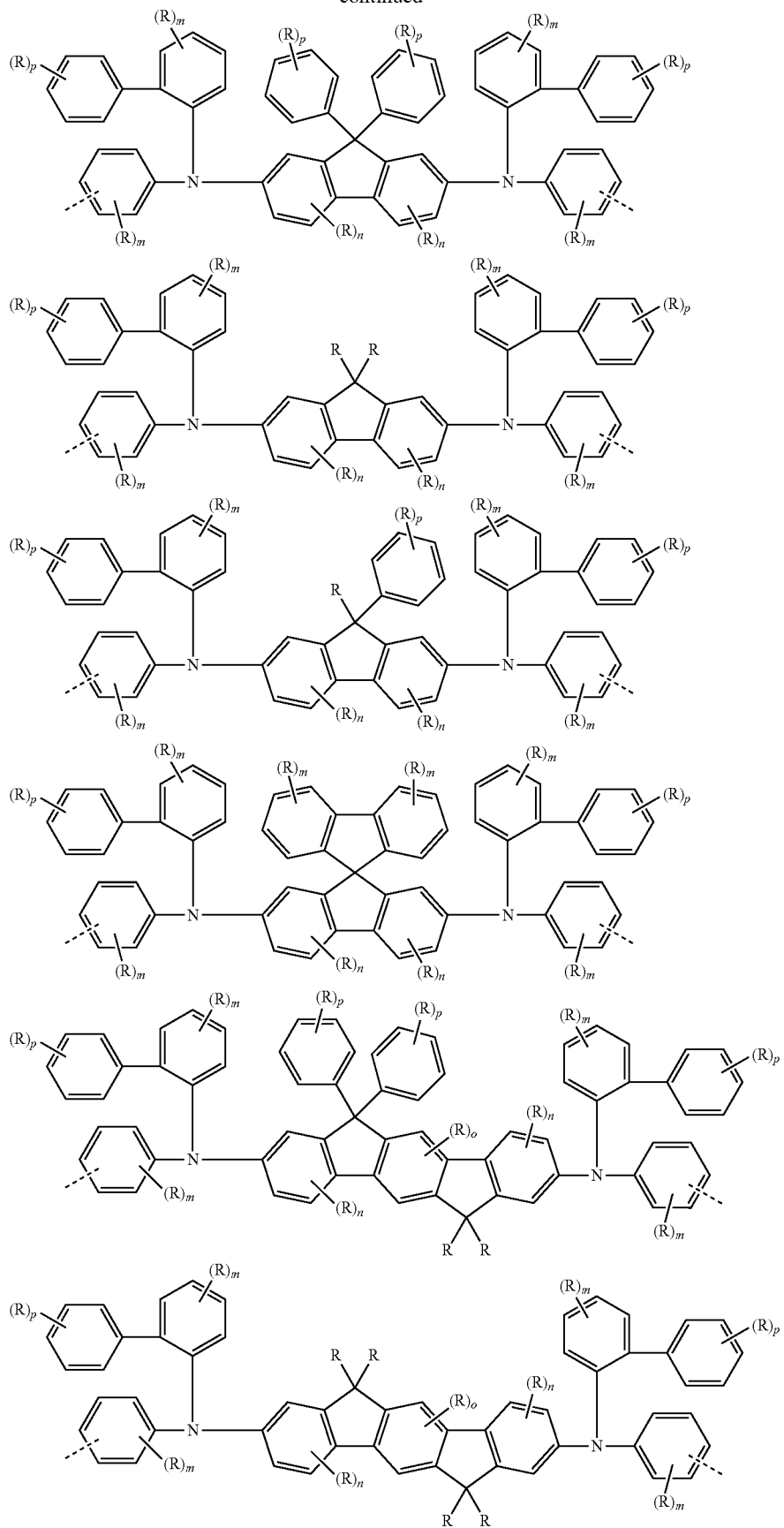

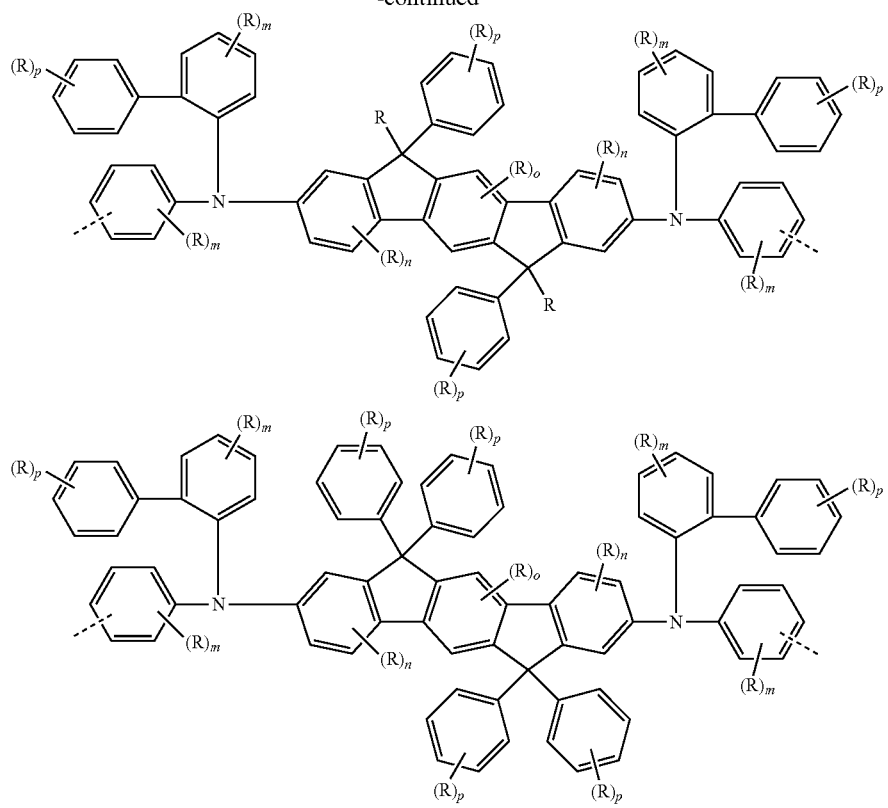
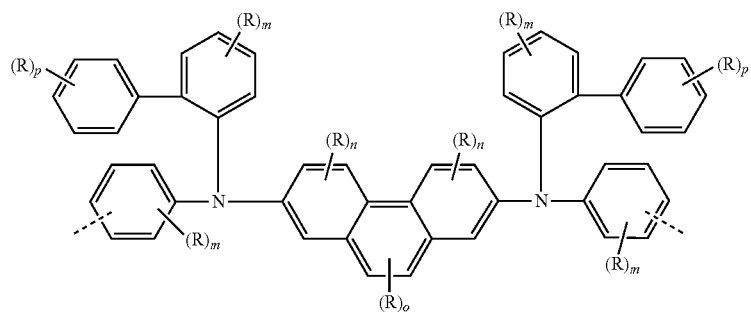
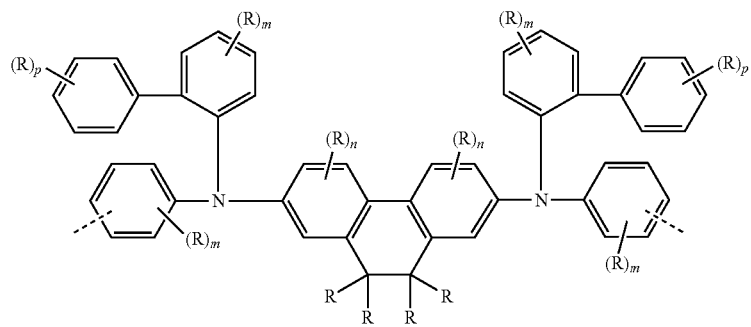

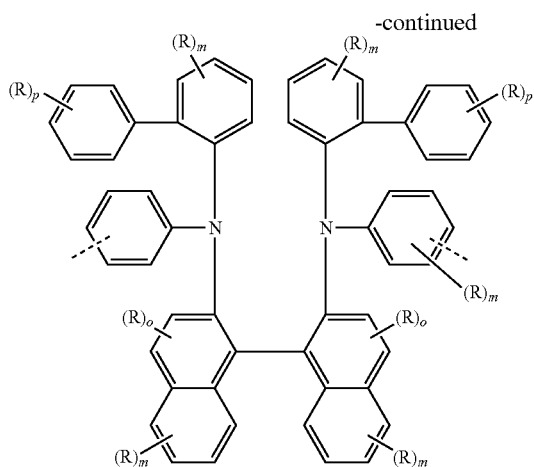

where R, m, n and p may each be as defined above, especially for the formulae (I), (Ia), (Ib), (VIIIa) and/or (VIIIb), and o=0, 1 or 2.

In a further very particularly preferred embodiment, the structural units of the formulae (XIa) and (XIIa) are selected from the structural units of the following formulae (XIb) and (XIIb):

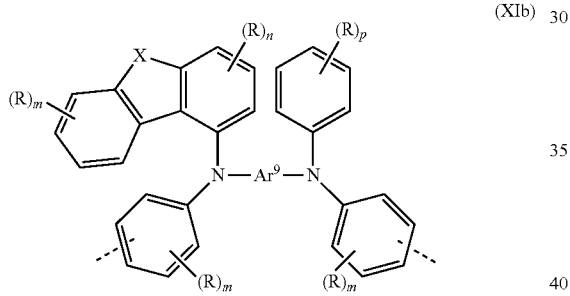

(XIb)

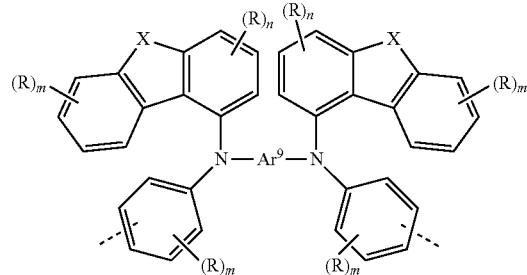

(XIIb)

where $Ar^9$, R, X, m, n and p may each be as defined above, especially for the formulae (I), (Ia), (Ib), (VIIIa) and/or (VIIIb).

Examples of preferred structural units of the formulae (XIb) and (XIIb) are depicted in the following table:

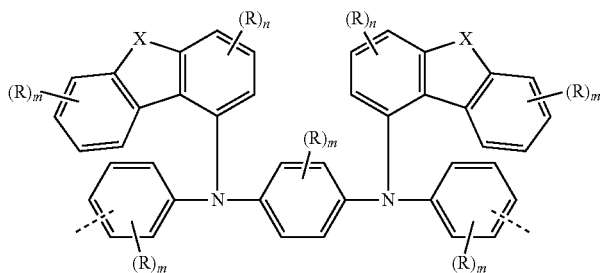

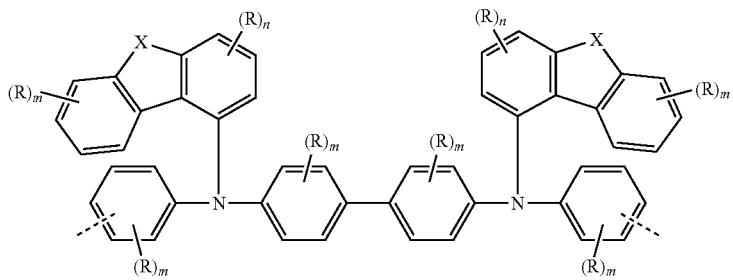

-continued
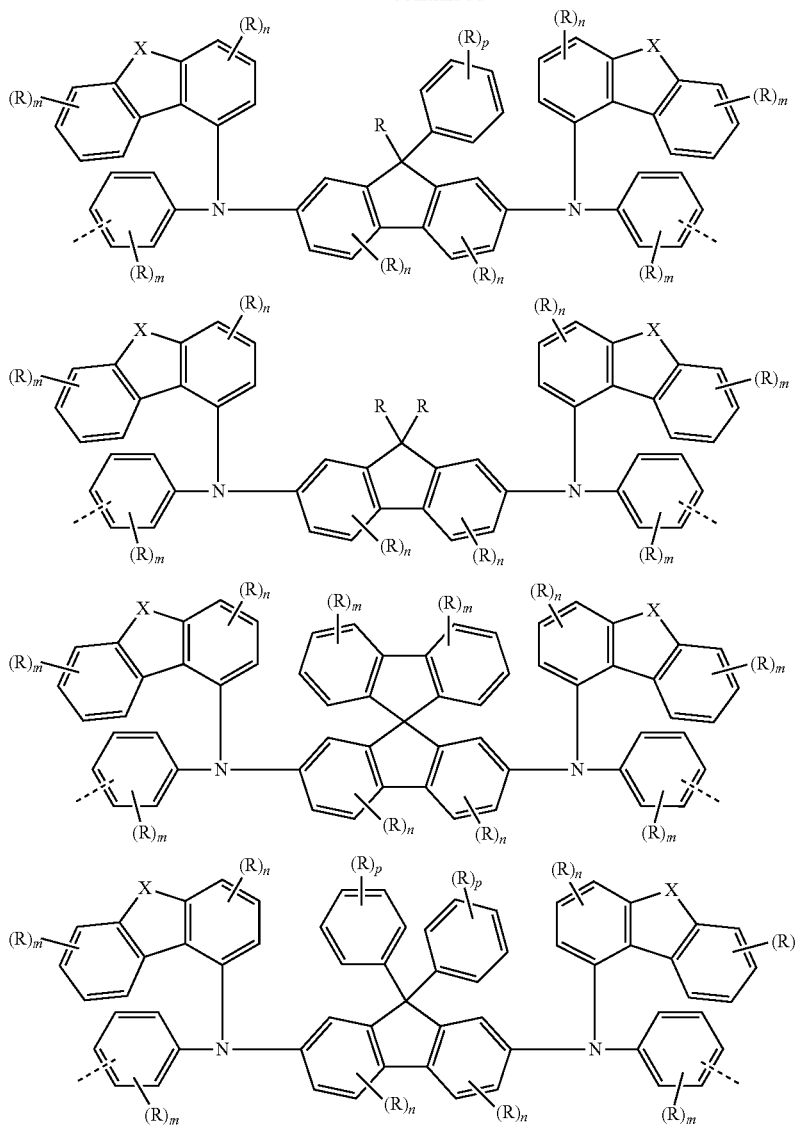
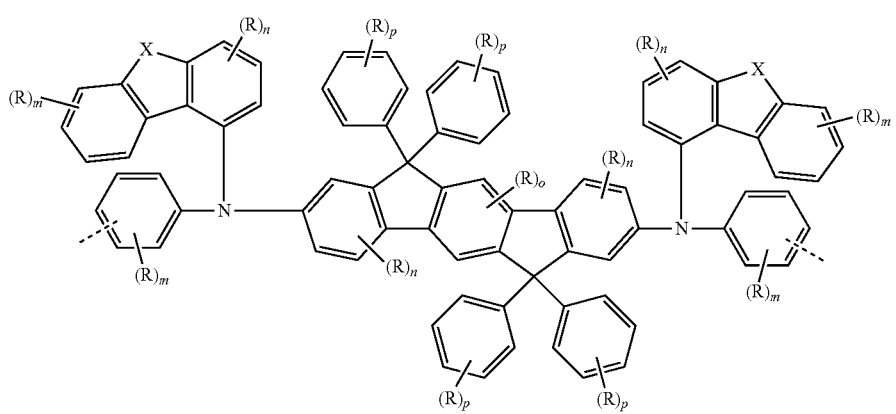

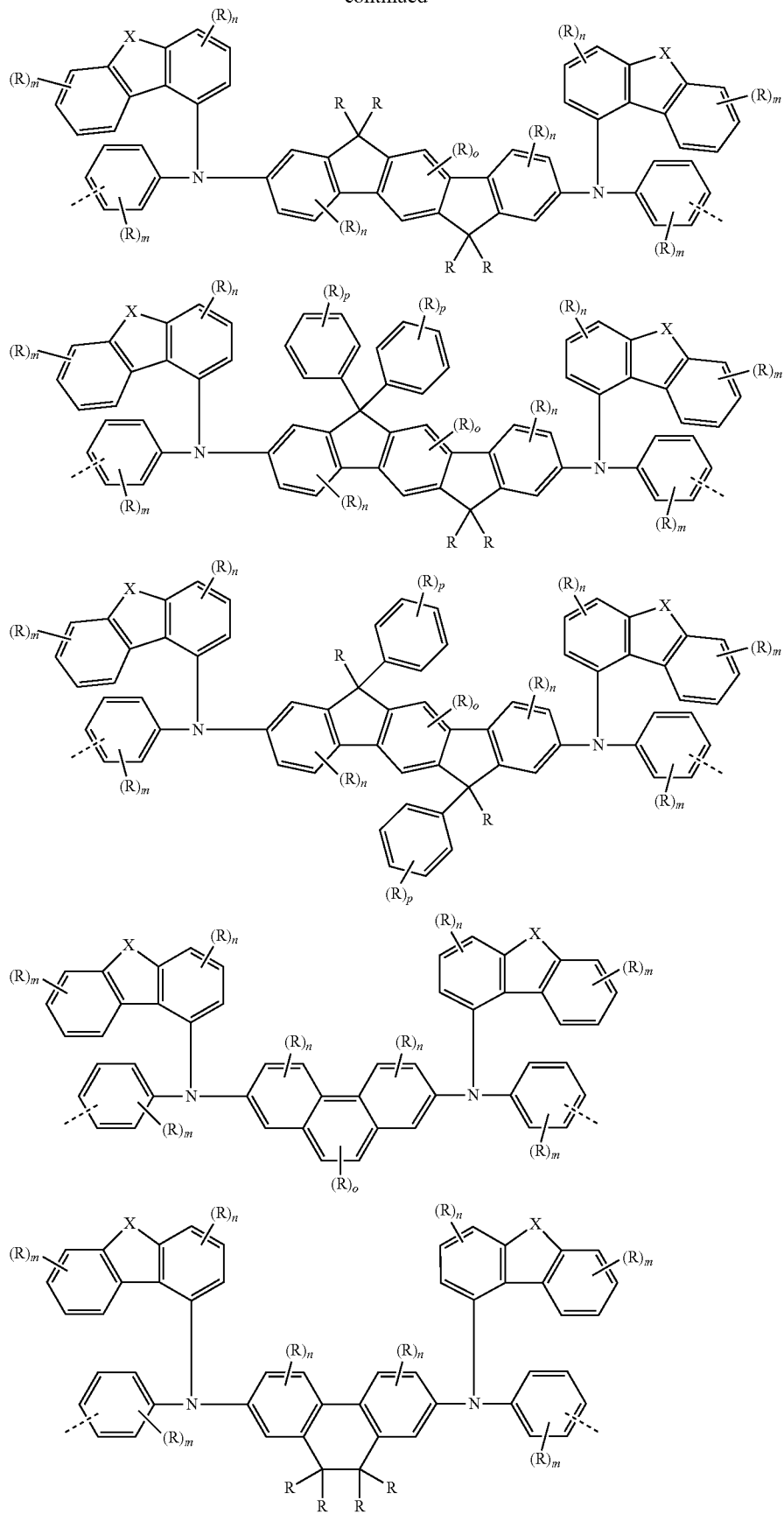

-continued

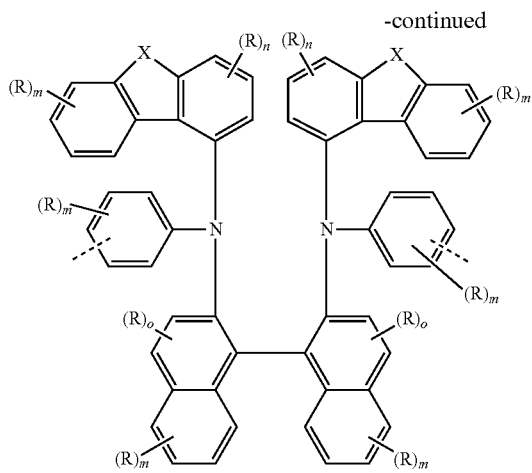

where R, X, m, n and p may each be as defined above, especially for the formulae (I), (Ia), (Ib), (VIIIa) and/or (VIIIb), and o=0, 1 or 2.

In yet another further very particularly preferred embodiment, the structural units of the formulae (XIIIa) and (XIVa) are selected from the structural units of the following formulae (XIIIb) and (XIVb):

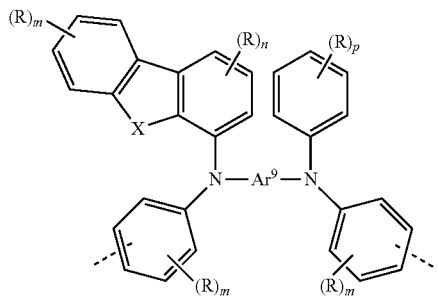
(XIIIb)

-continued

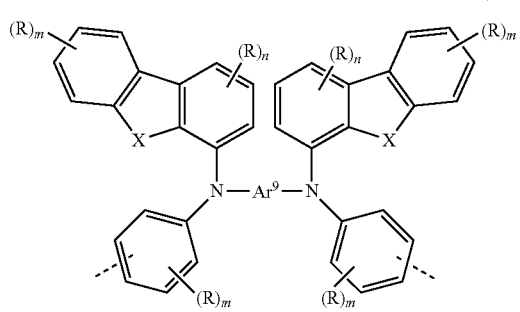
(XIVb)

where R, X, m, n and p may each be as defined above, especially for the formulae (I), (Ia), (Ib), (VIIIa) and/or (VIIIb).

Examples of preferred structural units of the formulae (XIIIb) and (XIVb) are depicted in the following table:

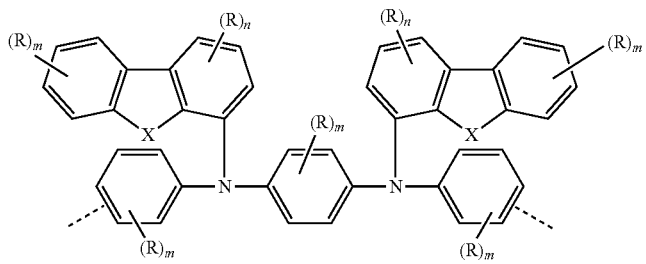

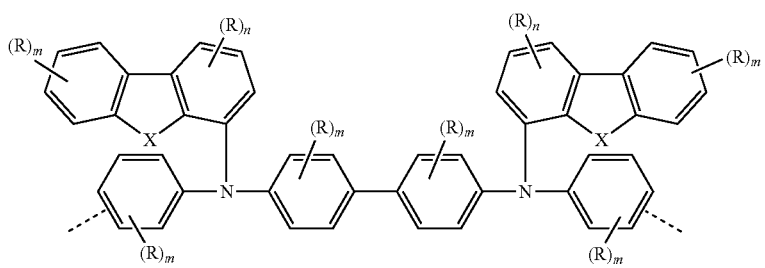

-continued
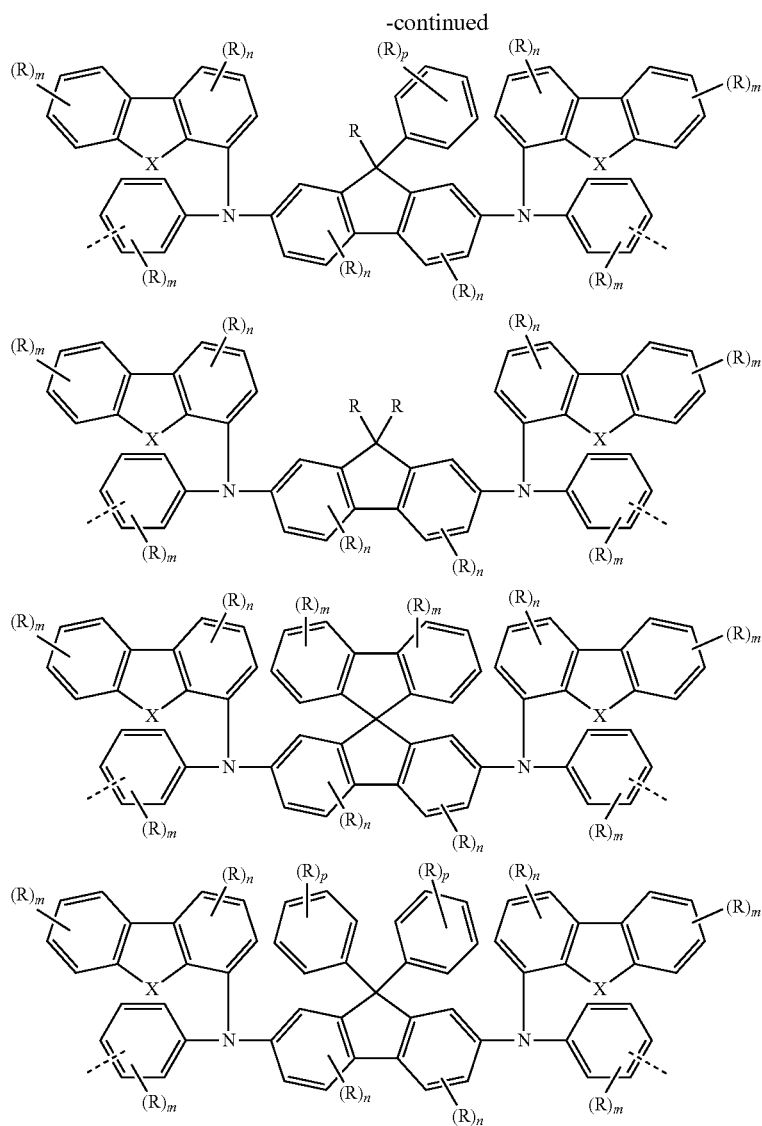
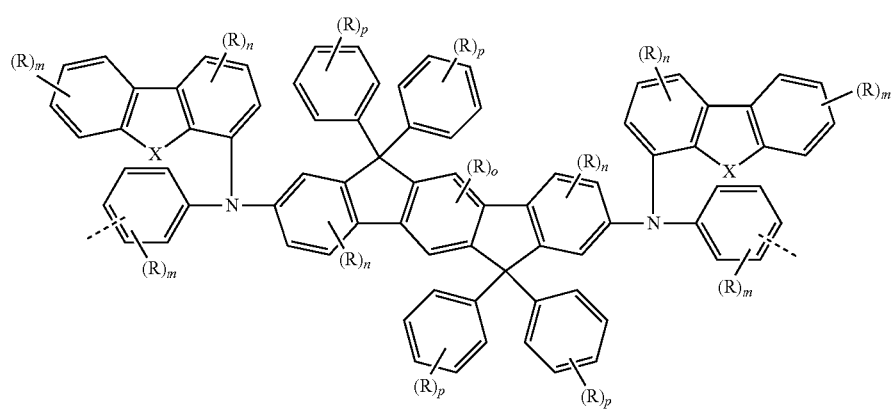

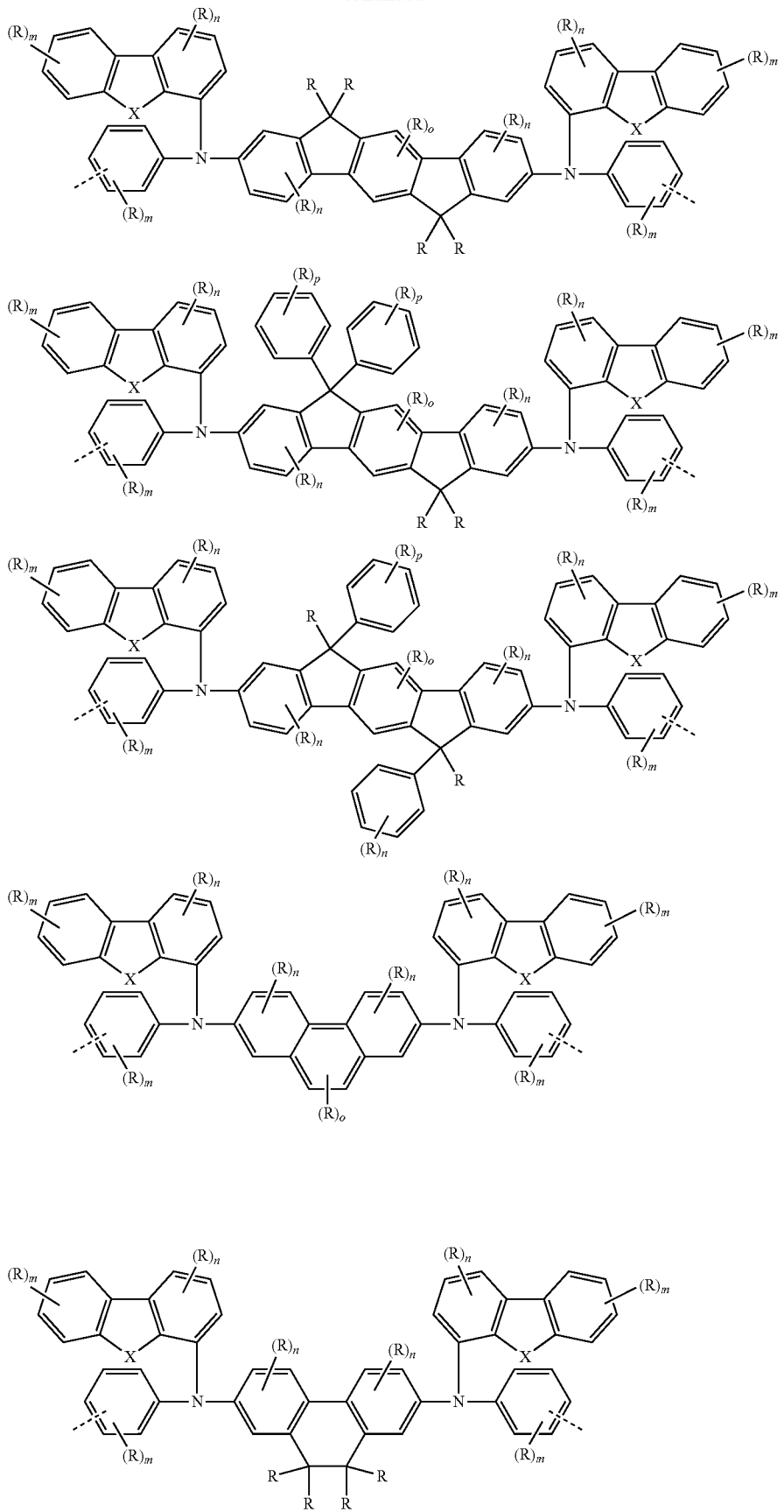

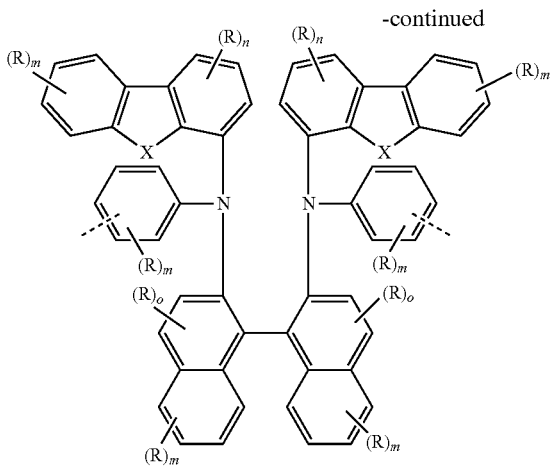

where R, X, m, n and p may each be as defined above, especially for the formulae (I), (Ia), (Ib), (VIIIa) and/or (VIIIb), and o=0, 1 or 2.

In the formulae (IXa) to (XIVa) and (IXb) to (XIVb), the dotted lines represent the bonds to the adjacent structural units in the polymer. They may independently be arranged identically or differently in the ortho, meta or para positions, preferably identically in the ortho, meta or para position, more preferably in the meta or para position and most preferably in the para position.

In a third preferred configuration of the present invention, it may be the case that at least one of the structural units of the formulae (I), (Ia), (Ib), (II), (III), (IV), (V), (VI), (VII), (VIIIa), (VIIIb), (IX), (X), (XI), (XII), (XIII), (XIV), (XV), (XVI) and/or a preferred configuration of these structural units has at least one crosslinkable Q group.

"Crosslinkable Q group" in the context of the present invention means a functional group capable of entering into a reaction and thus forming an insoluble compound. The reaction may be with a further identical Q group, a further different Q group or any other portion of the same or another polymer chain. The crosslinkable group is thus a reactive group. This affords, as a result of the reaction of the crosslinkable group, a correspondingly crosslinked compound. The chemical reaction can also be conducted in the layer, giving rise to an insoluble layer. The crosslinking can usually be promoted by means of heat or by means of UV radiation, microwave radiation, x-radiation or electron beams, optionally in the presence of an initiator. "Insoluble" in the context of the present invention preferably means that the inventive polymer, after the crosslinking reaction, i.e. after the reaction of the crosslinkable groups, has a lower solubility at room temperature in an organic solvent by at least a factor of 3, preferably at least a factor of 10, than that of the corresponding non-crosslinked inventive polymer in the same organic solvent.

At least one crosslinkable group in the present application means that a structural unit has one or more crosslinkable groups. Preferably, a structural unit has exactly one crosslinkable group.

If the structural unit of the formula (I) has a crosslinkable group, it may be bonded to $Ar^1$, $Ar^2$ or $Ar^3$. Preferably, the crosslinkable group is bonded to the monovalently bonded mono- or polycyclic aromatic or heteroaromatic ring system $Ar^3$.

If the structural unit of the formula (VIIIa) or (VIIIb) has a crosslinkable group, it may be bonded to $Ar^5$, $Ar^6$, $Ar^8$ or $Ar^9$. Preferably, the crosslinkable group is bonded to one of the monovalently bonded mono- or polycyclic aromatic or heteroaromatic ring systems, i.e. to $Ar^5$ or $Ar^8$.

Preferred mono- or polycyclic, aromatic or heteroaromatic $Ar^3$ groups in formula (I), $Ar^4$ groups in formulae (Ia), (Ib), (II), (III), (IV), (V), (VI), (VII), (VIIIa), (VIIIb), (IX), (X), (XI), (XII), (XIII), (XIV), (XV) and/or (XVI); $Ar^5$ and $Ar^8$ groups in formulae (VIIIa) and/or (VIIIb), and the preferred embodiments thereof, are as follows:

E1

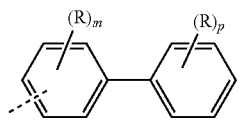

E2

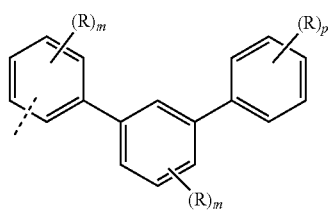

E3

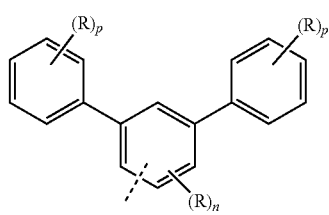

E4

-continued

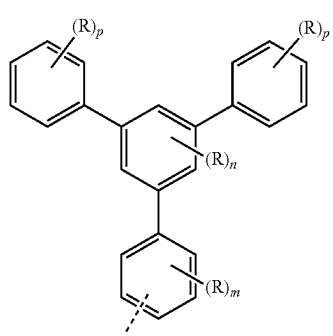
E5

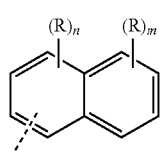
E6

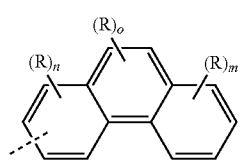
E7

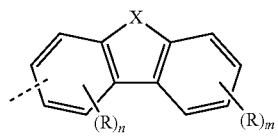
E8

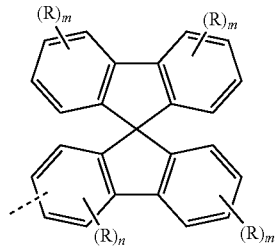
E9

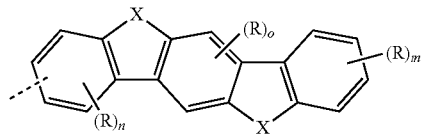
E10

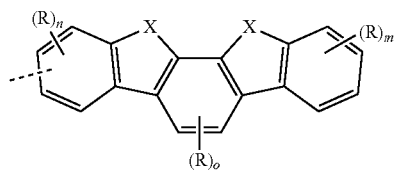
E11

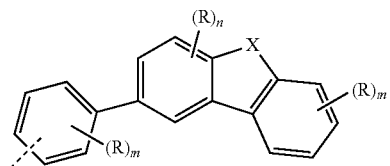
E12

The R radicals in the formulae E1 to E12 may be as defined for the R radicals in the formula (I). X may be CR$_2$, NR, SiR$_2$, O, S, C=O or P=O, preferably CR$_2$, SiR$_2$, NR, O or S, where R here too may be as defined for the R radicals in relation to the formula (I). The dotted line represents the bonding site to the adjacent group.

The indices used are defined as follows:
m=0, 1, 2, 3 or 4;
n=0, 1, 2 or 3;
o=0, 1 or 2; and
p=0, 1, 2, 3, 4 or 5.

Preferred mono- or polycyclic, aromatic or heteroaromatic Ar$^1$ and Ar$^2$ groups in formula (I), Ar$^6$, Ar$^7$ and Ar$^9$ groups in formulae (VIIIa) and/or (VIIIb) are as follows:

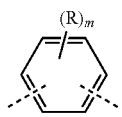
M1

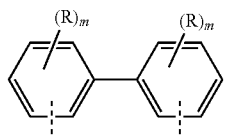
M2

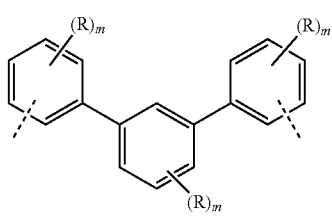
M3

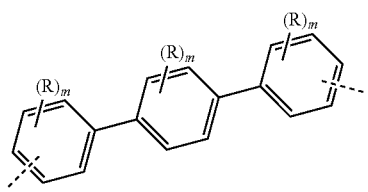
M4

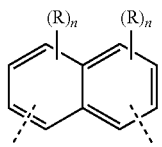
M5

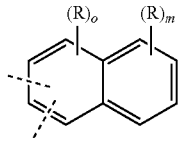
M6

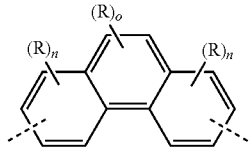
M7

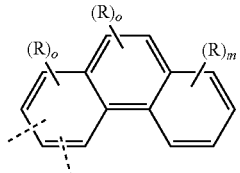
M8

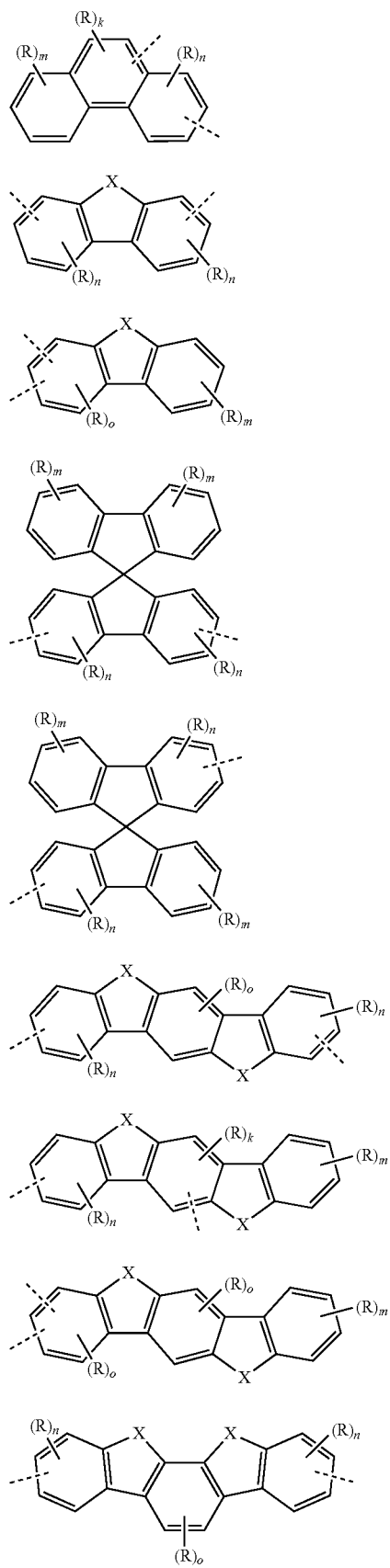
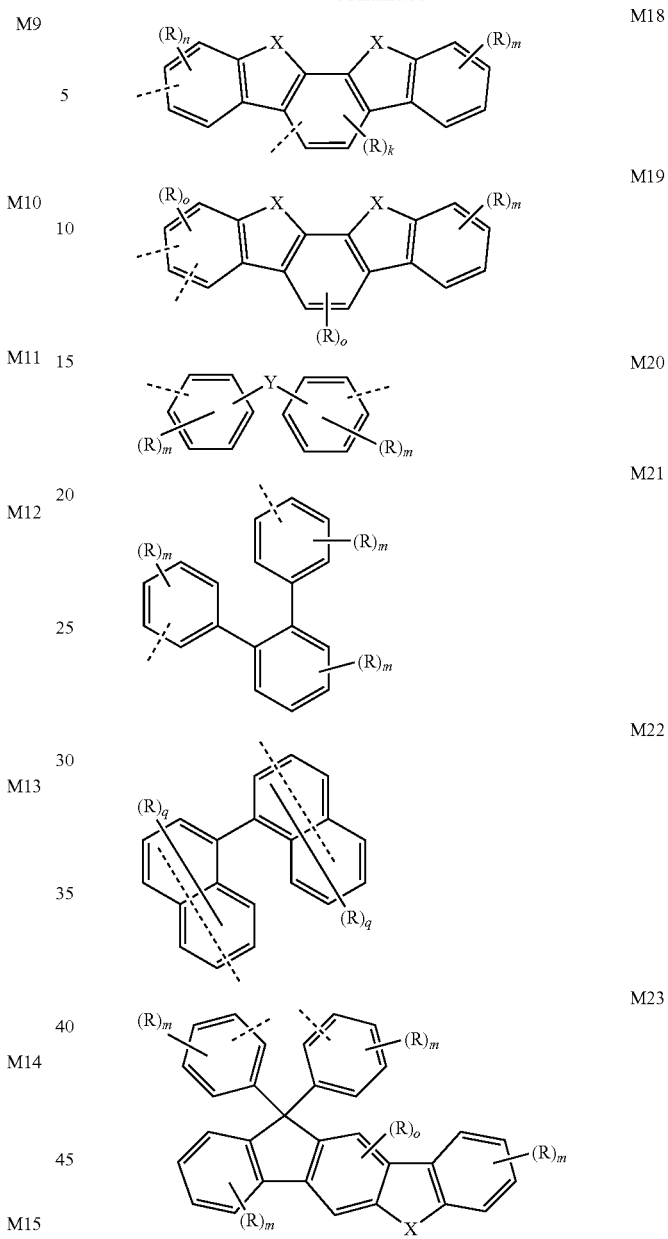

The R radicals in the formulae M1 to M23 may be as defined for the R radicals in the formula (I). X may be CR$_2$, NR, SiR$_2$, O, S, C=O or P=O, preferably CR$_2$, SiR$_2$, NR, O or S, where R here too may be as defined for the R radicals in relation to the formula (I). The dotted lines represent the bonding sites to the adjacent groups.

Y may be CR$_2$, SiR$_2$, O, S or a straight-chain or branched, alkyl group having 1 to 20 carbon atoms or an alkenyl or alkynyl group having 2 to 20 carbon atoms, each of which may be substituted by one or more R$^1$ radicals, and where one or more nonadjacent CH$_2$ groups, CH groups or carbon atoms in the alkyl, alkenyl or alkynyl groups may be replaced by Si(R$^1$)$_2$, C=O, C=S, C=NR$^1$, P(=O)(R$^1$), SO, SO$_2$, NR$^1$, O, S, CONR$^1$ or an aromatic or heteroaromatic ring system which has 5 to 60 aromatic ring atoms and may be substituted in each case by one or more R$^1$ radicals, or an aryloxy or heteroaryloxy group which has 5 to 60 aromatic ring atoms and may be substituted by one or more R[1] radicals, or an aralkyl or heteroaralkyl group which has 5 to 60 aromatic ring atoms and may be substituted by one or more R[1] radicals, or a diarylamino group, diheteroarylamino group or arylheteroarylamino group which has 10 to 40 aromatic ring atoms and may be substituted by one or more R[1] radicals; where the R and R[1] radicals here too may be as defined for the R and R[1] radicals in formula (I).

The indices used are defined as follows:

k=0 or 1;

m=0, 1, 2, 3 or 4;

n=0, 1, 2 or 3;

o=0, 1 or 2; and q=0, 1, 2, 3, 4, 5 or 6.

Particularly preferred mono- or polycyclic, aromatic or heteroaromatic Ar$^a$ groups in formula (I), Ar$^4$ groups in formulae (Ia), (Ib), (II), (III), (IV), (V), (VI), (VII), (VIIIa), (VIIIb), (IX), (X), (XI), (XII), (XIII), (XIV), (XV) and/or (XVI); Ar$^5$ and Ar$^8$ groups in formulae (VIIIa) and/or (VIIIb), and the preferred embodiments thereof, are as follows:

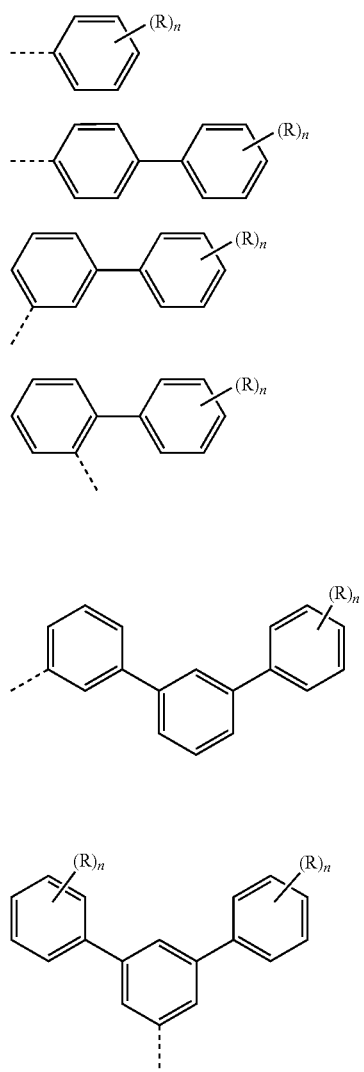

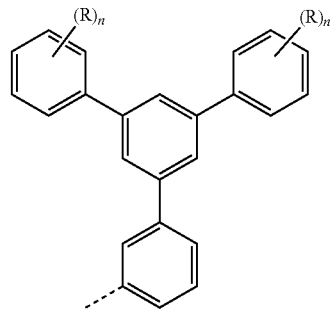

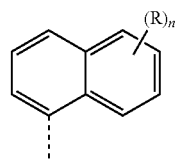

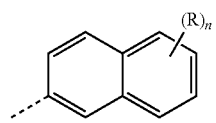

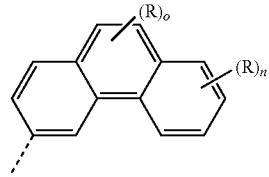

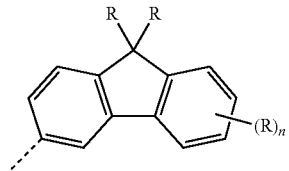

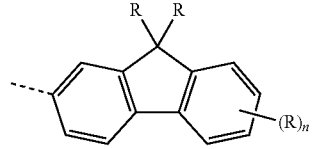

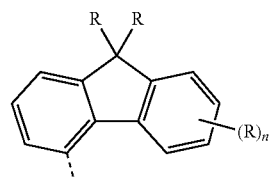

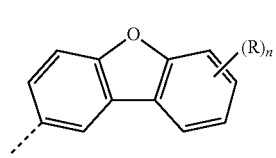

-continued

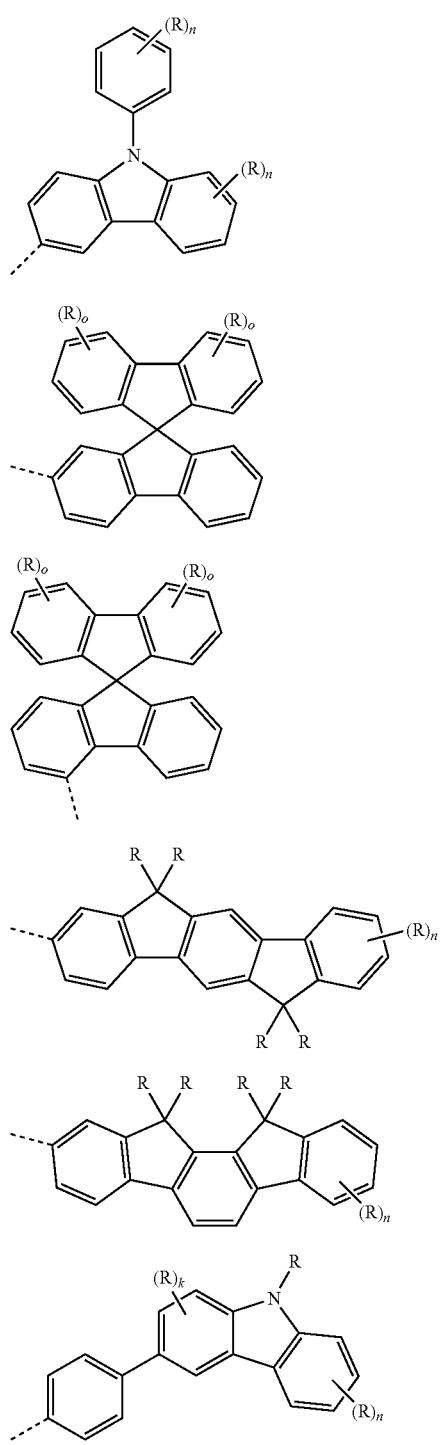

The R radicals in the formulae E1a to E12a may be as defined for the R radicals in formula (I).

The indices used are defined as follows:

o=0 or 1; and n=0, 1, 2 or 3.

The R radicals in the formulae E1a to E12a may be the same or different at each instance, preferably H or a straight-chain or branched alkyl group having 1 to 12 carbon atoms, preferably 1 to 10 carbon atoms. More preferably, the R radicals in the formulae E1a to E12a are methyl, n-butyl, sec-butyl, tert-butyl, n-hexyl and n-octyl.

Particularly preferred mono- or polycyclic, aromatic or heteroaromatic $Ar^2$ and $Ar^3$ groups in formula (I), $Ar^5$, $Ar^7$ and $Ar^8$ groups in formula (IIa), $Ar^4$, $Ar^5$ and $Ar^8$ groups in formula (IIb), and $Ar^9$ groups in formula (III) are as follows:

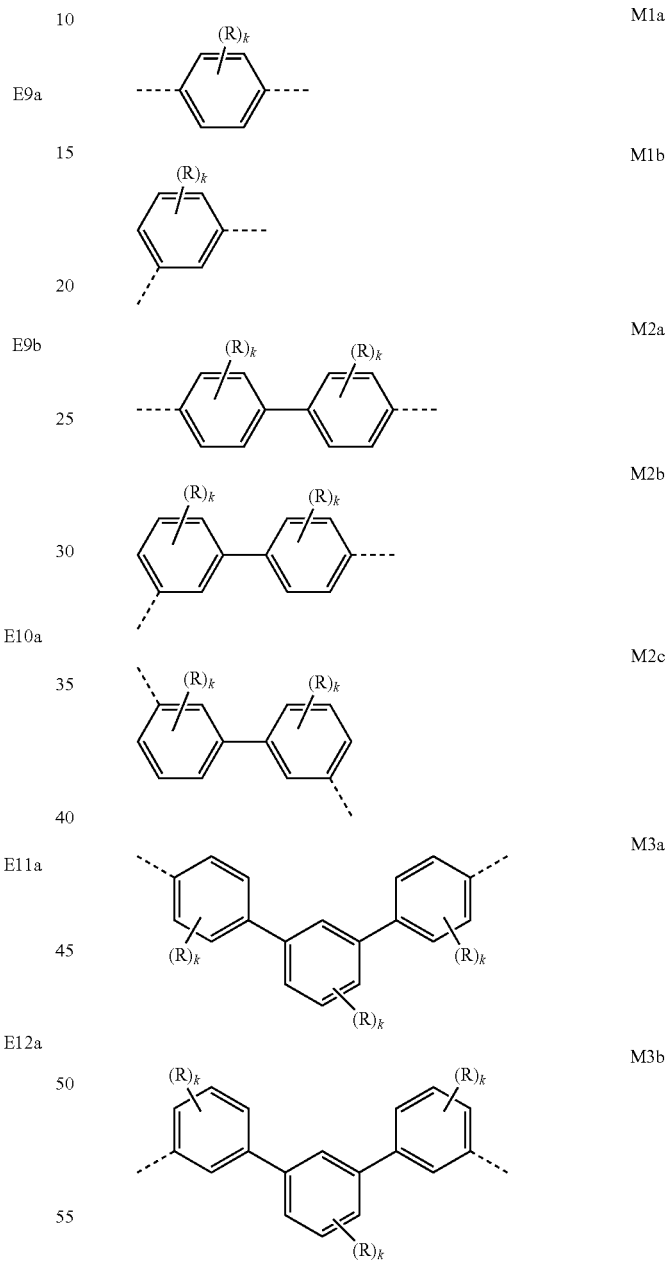

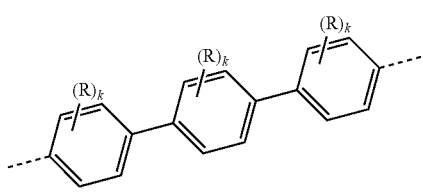

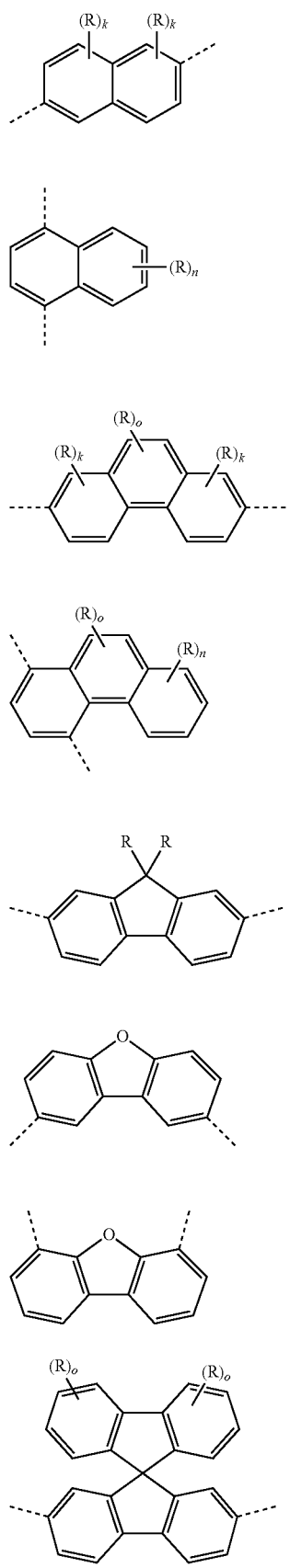
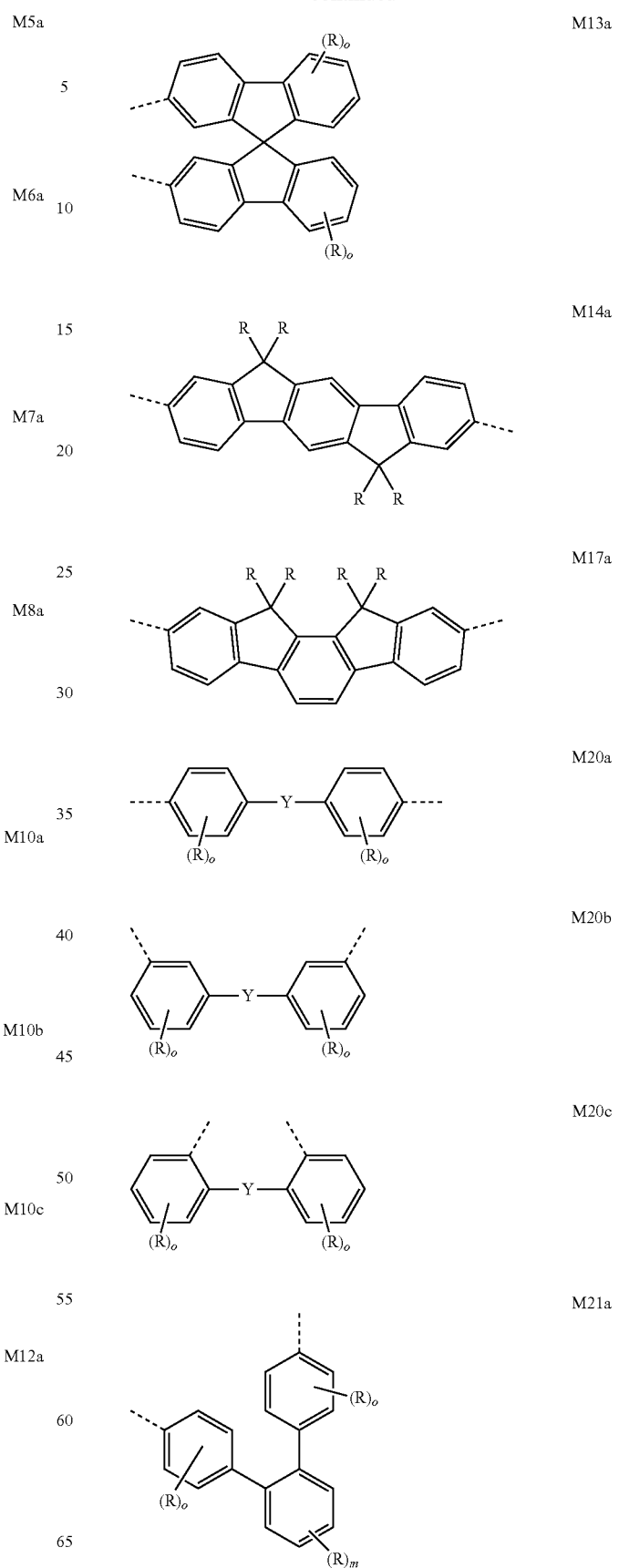

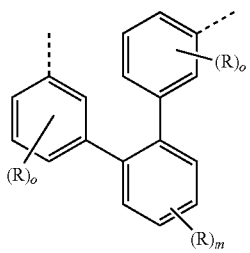

M21b

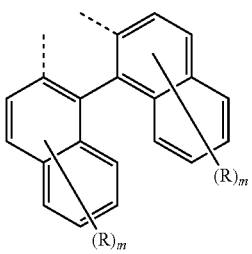

M22a

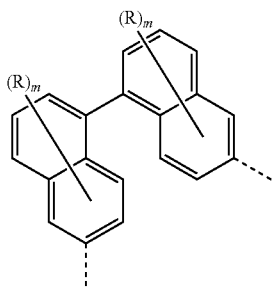

M22b

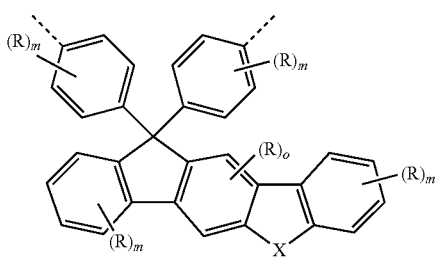

M23a

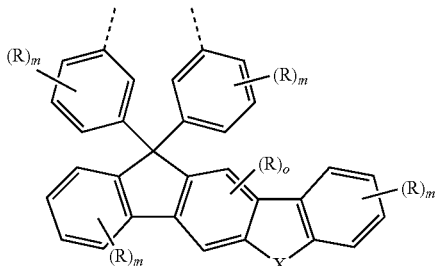

M23b

The R radicals in the formulae M1a to M23a may be as defined for the R radicals in formula (I). X may be $CR_2$ or $SiR_2$, where R here too may be as defined for the R radicals in formula (I).

Y may be $CR_2$, $SiR_2$, O, S or a straight-chain alkyl group having 1 to 10 carbon atoms or an alkenyl or alkynyl group having 2 to 10 carbon atoms, each of which may be substituted by one or more $R^1$ radicals, and where one or more nonadjacent $CH_2$ groups, CH groups or carbon atoms in the alkyl, alkenyl or alkynyl groups may be replaced by $Si(R^1)_2$, C=O, C=$NR^1$, P(=O)($R^1$), $NR^1$, O, $CONR^1$ or an aromatic or heteroaromatic ring system which has 5 to 30 aromatic ring atoms and may be substituted in each case by one or more $R^1$ radicals, or an aryloxy or heteroaryloxy group which has 5 to 30 aromatic ring atoms and may be substituted by one or more $R^1$ radicals, or an aralkyl or heteroaralkyl group which has 5 to 30 aromatic ring atoms and may be substituted by one or more $R^1$ radicals, or a diarylamino group, diheteroarylamino group or arylheteroarylamino group which has 10 to 20 aromatic ring atoms and may be substituted by one or more $R^1$ radicals; where the R and $R^1$ radicals here too may be as defined for the R and $R^1$ radicals in formula (I).

The indices used are defined as follows:

k=0 or 1;

o=0, 1 or 2;

n=0, 1, 2 or 3; and m=0, 1, 2, 3 or 4.

A selection of preferred structural units of the formula (I) is listed in Table 1 below.

TABLE 1

| Formula (I) | $Ar^1$ | $Ar^2$ | $Ar^3$ |
|---|---|---|---|
| I1 | M1 | M1 | E1 |
| I2 | M2 | M2 | E1 |
| I3 | M10 | M10 | E1 |
| I4 | M12 | M12 | E1 |
| I5 | M14 | M14 | E1 |
| I6 | M19 | M19 | E1 |
| I7 | M1 | M1 | E2 |
| I8 | M1 | M2 | E2 |
| I9 | M7 | M7 | E2 |
| I10 | M12 | M12 | E2 |
| I11 | M13 | M13 | E2 |
| I12 | M1 | M1 | E3 |
| I13 | M13 | M13 | E3 |
| I14 | M1 | M1 | E4 |
| I15 | M2 | M2 | E4 |
| I16 | M14 | M14 | E4 |
| I17 | M3 | M3 | E5 |
| I18 | M12 | M12 | E5 |
| I19 | M6 | M6 | E6 |
| I20 | M10 | M10 | E6 |
| I21 | M16 | M16 | E6 |
| I22 | M2 | M2 | E7 |
| I23 | M15 | M15 | E7 |
| I24 | M1 | M1 | E8 |
| I25 | M2 | M2 | E8 |
| I26 | M4 | M4 | E8 |
| I27 | M5 | M5 | E8 |
| I28 | M10 | M10 | E8 |
| I29 | M12 | M12 | E8 |
| I30 | M14 | M14 | E8 |
| I31 | M1 | M1 | E9 |
| I32 | M8 | M8 | E9 |
| I33 | M13 | M13 | E9 |
| I34 | M10 | M10 | E10 |
| I35 | M9 | M9 | E11 |
| I36 | M17 | M17 | E11 |
| I37 | M7 | M7 | E12 |
| I38 | M18 | M18 | E12 |
| I39 | M23 | M23 | E1 |
| I40 | M1 | M21 | E2 |
| I41 | M20 | M20 | E8 |
| I42 | M22 | M22 | E9 |

Particularly preferred structural units of the formula (I) are structural units in which $Ar^3$ is selected from the groups of the formulae E1a to E12a and $Ar^1$ and $Ar^2$ are selected from the groups of the formulae M1a to M17a, it being particularly preferable when $Ar^1$ and $Ar^2$ are the same.

A selection of particularly preferred structural units of the formula (I) is listed in Table 2 below.

TABLE 2

| Formula (I) | Ar$^1$ | Ar$^2$ | Ar$^3$ |
|---|---|---|---|
| I1a | M1a | M1a | E1a |
| I2a | M2a | M2a | E1a |
| I2b | M2c | M2c | E1a |
| I3a | M10a | M10a | E1a |
| I4a | M12a | M12a | E1a |
| I5a | M14a | M14a | E1a |
| I7a | M1b | M1b | E2a |
| I7b | M1a | M1a | E2c |
| I8a | M1a | M2c | E2c |
| I9a | M7a | M7a | E2b |
| I10a | M12a | M12a | E2a |
| I11a | M13a | M13a | E2a |
| I12a | M1b | M1b | E3a |
| I13a | M13a | M13a | E3a |
| I14a | M1a | M1a | E4a |
| I15a | M2a | M2a | E4a |
| I15b | M2b | M2b | E4a |
| I16a | M14a | M14a | E4a |
| I17a | M3a | M3a | E5a |
| I18a | M12a | M12a | E5a |
| I19a | M6a | M6a | E6a |
| I20a | M10b | M10b | E6b |
| I22a | M2a | M2a | E7a |
| I24a | M1a | M1a | E8a |
| I24b | M1b | M1b | E8b |
| I24c | M1a | M1a | E8e |
| I24d | M1b | M1b | E8f |
| I25a | M2c | M2c | E8a |
| I25b | M2b | M2b | E8b |
| I25c | M2c | M2c | E8f |
| I26a | M4a | M4a | E8c |
| I27a | M5a | M5a | E8d |
| I28a | M10a | M10a | E8c |
| I29a | M12a | M12a | E8b |
| I30a | M14a | M14a | E8e |
| I31a | M1a | M1a | E9b |
| I32a | M8a | M8a | E9a |
| I33a | M13a | M13a | E9a |
| I34a | M10c | M10c | E10a |
| I36a | M17a | M17a | E11a |
| I37a | M7a | M7a | E12a |
| I39a | M23a | M23a | E1a |
| I39b | M23b | M23b | E1a |
| I40a | M1a | M21a | E2c |
| I40b | M1b | M21a | E2a |
| I41a | M20a | M20a | E8b |
| I41b | M20b | M20b | E8c |

Particularly preferred structural units of the formula (VIIIa) are structural units in which Ar$^5$ and Ar$^8$ are the same or different and are each independently selected from the groups of the formulae E1 to E12 and Ar$^5$, Ar$^7$ and Ar$^9$ are the same or different and are each independently selected from the groups of the formulae M1 to M19, it being particularly preferable when Ar$^5$ and Ar$^8$, and Ar$^6$ and Ar$^7$, are the same.

Particularly preferred structural units of the formula (VIIIb) are structural units in which Ar$^5$ and Ar$^8$ are the same or different and are each independently selected from the groups of the formulae E1 to E12 and Ar$^5$, Ar$^7$ and Ar$^9$ are the same or different and are each independently selected from the groups of the formulae M1 to M19, it being particularly preferable when Ar$^5$ and Ar$^8$, and Ar$^6$ and Ar$^7$, are the same.

A selection of preferred structural units of the formulae (VIIIa) and (VIIIb) is listed in Table 3 below.

TABLE 3

| | Formula (VIIIa) | | | | |
|---|---|---|---|---|---|
| | Ar$^5$ | Ar$^6$ | Ar$^7$ | Ar$^8$ | Ar$^9$ |
| | Formula (VIIIb) | | | | |
| | Ar$^5$ | Ar$^6$ | Ar$^7$ | Ar$^8$ | Ar$^9$ |
| VIII1 | E1 | M1 | M1 | E1 | M1 |
| VIII2 | E1 | M1 | M1 | E1 | M2 |
| VIII3 | E1 | M1 | M1 | E1 | M10 |
| VIII4 | E1 | M1 | M1 | E1 | M13 |
| VIII5 | E1 | M1 | M1 | E1 | M14 |
| VIII6 | E1 | M14 | M14 | E1 | M12 |
| VIII7 | E2 | M1 | M1 | E2 | M2 |
| VIII8 | E2 | M2 | M2 | E2 | M12 |
| VIII9 | E3 | M7 | M7 | E3 | M1 |
| VIII10 | E3 | M10 | M10 | E3 | M16 |
| VIII11 | E4 | M1 | M1 | E4 | M7 |
| VIII12 | E4 | M1 | M1 | E4 | M12 |
| VIII13 | E4 | M2 | M2 | E4 | M14 |
| VIII14 | E4 | M10 | M10 | E4 | M13 |
| VIII15 | E4 | M1 | M1 | E8 | M7 |
| VIII16 | E5 | M2 | M13 | E5 | M13 |
| VIII17 | E6 | M3 | M3 | E6 | M6 |
| VIII18 | E6 | M17 | M17 | E6 | M10 |
| VIII19 | E7 | M5 | M5 | E7 | M4 |
| VIII20 | E8 | M1 | M1 | E8 | M1 |
| VIII21 | E8 | M1 | M1 | E8 | M2 |
| VIII22 | E8 | M1 | M1 | E8 | M12 |
| VIII23 | E8 | M2 | M2 | E8 | M10 |
| VIII24 | E8 | M6 | M6 | E8 | M8 |
| VIII25 | E8 | M10 | M10 | E8 | M7 |
| VIII26 | E8 | M13 | M13 | E8 | M2 |
| VIII27 | E8 | M14 | M14 | E8 | M12 |
| VIII28 | E9 | M1 | M1 | E9 | M2 |
| VIII29 | E9 | M9 | M9 | E9 | M11 |
| VIII30 | E9 | M19 | M19 | E9 | M18 |
| VIII31 | E10 | M1 | M1 | E10 | M4 |
| VIII32 | E11 | M2 | M2 | E11 | M10 |
| VIII33 | E11 | M13 | M13 | E11 | M15 |
| VIII34 | E12 | M7 | M7 | E12 | M14 |
| VIII35 | E2 | M1 | M1 | E2 | M14 |
| VIII36 | E2 | M1 | M1 | E2 | M12 |
| VIII37 | E8 | M1 | M1 | E8 | M20 |
| VIII38 | E9 | M1 | M1 | E9 | M23 |

Particularly preferred structural units of the formula (VIIIa) are structural units in which Ar$^5$ and Ar$^8$ are the same or different and are each independently selected from the groups of the formulae E1a to E12a and Ar$^5$, Ar$^7$ and Ar$^9$ are the same or different and are each independently selected from the groups of the formulae M1a to M17a, it being particularly preferable when Ar$^5$ and Ar$^8$, and Ar$^6$ and Ar$^7$, are the same.

Particularly preferred structural units of the formula (VIIIb) are structural units in which Ar$^5$ and Ar$^8$ are the same or different and are each independently selected from the groups of the formulae E1a to E12a and Ar$^5$, Ar$^7$ and Ar$^9$ are the same or different and are each independently selected from the groups of the formulae M1a to M17a, it being particularly preferable when Ar$^y$ and Ar$^8$, and Ar$^6$ and Ar$^7$, are the same.

A selection of particularly preferred structural units of the formula (VIIIa) or (VIIIb) is listed in Table 4 below.

TABLE 4

| | Formula (VIIIa) | | | | |
|---|---|---|---|---|---|
| | Ar$^5$ | Ar$^6$ | Ar$^7$ | Ar$^8$ | Ar$^9$ |
| | Formula (VIIIb) | | | | |
| | Ar$^5$ | Ar$^6$ | Ar$^7$ | Ar$^8$ | Ar$^9$ |
| VIII1a | E1a | M1a | M1a | E1a | M1a |
| VIII1b | E1a | M1b | M1b | E1a | M1b |

TABLE 4-continued

| | Formula (VIIIa) | | | | |
|---|---|---|---|---|---|
| | Ar$^5$ | Ar$^6$ | Ar$^7$ | Ar$^8$ | Ar$^9$ |
| | Formula (VIIIb) | | | | |
| | Ar$^5$ | Ar$^6$ | Ar$^7$ | Ar$^8$ | Ar$^9$ |
| VIII2a | E1a | M1a | M1a | E1a | M2a |
| VIII3a | E1a | M1a | M1a | E1a | M10a |
| VIII4a | E1a | M1a | M1a | E1a | M13a |
| VIII4b | E1a | M1b | M1b | E1a | M13a |
| VIII5a | E1a | M1a | M1a | E1a | M14a |
| VIII6a | E1a | M14a | M14a | E1a | M12a |
| VIII7a | E2a | M1a | M1a | E2a | M2a |
| VIII7b | E2c | M1a | M1a | E2c | M2a |
| VIII8a | E2b | M2b | M2b | E2b | M12a |
| VIII9a | E3a | M7a | M7a | E3a | M1b |
| VIII11a | E4a | M1b | M1b | E4a | M7a |
| VIII12a | E4a | M1b | M1b | E4a | M12a |
| VIII13a | E4a | M2b | M2b | E4a | M14a |
| VIII14a | E4a | M10a | M10a | E4a | M13a |
| VIII15a | E4a | M1b | M1b | E8a | M7a |
| VIII16a | E5a | M2c | M13a | E5a | M13a |
| VIII17a | E6a | M3a | M3a | E6a | M6a |
| VIII18a | E6b | M17a | M17a | E6b | M10b |
| VIII19a | E7a | M5a | M5a | E7a | M4a |
| VIII20a | E8f | M1a | M1a | E8f | M1a |
| VIII21a | E8b | M1a | M1a | E8b | M2a |
| VIII21b | E8e | M1a | M1a | E8e | M2a |
| VIII22a | E8b | M1b | M1b | E8b | M12a |
| VIII23a | E8d | M2b | M2b | E8d | M10c |
| VIII24a | E8f | M6a | M6a | E8f | M8a |
| VIII25a | E8a | M10a | M10a | E8a | M7a |
| VIII26a | E8c | M13a | M13a | E8c | M2c |
| VIII27a | E8b | M14a | M14a | E8b | M12a |
| VIII28a | E9a | M1a | M1a | E9a | M2a |
| VIII28b | E9b | M1a | M1a | E9b | M2a |
| VIII31a | E10a | M1b | M1b | E10a | M4a |
| VIII32a | E11a | M2c | M2c | E11a | M10c |
| VIII34a | E12a | M7a | M7a | E12a | M14a |
| VIII35a | E2a | M1a | M1a | E2a | M14a |
| VIII35b | E2c | M1a | M1a | E2c | M14a |
| VIII36a | E2c | M1a | M1a | E2c | M12a |
| VIII37a | E8b | M1a | M1a | E8b | M20a |
| VIII37b | E8e | M1a | M1a | E8e | M20b |
| VIII38a | E9a | M1b | M1b | E9a | M23a |
| VIII38b | E9b | M1b | M1b | E9b | M23b |

As described above, the crosslinkable Q group means a functional group capable of entering into a chemical reaction and thus forming an insoluble polymeric compound. It is generally possible to use any Q groups known for the purpose to the person skilled in the art. The particular function of this group is to join the inventive polymeric compounds to one another by a crosslinking reaction, optionally with further reactive polymeric compounds. This leads to a crosslinked compound or, when the reaction is conducted in a layer, to a crosslinked layer. A crosslinked layer in the context of the present invention is understood to mean a layer obtainable by conducting the crosslinking reaction from a layer of the inventive crosslinkable polymeric compound. The crosslinking reaction can generally be initiated by means of heat and/or by means of UV radiation, microwave radiation, x-radiation or electron beams and/or by the use of free-radical formers, anions, cations, acids and/or photoacids. The presence of catalysts may likewise be advisable or necessary. Preferably, the crosslinking reaction is a reaction for which no initiator and no catalyst need be added.

Crosslinkable Q groups preferred in accordance with the invention are the following groups:

a) Terminal or Cyclic Alkenyl or Terminal Dienyl and Alkynyl Groups:
   Suitable units are those which contain a terminal or cyclic double bond, a terminal dienyl group or a terminal triple bond, especially terminal or cyclic alkenyl, terminal dienyl or terminal alkynyl groups having 2 to 40 carbon atoms, preferably having 2 to 10 carbon atoms, where individual $CH_2$ groups and/or individual hydrogen atoms may also be replaced by the abovementioned R groups. Additionally suitable are also groups which are to be regarded as precursors and which are capable of in situ formation of a double or triple bond.

b) Alkenyloxy, Dienyloxy or Alkynyloxy Groups:
   Additionally suitable are alkenyloxy, dienyloxy or alkynyloxy groups, preferably alkenyloxy groups.

c) Acrylic Acid Groups:
   Additionally suitable are acrylic acid units in the broadest sense, preferably acrylic esters, acrylamides, methacrylic esters and methacrylamides. Particular preference is given to $C_{1-10}$-alkyl acrylate and $C_{1-10}$-alkyl methacrylate.

The crosslinking reaction of the groups mentioned above under a) to c) can be effected via a free-radical, cationic or anionic mechanism, or else via cycloaddition.

It may be advisable to add an appropriate initiator for the crosslinking reaction. Suitable initiators for the free-radical crosslinking are, for example, dibenzoyl peroxide, AIBN or TEMPO. Suitable initiators for the cationic crosslinking are, for example, $AlCl_3$, $BF_3$, triphenylmethyl perchlorate or tropylium hexachloroantimonate. Suitable initiators for the anionic crosslinking are bases, especially butyllithium.

In a preferred embodiment of the present invention, the crosslinking, however, is conducted without the addition of an initiator and is initiated exclusively by thermal means. The reason for this preference is that the absence of the initiator prevents contamination of the layer which could lead to worsening of the device properties.

d) Oxetanes and Oxiranes:
   A further suitable class of crosslinkable Q groups is that of oxetanes and oxiranes which crosslink cationically via ring opening.
   It may be advisable to add an appropriate initiator for the crosslinking reaction. Suitable initiators are, for example, $AlCl_3$, $BF_3$, triphenylmethyl perchlorate or tropylium hexachloroantimonate. It is likewise possible to add photoacids as initiators.

e) Silanes:
   Additionally suitable as a class of crosslinkable groups are silane groups $SiR_3$ where at least two R groups, preferably all three R groups, are Cl or an alkoxy group having 1 to 20 carbon atoms.
   This group reacts in the presence of water to give an oligo- or polysiloxane.

f) Cyclobutane Groups
   The abovementioned crosslinkable Q groups are generally known to those skilled in the art, as are the suitable reaction conditions which are used for reaction of these groups.

Preferred crosslinkable Q groups include alkenyl groups of the following formula Q1, dienyl groups of the following formula Q2, alkynyl groups of the following formula Q3, alkenyloxy groups of the following formula Q4, dienyloxy groups of the following formula Q5, alkynyloxy groups of the following formula Q6, acrylic acid groups of the following formulae Q7 and Q8, oxetane groups of the following formulae Q9 and Q10, oxirane groups of the following formula Q11 and cyclobutane groups of the following formula Q12:

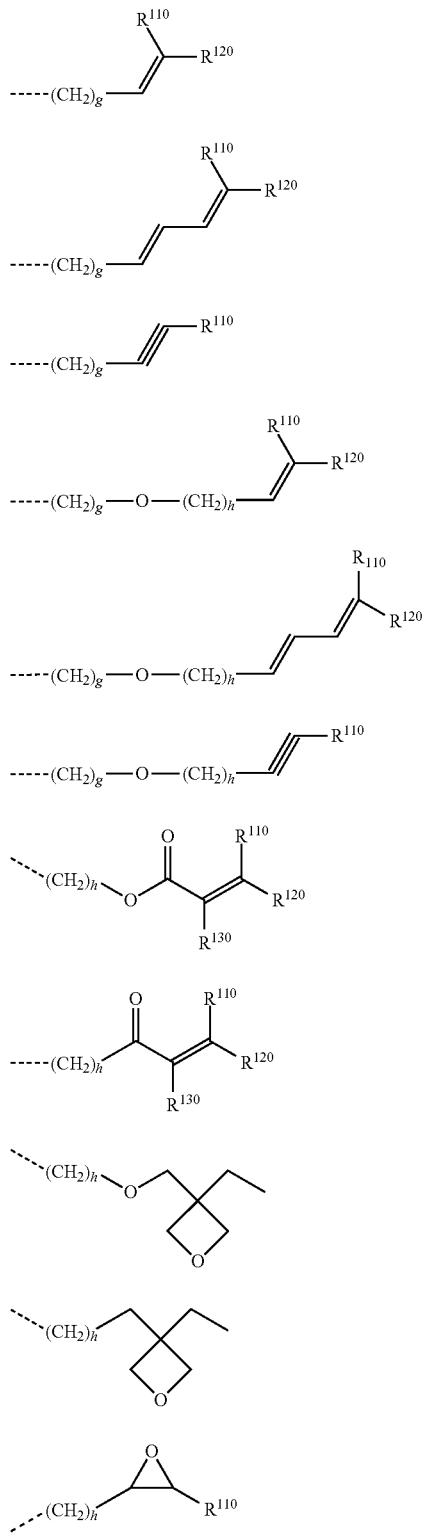

The $R^{110}$, $R^{120}$ and $R^{130}$ radicals in the formulae Q1 to Q8 and Q11 are the same or different at each instance and are H or a straight-chain or branched alkyl group having 1 to 6 carbon atoms, preferably 1 to 4 carbon atoms. More preferably, the $R^{110}$, $R^{120}$ and $R^{130}$ radicals are H, methyl, ethyl, n-propyl, isopropyl, n-butyl, sec-butyl or tert-butyl and most preferably H or methyl. The indices used are defined as follows: g=0 to 8; and h=1 to 8.

The dotted bond in the formulae Q1 to Q11 and the dotted bonds in the formula Q12 represent the linkage of the crosslinkable group to the structural units.

The crosslinkable groups of the formulae Q1 to Q12 may be joined directly to the structural unit, or else indirectly, via a further mono- or polycyclic, aromatic or heteroaromatic ring system $Ar^{10}$, as shown in the following formulae Q13 to Q24:

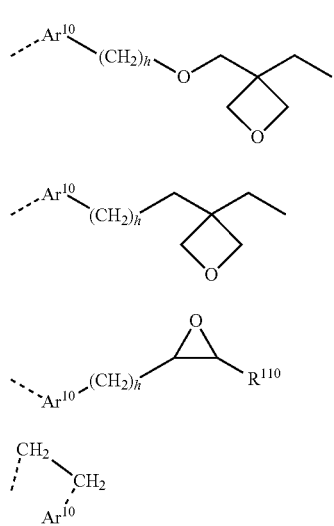

where $Ar^{10}$ in the formulae Q13 to Q24 may be as defined for the $Ar^1$ radical described in detail for formula (I). The indices used are defined as follows: g=0 to 8; and h=1 to 8.

Particularly preferred crosslinkable Q groups are as follows:

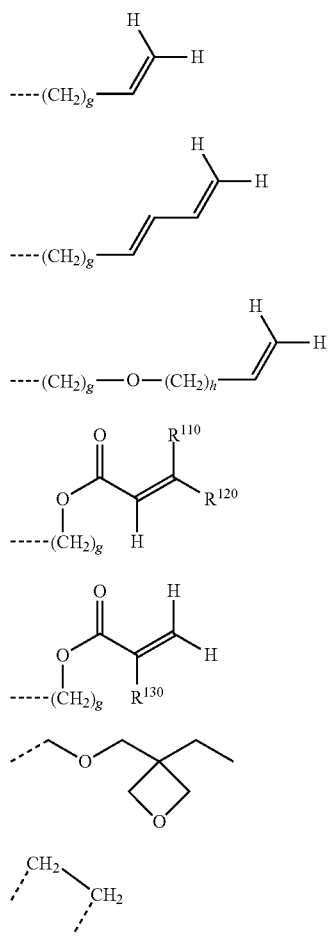

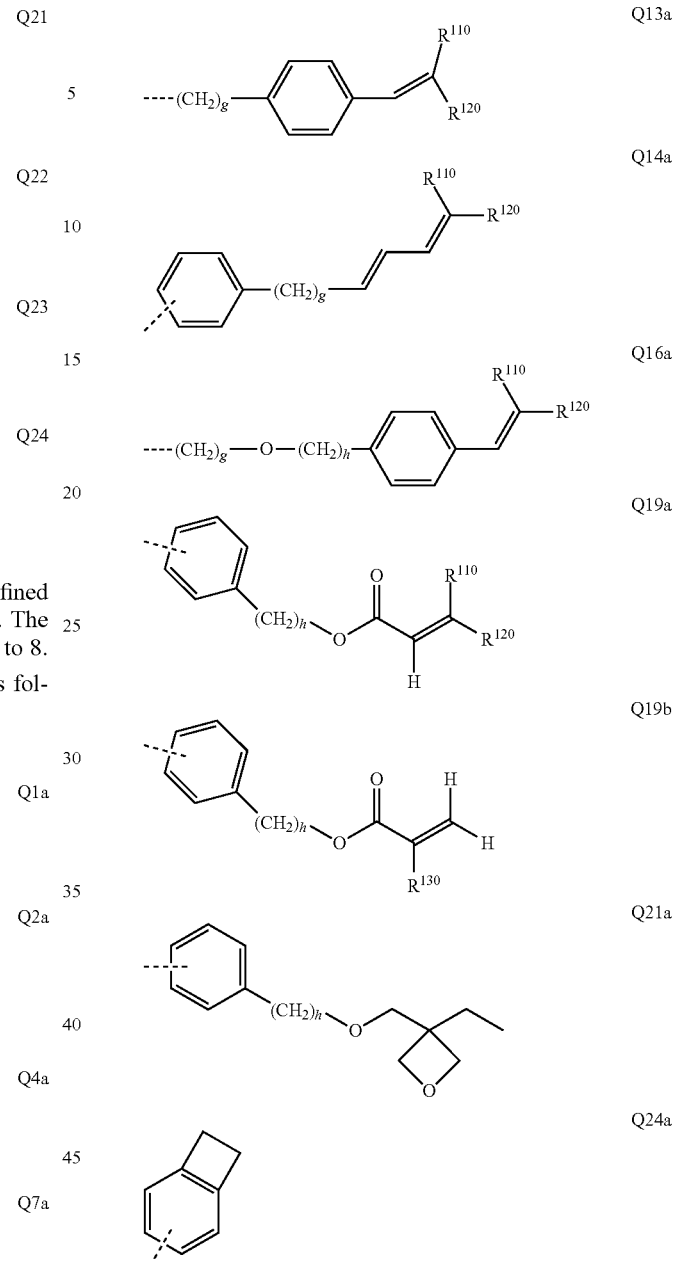

The indices used are defined as follows: g=0 to 8; and h=1 to 8.

The $R^{110}$ and $R^{120}$ radicals in the formulae Q7a and Q13a to Q19a are the same or different at each instance and are H or a straight-chain or branched alkyl group having 1 to 6 carbon atoms, preferably 1 to 4 carbon atoms. More preferably, the $R^{110}$ and $R^{120}$ radicals are methyl, ethyl, n-propyl, isopropyl, n-butyl, sec-butyl or tert-butyl and most preferably methyl.

The $R^{130}$ radical in the formulae Q7b and Q19b at each instance is a straight-chain or branched alkyl group having 1 to 6 carbon atoms, preferably 1 to 4 carbon atoms. More preferably, the $R^{130}$ radical is methyl, ethyl, n-propyl, isopropyl, n-butyl, sec-butyl or tert-butyl and most preferably methyl.

Very particularly preferred crosslinkable Q groups are as follows:
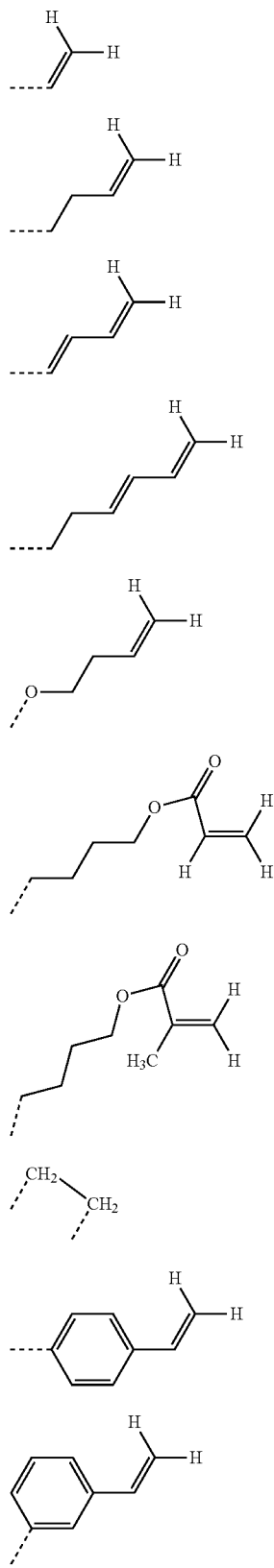

-continued

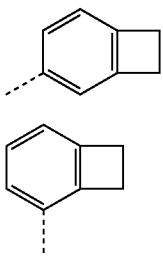

Q24b

Q24c

In the preferred Q1 to Q24 groups, in the particularly preferred Q1a to Q24a groups and in the very particularly preferred Q1b to Q24c groups, the dotted lines represent the bonds to the structural units. It should be noted in this connection that the Q12, Q12a, Q12b and Q24 groups each have two bonds to two adjacent ring carbon atoms in the structural unit. All the other crosslinkable groups have only one bond to the structural unit.

The structural unit that bears the crosslinkable Q group may, in a first embodiment, be selected from the structural units of the formula (I), (Ia), (Ib), (II), (III), (IV), (V), (VI), (VII), (VIIIa), (VIIIb), (IX), (X), (XI), (XII), (XIII), (XIV), (XV), (XVI) and/or a preferred configuration of these structural units.

A preferred structural unit that bears the crosslinkable Q group is the following structural unit, derived from the triarylamine units of group 1, of the formula (XVII):

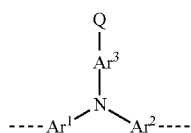

(XVII)

where $Ar^1$, $Ar^2$, $Ar^3$ and the dotted lines may be as defined above, especially in relation to formula (I), and Q is a crosslinkable group.

Examples of preferred structural units of the formula (XVII) are depicted in the following table:

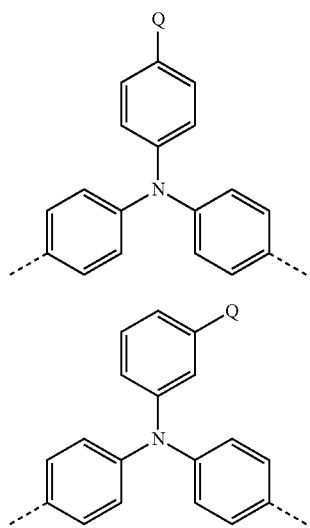

(17a)

(17b)

in which Q is a crosslinkable group and the dotted lines may be as defined above, especially in relation to formula (I).

Preferred structural units that bear the crosslinkable Q group are the following structural units, derived from the structural unit of the formula (Ia), of the formulae (XVIIIa1) to (XVIIIa3):

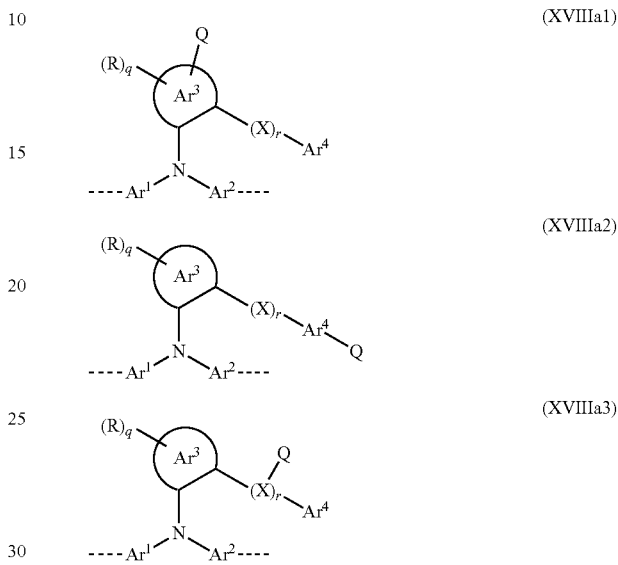

(XVIIIa1)

(XVIIIa2)

(XVIIIa3)

where $Ar^1$, $Ar^2$, $Ar^3$, $Ar^4$, R, q, r, X and r may each be as defined above, especially in relation to formula (Ia), Q is a crosslinkable group and the dotted lines may be as defined above, especially in relation to formula (I).

Examples of preferred structural units of the formula (XVIIIa) are depicted in the following table:

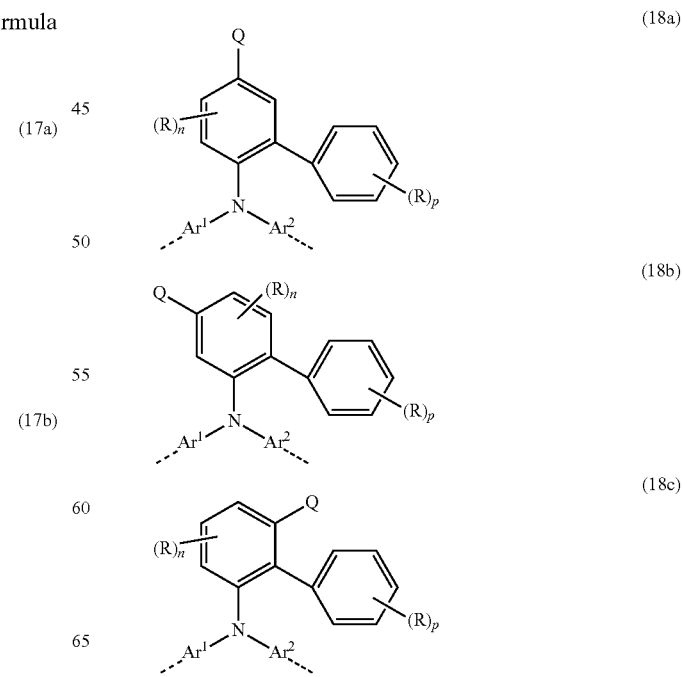

(18a)

(18b)

(18c)

-continued

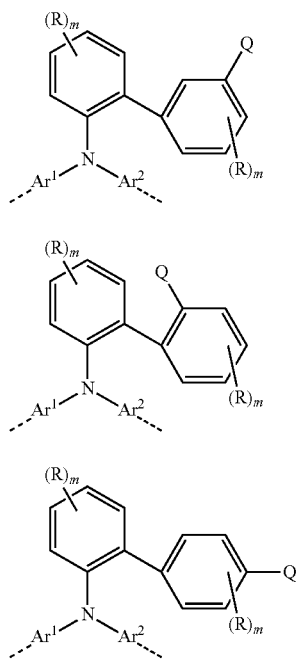

(18d)

(18e)

(18f)

where R, m, n, p and the dotted lines may be as defined above, especially in relation to formulae (I) and (Ib), and Q is a crosslinkable group.

Further preferred structural units that bear the crosslinkable Q group are the following structural units, derived from the structural unit of the formula (Ib), of the formulae (XVIIIb1) to (XVIII1b4):

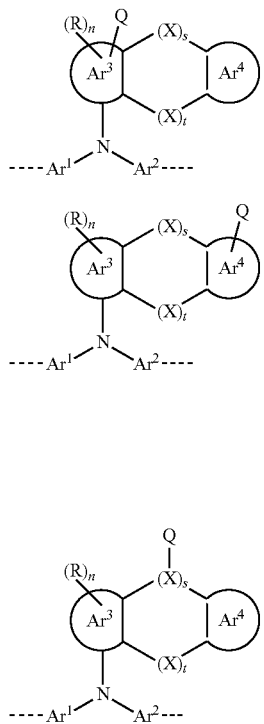

(XVIIIb1)

(XVIIIb2)

(XVIIIb3)

-continued

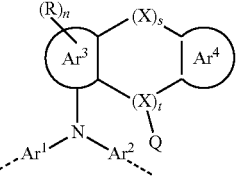

(XVIIIb4)

where $Ar^1$, $Ar^2$, $Ar^3$, $Ar^4$, R n, X, s and t may each be as defined above, especially in relation to formula (Ib).

Examples of preferred structural units of the formula (XVIIIb) are depicted in the following table:

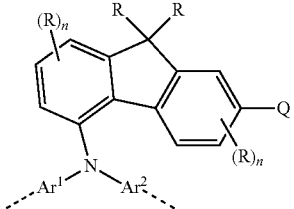

(18g)

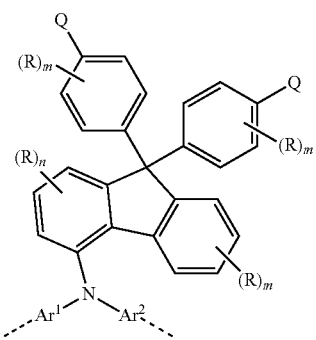

(18h)

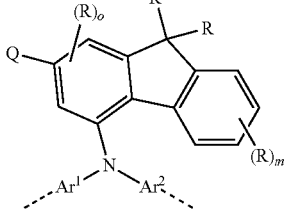

(18i)

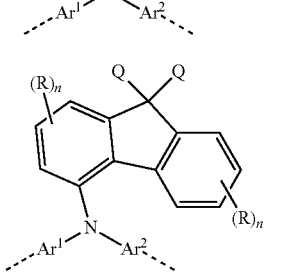

(18j)

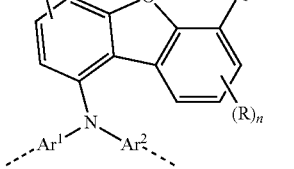

(18k)

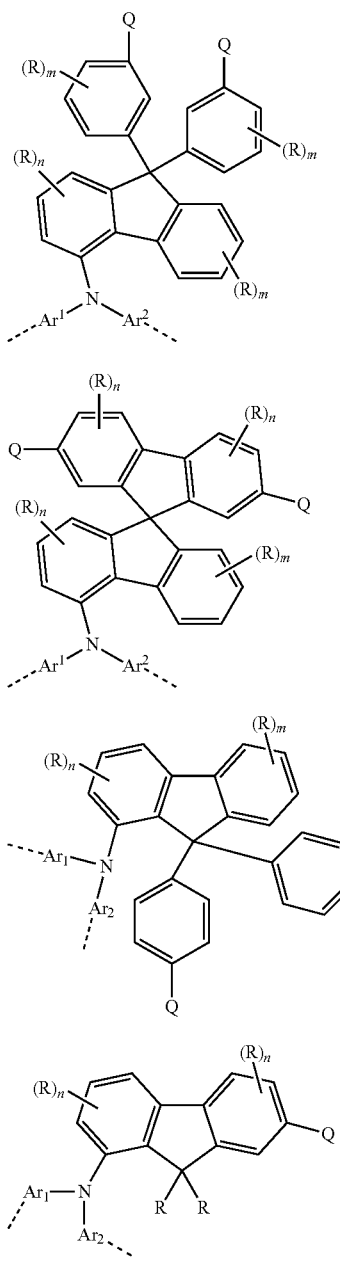

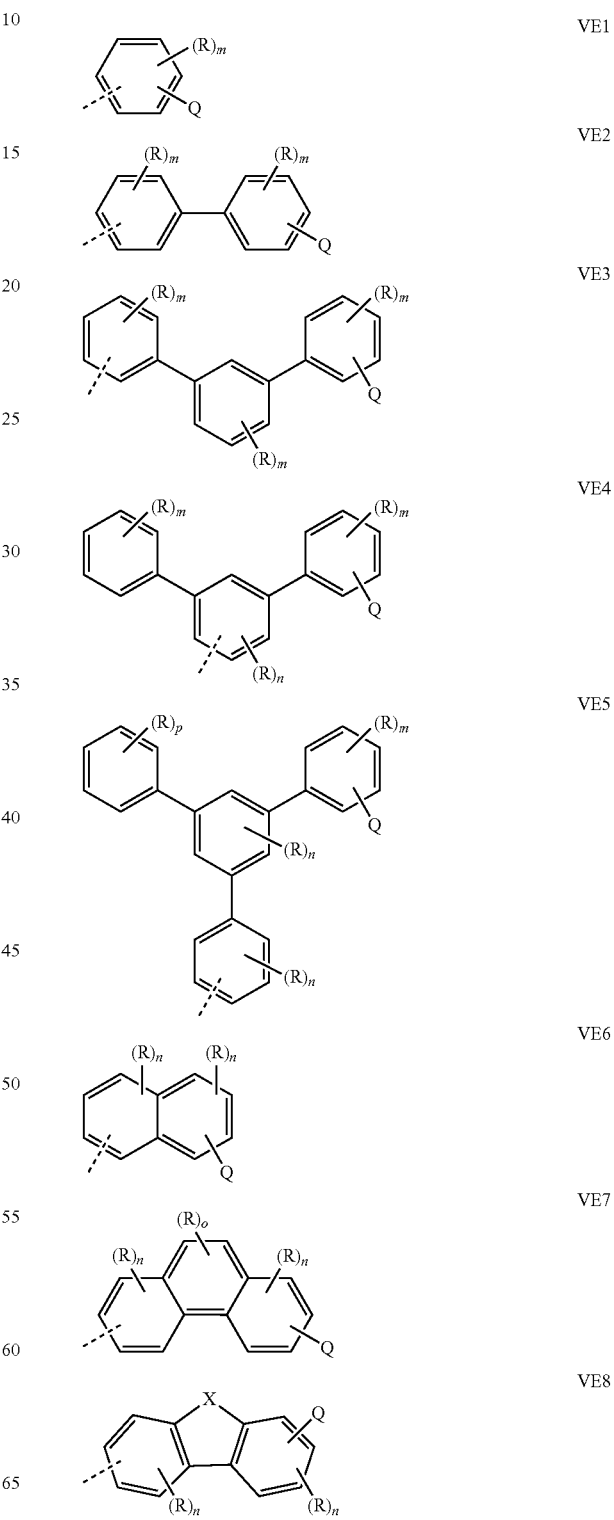

Preferred crosslinkable mono- or polycyclic, aromatic or heteroaromatic Ar³ groups in formula (I), Ar⁴ groups in formulae (Ia), (Ib), (II), (III), (IV), (V), (VI), (VII), (VIIIa), (VIIIb), (IX), (X), (XI), (XII), (XIII), (XIV), (XV) and/or (XVI); Ar⁵ and Ar⁸ groups in formulae (VIIIa) and/or (VIIIb), and the preferred embodiments thereof, are as follows:

where R, m, n and p may each be as defined above, especially in relation to formula (Ib), and o=0, 1 or 2.

In the formulae (18g) to (18o), the dotted lines represent possible bonds to the adjacent structural units in the polymer. If two dotted lines are present in the formulae, the structural unit has one or two, preferably two, bond(s) to adjacent structural units.

There follows a detailed description of the attachment of the crosslinkable Q group in relation to the attachment to Ar³, the particularly preferred embodiment. The same statements also apply to Ar⁵ and Ar⁸ in formula (VIIIa) and to Ar⁵ and Ar⁸ in formula (VIIIb).

The preferred crosslinkable Q1 to Q24 groups are preferably bonded to the preferred E1 to E12 groups of Ar³. The particularly preferred Q1a to Q24a groups are preferably bonded to the particularly preferred E1a to E12a groups of Ar³.

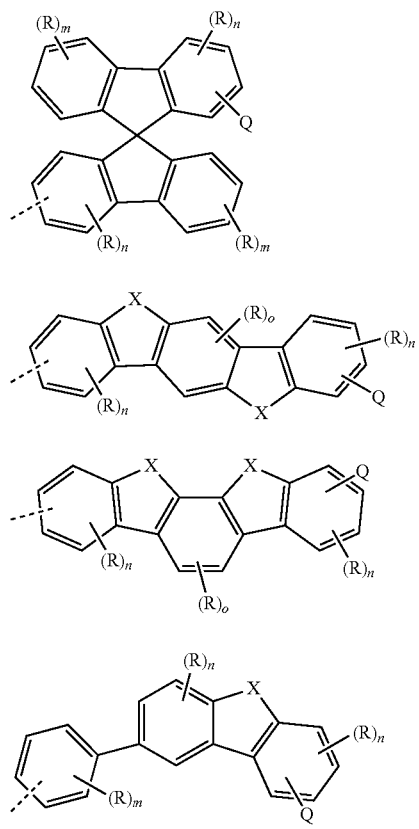

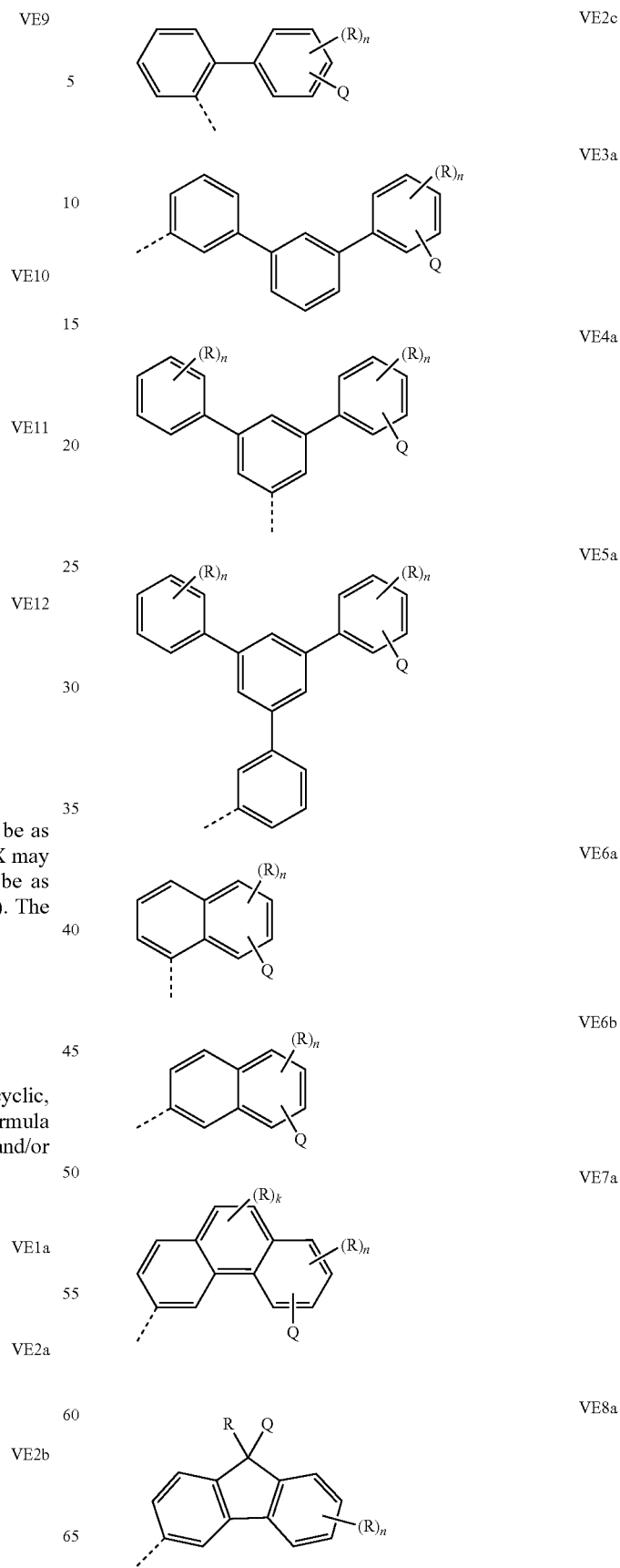

The R radicals in the formulae VE1 to VE12 may be as defined for the R radicals in the formulae (I) and (II). X may be $CR_2$, $SiR_2$, NR, O or S, where R here too may be as defined for the R radicals in the formulae (I) and (II). The indices used are defined as follows:

o=0, 1 or 2;

n=0, 1, 2 or 3;

m=0, 1, 2, 3 or 4; and p=0, 1, 2, 3, 4 or 5.

Particularly preferred crosslinkable mono- or polycyclic, aromatic or heteroaromatic $Ar^1$ and $Ar^2$ groups in formula (I), $Ar^6$, $Ar^7$ and $Ar^8$ groups in formulae (VIIIa) and/or (VIIIb) are as follows:

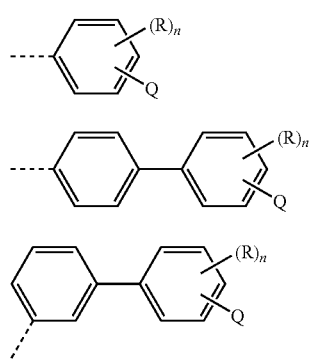

-continued

VE8b 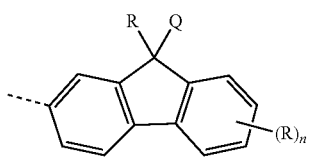

VE8c 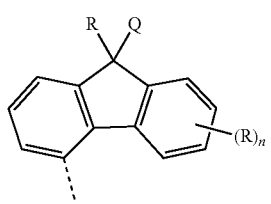

VE8d 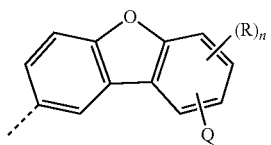

VE8e 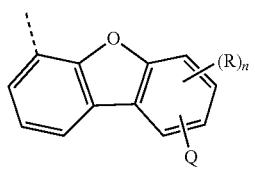

VE8f 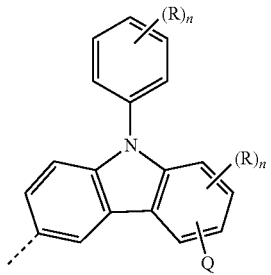

VE9a 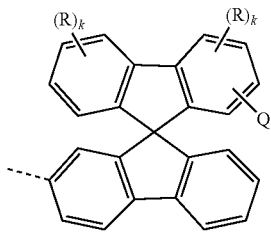

VE9b 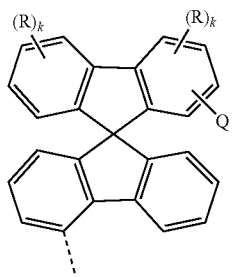

-continued

VE10a 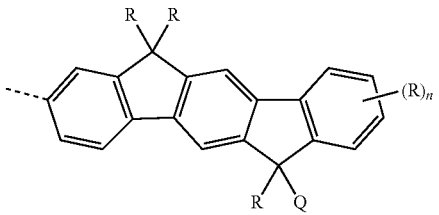

VE11a 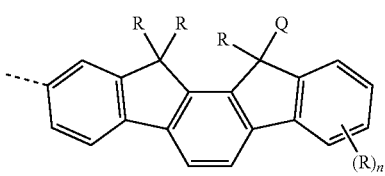

VE12a 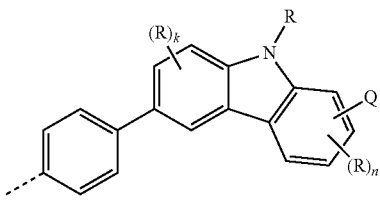

The R radicals in the formulae VE1a to VE12a may be as defined for the R radicals in the formula (I). In addition, at least one of the R radicals may also be as defined for Q, i.e. may be a further crosslinkable Q group in the Ar³ groups.

The indices used are defined as follows:
k=0 or 1; and
n=0, 1, 2 or 3.

A selection of preferred crosslinkable structural units of the formula (XVII) is listed in Table 6 below.

TABLE 6

| Formula (I) | Ar³ | Q | Ar¹ | Ar² |
|---|---|---|---|---|
| XVII 1 | VE1 | Q1 | M1 | M1 |
| XVII 2 | VE1 | Q14 | M2 | M2 |
| XVII 3 | VE1 | Q7 | M10 | M10 |
| XVII 4 | VE1 | Q2 | M12 | M12 |
| XVII 5 | VE1 | Q2 | M14 | M14 |
| XVII 6 | VE1 | Q10 | M19 | M19 |
| XVII 7 | VE2 | Q13 | M1 | M1 |
| XVII 8 | VE2 | Q24 | M2 | M1 |
| XVII 9 | VE2 | Q19 | M7 | M7 |
| XVII 10 | VE2 | Q2 | M12 | M12 |
| XVII 11 | VE2 | Q13 | M13 | M13 |
| XVII 12 | VE3 | Q1 | M1 | M1 |
| XVII 13 | VE3 | Q14 | M13 | M13 |
| XVII 14 | VE4 | Q7 | M1 | M1 |
| XVII 15 | VE4 | Q19 | M2 | M2 |
| XVII 16 | VE4 | Q24 | M14 | M14 |
| XVII 17 | VE5 | Q16 | M3 | M3 |
| XVII 18 | VE5 | Q13 | M12 | M12 |
| XVII 19 | VE6 | Q9 | M6 | M6 |
| XVII 20 | VE6 | Q16 | M10 | M10 |
| XVII 21 | VE6 | Q3 | M16 | M16 |
| XVII 22 | VE7 | Q9 | M2 | M2 |
| XVII 23 | VE7 | Q20 | M15 | M15 |
| XVII 24 | VE8 | Q13 | M1 | M1 |
| XVII 25 | VE8 | Q19 | M2 | M2 |
| XVII 26 | VE8 | Q16 | M4 | M4 |
| XVII 27 | VE8 | Q21 | M5 | M5 |
| XVII 28 | VE8 | Q2 | M10 | M10 |
| XVII 29 | VE8 | Q24 | M12 | M12 |
| XVII 30 | VE8 | Q14 | M14 | M14 |
| XVII 31 | VE9 | Q4 | M1 | M1 |
| XVII 32 | VE9 | Q21 | M8 | M8 |
| XVII 33 | VE9 | Q1 | M13 | M13 |

TABLE 6-continued

| Formula (I) | Ar³ | Q | Ar¹ | Ar² |
|---|---|---|---|---|
| XVII 34 | VE10 | Q9 | M10 | M10 |
| XVII 35 | VE11 | Q5 | M9 | M9 |
| XVII 36 | VE11 | Q9 | M17 | M17 |
| XVII 37 | VE12 | Q1 | M7 | M7 |
| XVII 38 | VE12 | Q12 | M18 | M18 |
| XVII 39 | VE1 | Q12 | M1 | M1 |

Particularly preferred crosslinkable structural units of the formula (XVII) are structural units in which $Ar^3$ is selected from the groups of the formulae VE1a to VE12a, $Ar^1$ and $Ar^2$ are selected from the groups of the formulae M1a to M17a, it being particularly preferable when $Ar^1$ and $Ar^2$ are the same, and Q is selected from the Q1a to Q24a groups.

A selection of particularly preferred crosslinkable structural units of the formula (XVII) is listed in Table 7 below.

TABLE 7

| Formula (I) | Ar³ | Q | Ar¹ | Ar² |
|---|---|---|---|---|
| XVII 1a | VE1a | Q1a | M1a | M1a |
| XVII 2a | VE1a | Q14a | M2a | M2a |
| XVII 2b | VE1a | Q14a | M2c | M2c |
| XVII 3a | VE1a | Q7a | M10a | M10a |
| XVII 4a | VE1a | Q2a | M12a | M12a |
| XVII 5a | VE1a | Q2a | M14a | M14a |
| XVII 7a | VE2a | Q13a | M1b | M1b |
| XVII 7b | VE2c | Q13b | M1a | M1a |
| XVII 8a | VE2c | Q24a | M2c | M1a |
| XVII 9a | VE2b | Q19b | M7a | M7a |
| XVII 10a | VE2a | Q2a | M12a | M12a |
| XVII 11a | VE2a | Q13a | M13a | M13a |
| XVII 12a | VE3a | Q1a | M1b | M1b |
| XVII 13a | VE3a | Q14a | M13a | M13a |
| XVII 14a | VE4a | Q7b | M1a | M1a |
| XVII 15a | VE4a | Q19a | M2a | M2a |
| XVII 15b | VE4a | Q19b | M2b | M2b |
| XVII 16a | VE4a | Q24a | M14a | M14a |
| XVII 17a | VE5a | Q16a | M3a | M3a |
| XVII 18a | VE5a | Q13a | M12a | M12a |
| XVII 19a | VE6a | Q9a | M6a | M6a |
| XVII 20a | VE6b | Q16a | M10b | M10b |
| XVII 22a | VE7a | Q9a | M2a | M2a |
| XVII 24a | VE8a | Q13a | M1a | M1a |
| XVII 24b | VE8b | Q13a | M1b | M1b |
| XVII 24c | VE8e | Q13a | M1a | M1a |
| XVII 24d | VE8f | Q13a | M1b | M1b |
| XVII 25a | VE8a | Q19b | M2c | M2c |
| XVII 25b | VE8b | Q19b | M2b | M2b |
| XVII 25c | VE8f | Q19a | M2c | M2c |
| XVII 26a | VE8c | Q16a | M4a | M4a |
| XVII 27a | VE8d | Q21a | M5a | M5a |
| XVII 28a | VE8c | Q2a | M10a | M10a |
| XVII 29a | VE8b | Q24a | M12a | M12a |
| XVII 30a | VE8e | Q14a | M14a | M14a |
| XVII 31a | VE9b | Q4a | M1a | M1a |
| XVII 32a | VE9a | Q21a | M8a | M8a |
| XVII 33a | VE9a | Q1a | M13a | M13a |
| XVII 34a | VE10a | Q9a | M10c | M10c |
| XVII 36a | VE11a | Q9a | M17a | M17a |
| XVII 37a | VE12a | Q1a | M7a | M7a |
| XVII 39a | VE1a | Q12a | M1a | M1a |

Preferred crosslinkable structural units of the formula (VIIIva)

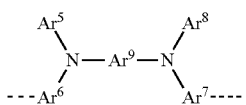

(VIIIva)

are structural units in which $Ar^5$ is selected from the groups of the formulae E1 to E12, $Ar^6$, $Ar^7$ and $Ar^9$ are the same or different and are each independently selected from the groups of the formulae M1 to M19, it being particularly preferable when $Ar^6$ and $Ar^7$ are the same, $Ar^8$ is selected from the VE1 to VE12 groups and Q is selected from the Q1 to Q24 groups.

Preferred crosslinkable structural units of the formula (VIIIvb)

(VIIIvb)

are structural units in which $Ar^5$ is selected from the groups of the formulae E1 to E12, $Ar^6$, $Ar^7$ and $Ar^9$ are the same or different and are each independently selected from the groups of the formulae M1 to M19, it being particularly preferable when $Ar^4$ and $Ar^5$ are the same, $Ar^8$ is selected from the groups of the formulae VE1 to VE12 and Q is selected from the Q1 to Q24 groups.

A selection of preferred structural units of the formula (VIIIva) or (VIIIvb) is listed in Table 8 below.

TABLE 8

| | Formula (VIIIva) | | | | | |
|---|---|---|---|---|---|---|
| | Ar⁵ | Ar⁸ | Q | Ar⁶ | Ar⁷ | Ar⁹ |
| | Formula (VIIIvb) | | | | | |
| | Ar⁵ | Ar⁸ | Q | Ar⁶ | Ar⁷ | Ar⁹ |
| IIv1 | E1 | VE1 | Q1 | M1 | M1 | M1 |
| IIv2 | E1 | VE1 | Q13 | M1 | M1 | M2 |
| IIv3 | E1 | VE1 | Q19 | M1 | M1 | M10 |
| IIv4 | E1 | VE1 | Q2 | M1 | M1 | M13 |
| IIv5 | E1 | VE1 | Q13 | M1 | M1 | M14 |
| IIv6 | E1 | VE1 | Q24 | M14 | M14 | M12 |
| IIv7 | E2 | VE2 | Q13 | M1 | M1 | M2 |
| IIv8 | E2 | VE2 | Q7 | M2 | M2 | M12 |
| IIv9 | E3 | VE3 | Q4 | M7 | M7 | M1 |
| IIv10 | E3 | VE3 | Q22 | M10 | M10 | M16 |
| IIv11 | E4 | VE4 | Q4 | M1 | M1 | M7 |
| IIv12 | E4 | VE4 | Q1 | M1 | M1 | M12 |
| IIv13 | E4 | VE4 | Q14 | M2 | M2 | M14 |
| IIv14 | E4 | VE4 | Q24 | M10 | M10 | M13 |
| IIv15 | E4 | VE8 | Q19 | M1 | M1 | M7 |
| IIv16 | E5 | VE5 | Q14 | M2 | M13 | M13 |
| IIv17 | E6 | VE6 | Q21 | M3 | M3 | M6 |
| IIv18 | E6 | VE6 | Q16 | M17 | M17 | M10 |
| IIv19 | E7 | VE7 | Q9 | M5 | M5 | M4 |
| IIv20 | E8 | VE8 | Q14 | M1 | M1 | M1 |
| IIv21 | E8 | VE8 | Q19 | M1 | M1 | M2 |
| IIv22 | E8 | VE8 | Q1 | M1 | M1 | M12 |
| IIv23 | E8 | VE8 | Q9 | M2 | M2 | M10 |
| IIv24 | E8 | VE8 | Q21 | M6 | M6 | M8 |
| IIv25 | E8 | VE8 | Q7 | M10 | M10 | M7 |
| IIv26 | E8 | VE8 | Q13 | M13 | M13 | M2 |
| IIv27 | E8 | VE8 | Q7 | M14 | M14 | M12 |
| IIv28 | E9 | VE9 | Q24 | M1 | M1 | M2 |
| IIv29 | E9 | VE9 | Q22 | M9 | M9 | M11 |
| IIv30 | E9 | VE9 | Q12 | M19 | M19 | M18 |
| IIv31 | E10 | VE10 | Q9 | M1 | M1 | M4 |
| IIv32 | E11 | VE11 | Q16 | M2 | M2 | M10 |
| IIv33 | E11 | VE11 | Q8 | M13 | M13 | M15 |
| IIv34 | E12 | VE12 | Q14 | M7 | M7 | M14 |
| IIv35 | E1 | VE1 | Q12 | M1 | M1 | M2 |
| IIv36 | E2 | VE2 | Q1 | M1 | M1 | M14 |

Particularly preferred structural units of the formula (VIIIva) are structural units in which $Ar^5$ is selected from the groups of the formulae E1a to E12a, $Ar^6$, $Ar^7$ and $Ar^9$ are the same or different and are each independently selected from the groups of the formulae M1a to M17a, it being particularly preferable when $Ar^6$ and $Ar^7$ are the same, $Ar^8$ is selected from the groups of the formulae VE1a to VE12a and Q is selected from the Q1a to Q24a groups.

Particularly preferred structural units of the formula (VIIIvb) are structural units in which $Ar^5$ is selected from the groups of the formulae E1a to E12a, $Ar^6$, $Ar^7$ and $Ar^9$ are the same or different and are each independently selected from the groups of the formulae M1a to M17a, it being particularly preferable when $Ar^6$ and $Ar^7$ are the same, $Ar^8$ is selected from the groups of the formulae VE1a to VE12a and Q is selected from the Q1a to Q24a groups.

A selection of particularly preferred structural units of the formula (VIIIva) or (VIIIvb) is listed in Table 9 below.

TABLE 9

| Formula (VIIIa) | | | | | |
|---|---|---|---|---|---|
| $Ar^5$ | $Ar^8$ | Q | $Ar^6$ | $Ar^7$ | $Ar^9$ |
| Formula (VIIIb) | | | | | |
| $Ar^5$ | $Ar^8$ | Q | $Ar^6$ | $Ar^7$ | $Ar^9$ |
| IIv1a | E1a | VE1a | Q1a | M1a | M1a | M1a |
| IIv1b | E1a | VE1a | Q1a | M1b | M1b | M1b |
| IIv2a | E1a | VE1a | Q13a | M1a | M1a | M2a |
| IIv3a | E1a | VE1a | Q19b | M1a | M1a | M10a |
| IIv4a | E1a | VE1a | Q2a | M1a | M1a | M13a |
| IIv4b | E1a | VE1a | Q2a | M1b | M1b | M13a |
| IIv5a | E1a | VE1a | Q13a | M1a | M1a | M14a |
| IIv6a | E1a | VE1a | Q24a | M14a | M14a | M12a |
| IIv7a | E2a | VE2a | Q13a | M1a | M1a | M2a |
| IIv7b | E2c | VE2c | Q13a | M1a | M1a | M2a |
| IIv8a | E2b | VE2b | Q7b | M2b | M2b | M12a |
| IIv9a | E3a | VE3a | Q4a | M7a | M7a | M1b |
| IIv11a | E4a | VE4a | Q4a | M1b | M1b | M7a |
| IIv12a | E4a | VE4a | Q1a | M1b | M1b | M12a |
| IIv13a | E4a | VE4a | Q14a | M2b | M2b | M14a |
| IIv14a | E4a | VE4a | Q24a | M10a | M10a | M13a |
| IIv15a | E4a | VE8a | Q19b | M1b | M1b | M7a |
| IIv16a | E5a | VE5a | Q14a | M2c | M13a | M13a |
| IIv17a | E6a | VE6a | Q21a | M3a | M3a | M6a |
| IIv18a | E6b | VE6b | Q16a | M17a | M17a | M10b |
| IIv19a | E7a | VE7a | Q9a | M5a | M5a | M4a |
| IIv20a | E8f | VE8f | Q14a | M1a | M1a | M1a |
| IIv21a | E8b | VE8b | Q19a | M1a | M1a | M2a |
| IIv21b | E8e | VE8e | Q19b | M1a | M1a | M2a |
| IIv22a | E8b | VE8b | Q1a | M1b | M1b | M12a |
| IIv23a | E8b | VE8d | Q9a | M2b | M2b | M10c |
| IIv24a | E8f | VE8f | Q21a | M6a | M6a | M8a |
| IIv25a | E8a | VE8a | Q7a | M10a | M10a | M7a |
| IIv26a | E8c | VE8c | Q13a | M13a | M13a | M2c |
| IIv27a | E8b | VE8b | Q7a | M14a | M14a | M12a |
| IIv28a | E9a | VE9a | Q24a | M1a | M1a | M2a |
| IIv28b | E9b | VE9b | Q24a | M1a | M1a | M2a |
| IIv31a | E10a | VE10a | Q9a | M1b | M1b | M4a |
| IIv32a | E11a | VE11a | Q16a | M2c | M2c | M10c |
| IIv34a | E12a | VE12a | Q14a | M7a | M7a | M14a |
| IIv35a | E1a | VE1a | Q12a | M1a | M1a | M2a |
| IIv36a | E2a | VE2a | Q1a | M1a | M1a | M14a |

The proportion of structural units of the formulae (I), (Ia), (Ib), (II), (III), (IV), (V), (VI), (VII), (VIIIa), (VIIIb), (IX), (X), (XI), (XII), (XIII), (XIV), (XV) and/or (XVI) in the polymer is in the range from 1 to 100 mol %, preferably in the range from 25 to 100 mol %, more preferably in the range from 50 to 95 mol %, based on 100 mol % of all copolymerized monomers present as structural units in the polymer.

In a first preferred embodiment, the inventive polymer contains only one structural unit of the formula (I), (Ia), (Ib), (II), (III), (IV), (V), (VI), (VII), (VIIIa), (VIIIb), (IX), (X), (XI), (XII), (XIII), (XIV), (XV) or (XVI), i.e. the proportion thereof in the polymer is 100 mol %. In this case, the inventive polymer is a homopolymer.

In a second preferred embodiment, the proportion of structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI) in the polymer is in the range from 50 to 95 mol %, more preferably in the range from 60 to 95 mol %, based on 100 mol % of all the copolymerizable monomers present as structural units in the polymer, i.e. the inventive polymer has, as well as one or more structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI), further structural units other than the structural units of the formulae (I), (Ia), (Ib), (II), (III), (IV), (V), (VI), (VII), (VIIIa), (VIIIb), (IX), (X), (XI), (XII), (XIII), (XIV), (XV) and/or (XVI).

In a third preferred embodiment, the proportion of structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI) in the polymer is in the range from 5 to 50 mol %, more preferably in the range from 25 to 50 mol %, based on 100 mol % of all the copolymerizable monomers present as structural units in the polymer, i.e. the inventive polymer has, as well as one or more units of the formula (I), (Ia), (Ib), (II), (III), (IV), (V), (VI), (VII), (VIIIa), (VIIIb), (IX), (X), (XI), (XII), (XIII), (XIV), (XV) and/or (XVI), further structural units other than the structural units of the formulae (I), (Ia), (Ib), (II), (III), (IV), (V), (VI), (VII), (VIIIa), (VIIIb), (IX), (X), (XI), (XII), (XIII), (XIV), (XV) and/or (XVI).

The proportion of crosslinkable structural units in the polymer may preferably be in the range from 0.01 to 50 mol %, preferably in the range from 0.1 to 30 mol %, more preferably in the range from 0.5 to 25 mol % and most preferably in the range from 1 to 20 mol %, based on 100 mol % of all the copolymerized monomers present as structural units in the polymer.

These structural units that are different from the structural units of the formulae (I), (Ia), (Ib), (II), (III), (IV), (V), (VI), (VII), (VIIIa), (VIIIb), (IX), (X), (XI), (XII), (XIII), (XIV), (XV) and/or (XVI) include those as disclosed and listed comprehensively in WO 02/077060 A1 and in WO 2005/014689 A2. These are considered to form part of the present invention by reference.

Preferably, the polymer may contain at least one further structural unit of the following formula (XIX) other than the structural units of the formulae (I), (Ia), (Ib), (II), (III), (IV), (V), (VI), (VII), (VIIIa), (VIIIb), (IX), (X), (XI), (XII), (XIII), (XIV), (XV) and/or (XVI):

$$—Ar^{11}— \quad (XIX)$$

where $Ar^{11}$ is a mono- or polycyclic, aromatic or heteroaromatic ring system which may be substituted by one or more R radicals, where R may be as defined in formula (I).

Preferred structural units of the following formula (XIX) are structural units in which $Ar^{11}$ is selected from the groups of the formulae M1 to M23, as listed in Table 10 below.

TABLE 10

| Formula (XIX) | $Ar^{11}$ |
|---|---|
| XIX1 | M1 |
| XIX2 | M2 |
| XIX3 | M3 |
| XIX4 | M4 |

TABLE 10-continued

| Formula (XIX) | Ar$^{11}$ |
|---|---|
| XIX5 | M5 |
| XIX6 | M6 |
| XIX7 | M7 |
| XIX8 | M8 |
| XIX9 | M9 |
| XIX10 | M10 |
| XIX11 | M11 |
| XIX12 | M12 |
| XIX13 | M13 |
| XIX14 | M14 |
| XIX15 | M15 |
| XIX16 | M16 |
| XIX17 | M17 |
| XIX18 | M18 |
| XIX19 | M19 |
| XIX20 | M20 |
| XIX21 | M21 |
| XIX22 | M22 |
| XIX23 | M23 |

Particularly preferred structural units of the formula (XIX) are structural units in which Ar$^{11}$ is selected from the groups of the formulae M1a to M23a, as listed in Table 11 below.

TABLE 11

| Formula (XIX) | Ar$^{11}$ |
|---|---|
| XIX1a | M1a |
| XIX1b | M1b |
| XIX2a | M2a |
| XIX2b | M2b |
| XIX2c | M2c |
| XIX3a | M3a |
| XIX4a | M4a |
| XIX5a | M5a |
| XIX6a | M6a |
| XIX7a | M7a |
| XIX8a | M8a |
| XIX10a | M10a |
| XIX10b | M10b |
| XIX10c | M10c |
| XIX12a | M12a |
| XIX13a | M13a |
| XIX14a | M14a |
| XIX17a | M17a |
| XIX20a | M20a |
| XIX20b | M20b |
| XIX20c | M20c |
| XIX21a | M21a |
| XIX21b | M21b |
| XIX22a | M22a |
| XIX22b | M22b |
| XIX23a | M23a |
| XIX23b | M23b |

The further structural units may come, for example, from the following classes:

Group 1: units which influence the hole injection and/or hole transport properties of the polymers;
Group 2: units which influence the electron injection and/or electron transport properties of the polymers;
Group 3: units having combinations of individual units of group 1 and group 2;
Group 4: units which alter the emission characteristics in such a way that electrophosphorescence rather than electrofluorescence is obtainable;
Group 5: units which improve the transition from the singlet to the triplet state;
Group 6: units which affect the emission colour of the resulting polymers;
Group 7: units which are typically used as polymer backbone;
Group 8: units which affect the film morphology and/or the rheological properties of the resulting polymers.

Preferred inventive polymers are those in which at least one structural unit has charge transport properties, i.e. those which contain the units from groups 1 and/or 2.

Structural units from group 1 having hole injection and/or hole transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiine, carbazole, azulene, thiophene, pyrrole and furan derivatives and further O-, S- or N-containing heterocycles.

Preferred structural units from group 1 are the structural units of the following formulae (1a) to (1q):

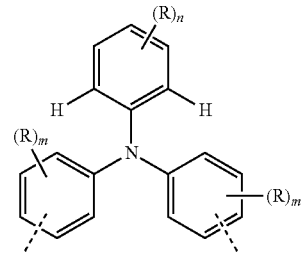

(1a)

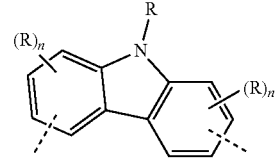

(1b)

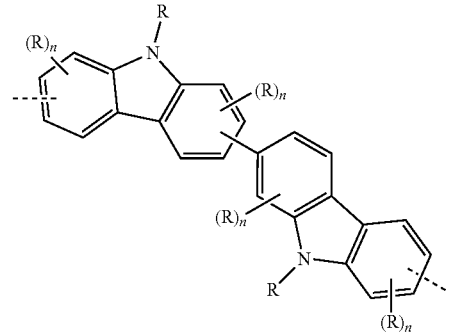

(1c)

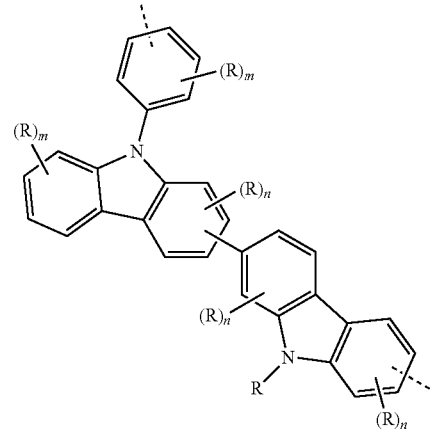

(1d)

(1e) 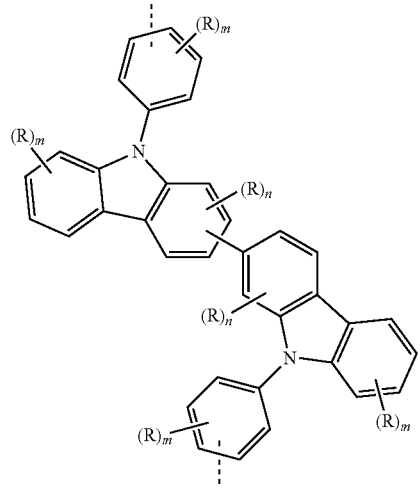
(1f) 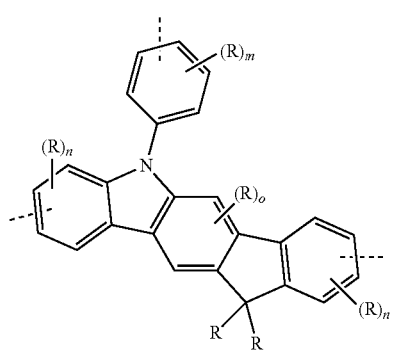
(1g) 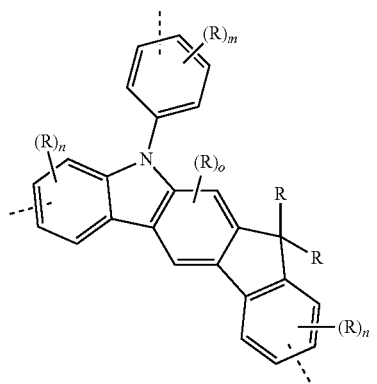
(1h) 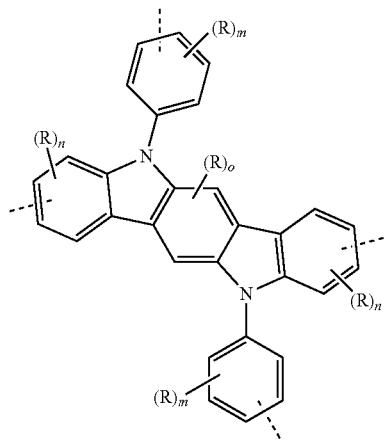
(1i) 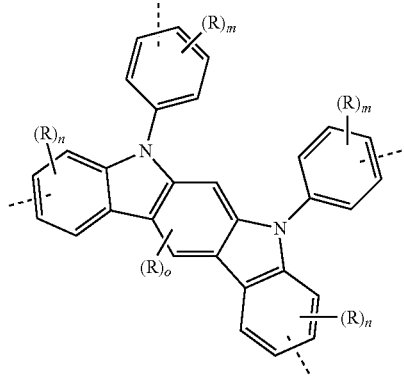
(1j) 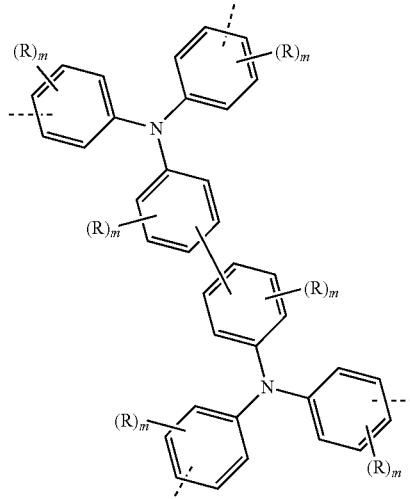
(1k) 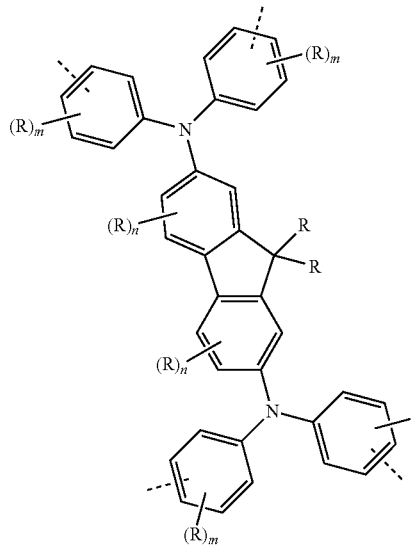

(1m)

(1n)

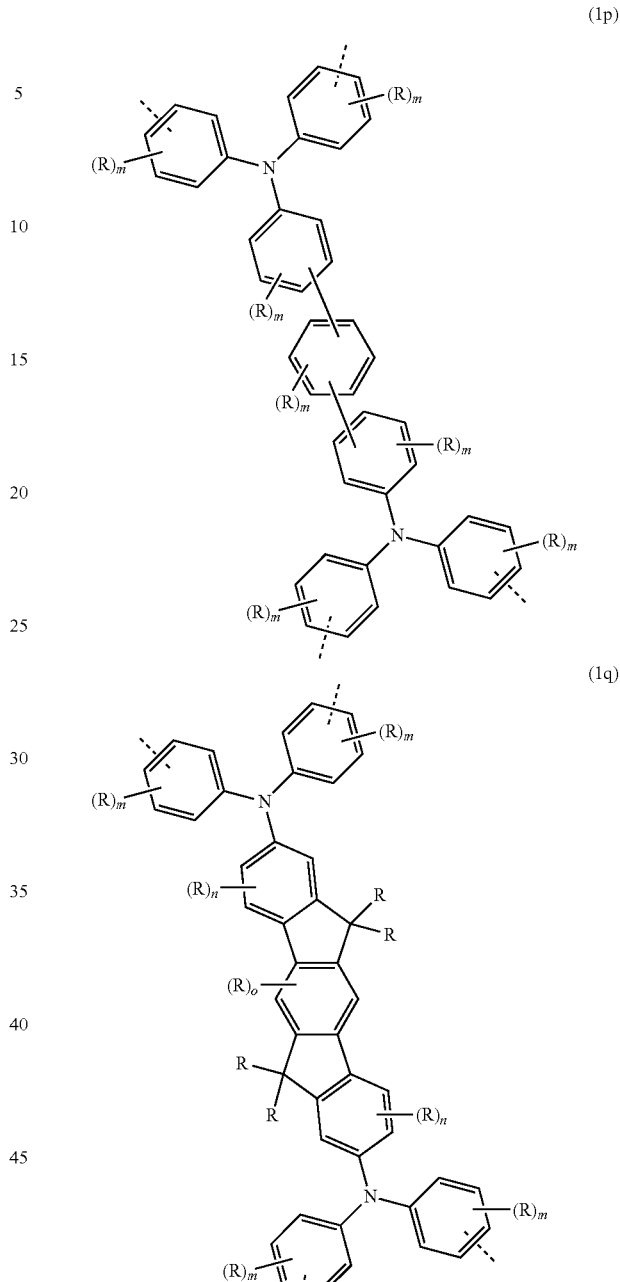

(1p)

(1q)

where R, m, n and o may each be as defined above.

In the formulae (1a) to (1q), the dotted lines represent possible bonds to the adjacent structural units in the polymer. If two dotted lines are present in the formulae, the structural unit has one or two, preferably two, bond(s) to adjacent structural units. If three dotted lines are present in the formulae, the structural unit has one, two or three, preferably two, bond(s) to adjacent structural units. If four dotted lines are present in the formulae, the structural unit has one, two, three or four, preferably two, bond(s) to adjacent structural units. They may independently be arranged, identically or differently, in the ortho, meta or para positions.

Structural units from group 2 having electron injection and/or electron transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles.

It may be preferable when the inventive polymers contain units from group 3 in which structures which increase hole mobility and which increase electron mobility (i.e. units from group 1 and 2) are bonded directly to one another, or structures which increase both hole mobility and electron mobility are present. Some of these units may serve as emitters and shift the emission colour into the green, yellow or red. The use thereof is thus suitable, for example, for the creation of other emission colours from originally blue-emitting polymers.

Structural units of group 4 are those which can emit light with high efficiency from the triplet state even at room temperature, i.e. exhibit electrophosphorescence rather than electrofluorescence, which frequently brings about an increase in energy efficiency. Suitable for this purpose, first of all, are compounds containing heavy atoms having an atomic number of more than 36. Preferred compounds are those which contain d or f transition metals, which fulfil the abovementioned condition. Particular preference is given here to corresponding structural units containing elements of groups 8 to 10 (Ru, Os, Rh, Ir, Pd, Pt). Useful structural units here for the polymers usable in accordance with the invention include, for example, various complexes as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units of group 5 are those which improve the transition from the singlet to the triplet state and which, used in association with the structural elements of group 4, improve the phosphorescence properties of these structural elements. Useful units for this purpose are especially carbazole and bridged carbazole dimer units, as described, for example, in WO 2004/070772 A2 and WO 2004/113468 A1. Additionally useful for this purpose are ketones, phosphine oxides, sulphoxides, sulphones, silane derivatives and similar compounds, as described, for example, in WO 2005/040302 A1.

Structural units of group 6 are, as well as those mentioned above, those which include at least one further aromatic structure or another conjugated structure which are not among the abovementioned groups, i.e. which have only little effect on the charge carrier mobilities, which are not organometallic complexes or which have no effect on the singlet-triplet transition. Structural elements of this kind can affect the emission colour of the resulting polymers. According to the unit, they can therefore also be used as emitters. Preference is given to aromatic structures having 6 to 40 carbon atoms or else tolane, stilbene or bisstyrylarylene derivatives which may each be substituted by one or more R radicals. Particular preference is given to the incorporation of 1,4- or 9,10-anthrylene, 1,6-, 2,7- or 4,9-pyrenylene, 3,9- or 3,10-perylenylene, 4,4'-tolanylene, 4,4'-stilbenylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives which are preferably substituted, or preferably conjugated push-pull systems (systems substituted by donor and acceptor substituents) or systems such as squarines or quinacridones which are preferably substituted.

Structural units of group 7 are units including aromatic structures having 6 to 40 carbon atoms, which are typically used as the polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzooxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2"-, 3,3"- or 4,4"-terphenylylene, 2,2'-, 3,3'- or 4,4'-bi-1,1'-naphthylylene or 2,2'''-, 3,3'''- or 4,4'''-quaterphenylylene derivatives.

Preferred structural units from group 7 are the structural units of the following formulae (7a) to (7o):

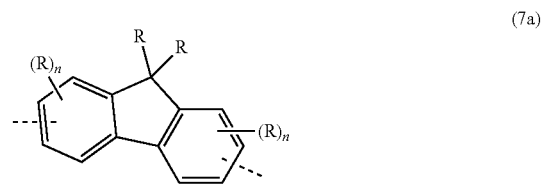

(7a)

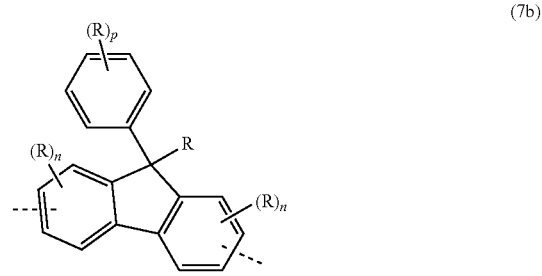

(7b)

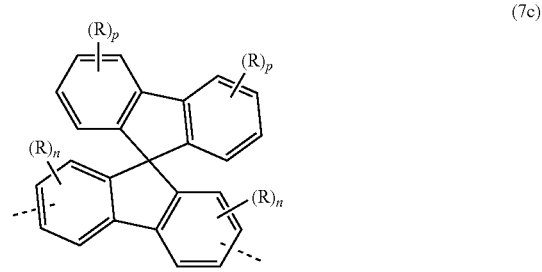

(7c)

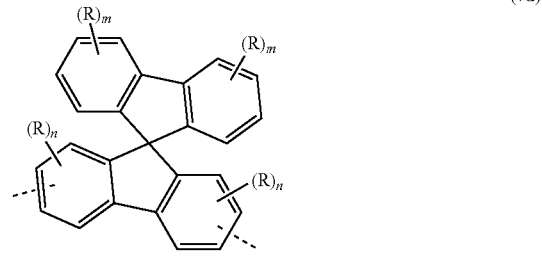

(7d)

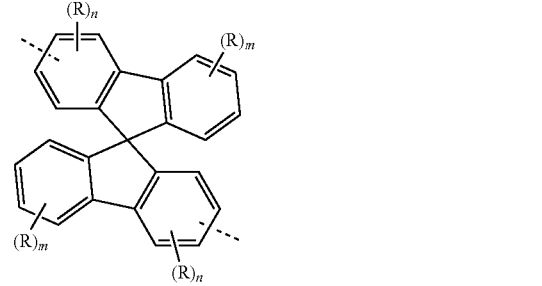

(7e)

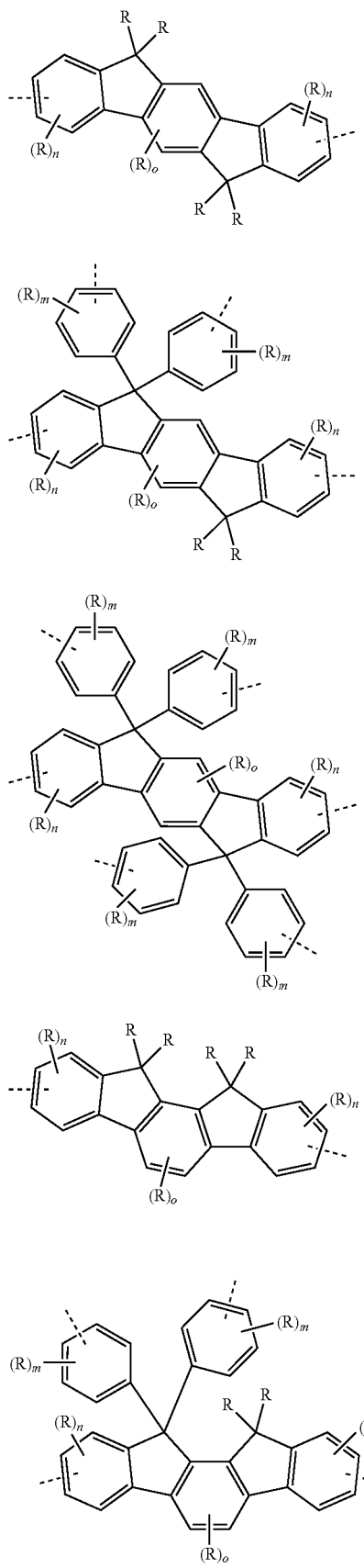

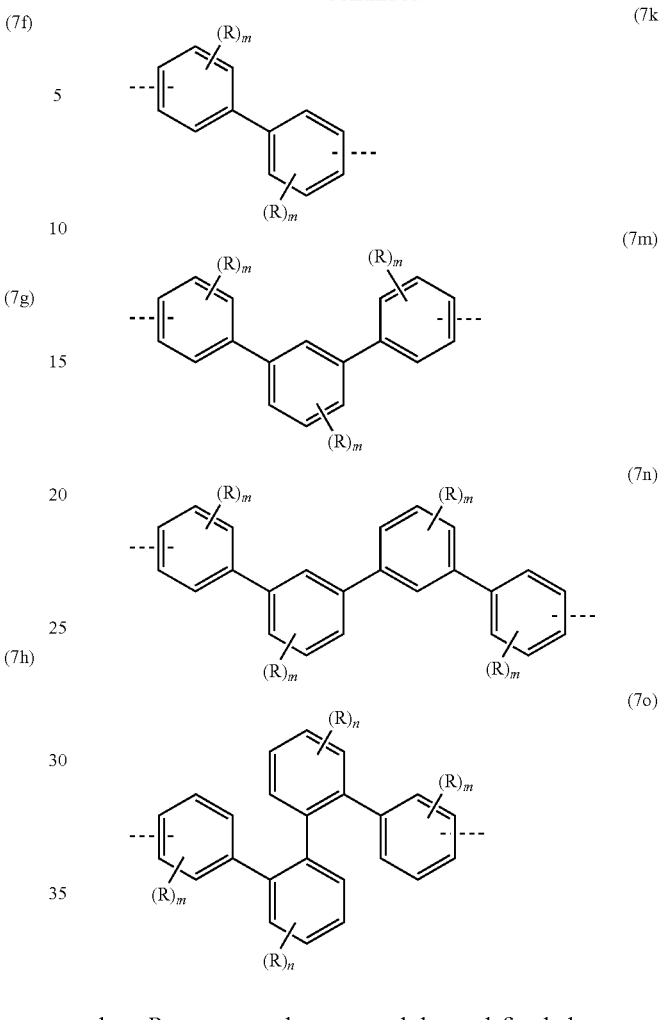

where R, m, n, o and p may each be as defined above.

In the formulae (7a) to (7o), the dotted lines represent possible bonds to the adjacent structural units in the polymer. If two dotted lines are present in the formulae, the structural unit has one or two, preferably two, bond(s) to adjacent structural units. If four or more dotted lines are present in the formulae (Formulae (7g), (7h) and (7j)), the structural units have one, two, three or four, preferably two, bond(s) to adjacent structural units. They may independently be arranged, identically or differently, in the ortho, meta or para positions.

Structural units of group 8 are those which affect the film morphology and/or the rheological properties of the polymers, for example siloxanes, alkyl chains or fluorinated groups, but also particularly stiff or flexible units, liquid crystal-forming units or crosslinkable groups.

Preference is given to inventive polymers which simultaneously, as well as structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI), additionally contain one or more units selected from groups 1 to 8. It may likewise be preferable when more than one further structural unit from one group is simultaneously present.

Preference is given here to inventive polymers which, as well as at least one structural unit of the formula (I), (Ia), (Ib), (II), (III), (IV), (V), (VI), (VII), (VIIIa), (VIIIb), (IX), (X), (XI), (XII), (XIII), (XIV), (XV) and/or (XVI), also contain units from group 7.

It is likewise preferable when the polymers usable in accordance with the invention contain units which improve charge transport or charge injection, i.e. units from group 1 and/or 2.

It is additionally particularly preferable when the polymers usable in accordance with the invention contain structural units from group 7 and units from group 1 and/or 2.

The polymers usable in accordance with the invention are either homopolymers of structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI) or copolymers. The polymers usable in accordance with the invention may be linear or branched, preferably linear. Inventive copolymers may, as well as one or more structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI), potentially contain one or more further structural units from the above-detailed groups 1 to 8.

The inventive copolymers may have random, alternating or block structures, or else have two or more of these structures in alternation. More preferably, the inventive copolymers have random or alternating structures. More preferably, the copolymers are random or alternating copolymers. The way in which copolymers having block structures are obtainable and which further structural elements are particularly preferred for the purpose is described in detail, for example, in WO 2005/014688 A2. This is incorporated into the present application by reference. It should likewise be emphasized once again at this point that the polymer may also have dendritic structures.

In a particularly preferred embodiment of the present invention, the polymers usable in accordance with the invention contain, as well as one or more structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI) where $Ar^3$ radical of formula (I) is substituted by $Ar^4$ in at least one ortho position, preferably in one of the two ortho positions, based on the position of the nitrogen atom shown in formula (I), or at least one of the $Ar^5$ and/or $Ar^8$ radical of formulae (VIIIa) and/or (VIIIb) is substituted by $Ar^4$ in at least one ortho position, preferably in one of the two ortho positions, based on the position of the nitrogen atom shown in formula (VIIIa) and/or (VIIIb), and optionally further structural units selected from the abovementioned groups 1 to 8, at least one, preferably one, structural unit having a crosslinkable Q group.

In addition, the structural unit bearing the crosslinkable Q group, in a second embodiment, may be selected from the structural units disclosed in groups 1 to 8.

A further preferred structural unit that may bear the crosslinkable Q group is the following structural unit, derived from group 7, of the formula (XX):

(XX)

where $Ar^1$ may be as defined in relation to the structural unit of the formula (I).

Examples of preferred structural units of the formula (XX) are depicted in the following table:

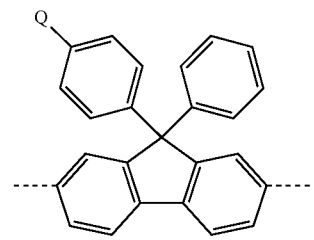

20a

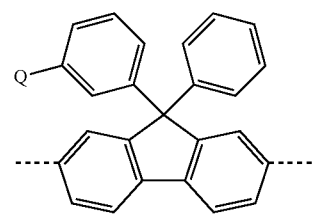

20b

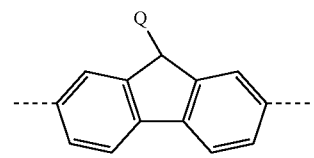

20c

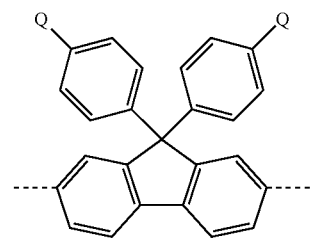

20d

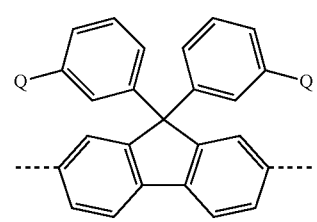

20e

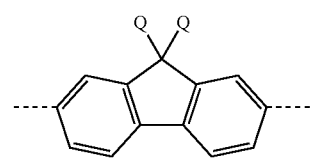

20f

The polymers usable in accordance with the invention, containing structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI), are generally prepared by polymerization of one or more monomer types, of which at least one monomer leads, in the polymer, to structural units of the formula (I), (Ia), (Ib), (II), (III), (IV), (V), (VI), (VII), (VIIIa), (VIIIb), (IX), (X), (XI), (XII), (XIII), (XIV), (XV) and/or (XVI). Suitable polymerization reactions are known to those skilled in the art and are described in the literature. Particularly suitable and preferred polymerization reactions which lead to C—C and C—N bonds are as follows:

(A) SUZUKI polymerization;
(B) YAMAMOTO polymerization;

(C) STILLE polymerization;
(D) HECK polymerization;
(E) NEGISHI polymerization;
(F) SONOGASHIRA polymerization;
(G) HIYAMA polymerization; and
(H) HARTWIG-BUCHWALD polymerization.

How the polymerization can be conducted by these methods and how the polymers can then be separated from the reaction medium and purified is known to those skilled in the art and is described in detail in the literature, for example in WO 03/048225 A2, WO 2004/037887 A2 and WO 2004/037887 A2.

The C—C couplings are preferably selected from the groups of SUZUKI coupling, YAMAMOTO coupling and STILLE coupling; the C—N coupling is preferably a coupling according to HARTWIG-BUCHWALD.

For synthesis of the polymers usable in accordance with the invention, it is possible to use the corresponding monomers of the formula (MI)

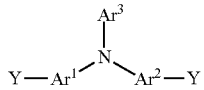

(MI)

where $Ar^1$, $Ar^2$ and $Ar^3$ may be as defined in relation to the structural unit of the formula (I).

The monomers of the formula (MI) which lead to structural units of the formula (I) in the inventive polymers are compounds which have corresponding substitution and have suitable functionalities at two positions that allow incorporation of this monomer unit into the polymer. These monomers of the formula (MI) thus likewise form part of the subject-matter of the present invention. The Y group is the same or different and is a leaving group suitable for a polymerization reaction, such that the incorporation of the monomer units into polymeric compounds is enabled. Preferably, Y is a chemical functionality which is the same or different and is selected from the class of the halogens, O-tosylates, O-triflates, O-sulphonates, boric esters, partly fluorinated silyl groups, diazonium groups and organotin compounds.

Corresponding monomers for preparation of structural units of the formulae (VIIIa) and/or (VIIIb) correspondingly arise through replacement of the dotted lines by leaving groups Y as defined for formula (MI).

The basic structure of the monomer compounds can be functionalized by standard methods, for example by Friedel-Crafts alkylation or acylation. In addition, the basic structure can be halogenated by standard organic chemistry methods. The halogenated compounds can optionally be converted further in additional functionalization steps. For example, the halogenated compounds can be used either directly or after conversion to a boronic acid derivative or an organotin derivative as starting materials for the conversion to polymers, oligomers or dendrimers.

Said methods are merely a selection from the reactions known to those skilled in the art, who are able to use these, without exercising inventive skill, to synthesize the inventive compounds.

The polymers usable in accordance with the invention can be used as a pure substance, or else as a mixture together with any further polymeric, oligomeric, dendritic or low molecular weight substances. A low molecular weight substance is understood in the present invention to mean compounds having a molecular weight in the range from 100 to 3000 g/mol, preferably 200 to 2000 g/mol. These further substances can, for example, improve the electronic properties or emit themselves. A mixture refers above and below to a mixture comprising at least one polymeric component. In this way, it is possible to produce one or more polymer layers consisting of a mixture (blend) of one or more inventive polymers having a structural unit of the formula (I), (Ia), (Ib), (II), (Ill), (IV), (V), (VI), (VII), (VIIIa), (VIIIb), (IX), (X), (XI), (XII), (XIII), (XIV), (XV) and/or (XVI) and optionally one or more further polymers with one or more low molecular weight substances.

The inventive compositions comprise at least one metal complex, where the metal complex comprises a metal atom of groups 13 to 15 and a ligand of the structure

(L-I)

in which $R^{11}$ and $R^{12}$ may independently be oxygen, sulfur, selenium, NH or $NR^{14}$ where $R^{14}$ is selected from the group comprising alkyl or aryl having preferably 1 to 40, more preferably 1 to 20 carbon atoms and most preferably 1 to 12 carbon atoms and may be bonded to $R^{13}$; and $R^{13}$ is a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C$=$CR^1$, C≡C, $Si(R^1)_2$, C=O, C=S, C=$NR^1$, P(=O)($R^1$), SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; where the $R^{13}$ radical may also form a ring system with one or both of the $R^{11}$ and $R^{12}$ radicals, where $R^1$ may assume the definition detailed above.

$R^{13}$ is a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C$=$CR^1$, C≡C, $Si(R^1)_2$, C=O, C=S, C=$NR^1$, P(=O)($R^1$), SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; where the $R^{13}$ radical may also form a ring system with one or both of the $R^{12}$ and $R^{12}$ radicals, where $R^1$ may assume the definition detailed above.

The metal complex may preferably have a p-dopant effect.

In the context of the present invention, the term "p-dopant" encompasses or means especially materials that have Lewis acidity and/or are capable of forming complexes with the matrix material in which these materials (even if only in a formal sense) have Lewis acidity.

It may preferably be the case that the $R^{13}$ radical in formula (L-I) is selected from the group comprising alkyl, long-chain alkyl, alkoxy, long-chain alkoxy, cycloalkyl, haloalkyl, aryl, arylene, halogenaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, preferably having 1 to 40 and more preferably 1 to 20 carbon atoms, where, in the case of suitable radicals, one or more nonadjacent $CH_2$ groups may independently be replaced by —O—, —S—, —NH—, —NR—, —$SiR_2$—, —CO—, —COO—, —OCO—, —OCO—O—, —$SO_2$—, —S—CO—, —S—CO—, —CR=CR— or —C≡C—, in such a way that oxygen and/or sulfur atoms are not bonded directly to one another, and are likewise optionally replaced by aryl or heteroaryl preferably containing 1 to 30 carbon atoms (terminal $CH_3$ groups are regarded as $CH_2$ groups in the sense of $CH_2$—H), where R may assume the definition detailed for formula (I).

Long-chain alkyl groups, especially with regard to the description of the $R^{11}$, $R^{12}$ and $R^{13}$ radicals of formula (L-I), preferably have 5 to 20 carbon atoms. Alkyl groups that are not given the attribute "long-chain" may especially, with regard to the description of the $R^{11}$, $R^{12}$ and $R^{13}$ radicals of formula (L-I), have preferably 1 to 10 and more preferably 1 to 4 carbon atoms. The description and definition, especially of the preferred groups detailed in the context of the formula (L-I) can be found, inter alia, in WO 2013/182389 A2, the disclosure of this document here being incorporated by reference into the description of the present application.

The term "main group metal complex of groups 13 to 15" is understood to mean the metals of groups 13 to 15 according to IUPAC, i.e. aluminum, gallium, indium, silicon, germanium, tin, lead, thallium, arsenic, antimony, bismuth or mixtures thereof. Preference is given to the metals of groups 14 and 15, i.e. silicon, germanium, tin, lead, arsenic, antimony, bismuth, more preferably tin and/or bismuth, most preferably bismuth.

In a further-preferred embodiment of the present invention, the metal atom of the metal complex for use in accordance with the invention may be selected from the group comprising bismuth, tin and mixtures thereof, particular preference being given to bismuth.

In a preferred embodiment, the metal complex is a mono- or bi- or polynuclear metal complex. More particularly, the metal complex in the solid state may be in the form of a polynuclear metal complex.

In a preferred embodiment, at least one of the ligands L is in a bridging arrangement between two metals.

In a preferred embodiment, the metal complex has the empirical formula $M_2L_4$ (with M=metal and L=ligand), where both the metals and the individual ligands may independently be selected according to the above definition.

It may also be the case that the metal complex has the structure $ML_m$ where M=metal atom, L=ligand and m=1 to 10 and, if m>1, all L are independent of one another. These metal complexes are especially preferred in the case of tin and bismuth; in this case, m is preferably m=2 for tin or 2, 4, and 3 or 5 for bismuth, according to the oxidation state.

In an alternative embodiment of the invention, the metal complex has the structure $ML_2L'_n$ with M=metal, L=ligand, as defined above, and L'=a ligand nonidentical to L, selected from the group of aryl, heteroaryl, haloaryl and haloheteroaryl, where n may be from 0 to 3 and, if n>1, each L' is selected independently of the others. These metal complexes are preferred especially in the case of tin and bismuth; in this case, n=2 for tin or 1 or 3 for bismuth, according to the oxidation state, and n=0 are preferred.

More preferably, the main group metal complex contains bismuth. Particular preference is given here to bismuth-main group metal complexes:

Of the oxidation state II, which, without being bound by theory, may have a paddle-wheel structure as a function of the ligands chosen.

Of the oxidation state III ($ML_n$=3), which, without being bound by theory, do not have a paddle-wheel structure. These compounds in the solid-state are generally in mono- to polynuclear form.

Of the oxidation state V, in which, in a particular embodiment the main group metal complex of bismuth in the V oxidation state may have the structure described in detail in WO 2013/182389 A2.

In a further configuration of the present invention, it is possible to use a metal complex in which the $R^{13}$ radical detailed in formula (L-I) has at least one substituent selected from halogen, pseudohalogen, —CN, —$NO_2$.

It is advantageously possible to use a metal complex in which the $R^{13}$ radical detailed in formula (L-I) conforms to one of the formulae ($R^{13}$-I), ($R^{13}$-II) and ($R^{13}$-III):

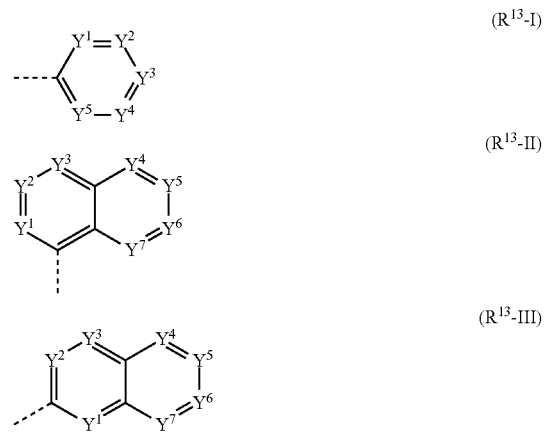

in which the $Y^1$ to $Y^7$ groups are each independently selected from the group comprising C—F, C—$CF_3$, C—$NO_2$, C—CN, C-halogen, C-pseudohalogen or N and the dotted line represents the attachment site.

In a preferred embodiment, $R^{13}$ is selected from the group comprising halogenated, preferably perhalogenated and/or pseudohalogenated pteridines, isopteridines, naphthyridines, quinoxalines, azaquinoxalines.

It may also be the case that $R^{13}$ has or consists of one or more of the following structures:

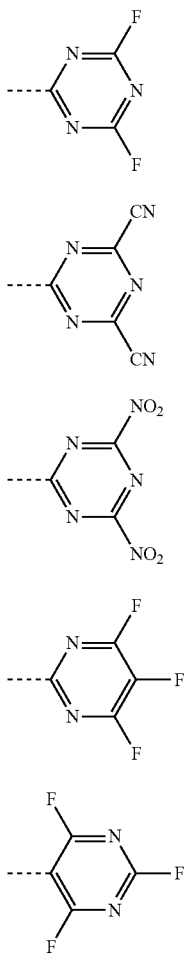

(R¹³-Ia)

(R¹³-Ib)

(R¹³-Ic)

(R¹³-Id)

(R¹³-Ie)

where the dotted line indicates the attachment site.

In a preferred embodiment, the metal complex (without the presence of matrix material) is Lewis-acidic, meaning that it acts as an electron pair acceptor. This has been found to be particularly preferable for interaction with the matrix materials.

In a preferred embodiment, the metal complex (without the presence of matrix material) has at least one unoccupied or partly accessible coordination site. This has likewise been found to be particularly preferable for interaction with the matrix materials.

In a preferred embodiment, $R^{13}$ is haloalkyl, more preferably perfluoroalkyl having 1 to 8 carbons, preferably 1 to 4 carbon atoms, haloaryl, more preferably perfluoroaryl, haloalkylaryl, more preferably (per)fluoroalkylaryl and haloheteroaryl, more preferably perfluoroheteroaryl, where these groups may preferably have 6 to 20 carbon atoms.

It may further be the case that the metal complex comprises a ligand L selected from the group of the unsubstituted, partly fluorinated and perfluorinated organic carboxylic acids.

Further ligands L cited by way of example are preferably fluorinated benzoic acids, for example 2-(trifluoromethyl) benzoic acid; 3,5-difluorobenzoic acid; 3-hydroxy-2,4,6-triiodobenzoic acid; 3-fluoro-4-methylbenzoic acid; 3-(trifluoromethoxy)benzoic acid; 4-(trifluoromethoxy)benzoic acid; 4-chloro-2,5-difluorobenzoic acid; 2-chloro-4,5-difluorobenzoic acid; 2,4,5-trifluorobenzoic acid; 2-fluorobenzoic acid; 4-fluorobenzoic acid; 2,3,4-trifluorobenzoic acid; 2,3,5-trifluorobenzoic acid; 2,3-difluorobenzoic acid; 2,4-bis(trifluoromethyl)benzoic acid; 2,4-difluorobenzoic acid; 2,5-difluorobenzoic acid; 2,6-bis(trifluoromethyl)benzoic acid; 2,6-difluorobenzoic acid; 2-chloro-6-fluorobenzoic acid; 2-fluoro-4-(trifluoromethyl)benzoic acid; 2-fluoro-5-(trifluoromethyl)benzoic acid; 2-fluoro-6-(trifluoromethyl) benzoic acid; 3,4,5-trifluorobenzoic acid; 3,4-difluorobenzoic acid; 3,5-bis(trifluoromethyl)benzoic acid; 3-(trifluoromethyl)benzoic acid; 3-chloro-4-fluorobenzoic acid; 3-fluoro-5-(trifluoromethyl)benzoic acid; 3-fluorobenzoic acid; 4-fluoro-2-(trifluoro-methyl)benzoic acid; 4-fluoro-3-(trifluoromethyl)benzoic acid; 5-fluoro-2-methylbenzoic acid; 2-(trifluoromethoxy)benzoic acid; 2,3,5-trichlorobenzoic acid; 4-(trifluoromethyl)benzoic acid; pentafluorobenzoic acid; 2,3,4,5-tetrafluorobenzoic acid, fluorinated or nonfluorinated phenylacetic acid, for example 2-fluorophenylacetic acid; 3-fluorophenylacetic acid; 4-fluorophenylacetic acid; 2,3-difluorophenylacetic acid; 2,4-difluorophenylacetic acid; 2,6-difluorophenylacetic acid; 3,4-difluorophenylacetic acid; 3,5-difluorophenylacetic acid; pentafluorophenylacetic acid; 2-chloro-6-fluorophenylacetic acid; 2-chloro-3,6-difluorophenylacetic acid; 3-chloro-2,6-difluorophenylacetic acid; 3-chloro-4-fluorophenylacetic acid; 5-chloro-2-fluorophenylacetic acid; 2,3,4-trifluorophenylacetic acid; 2,3,5-trifluorophenyl-acetic acid; 2,3,6-trifluorophenylacetic acid; 2,4,5-trifluorophenylacetic acid; 2,4,6-trifluorophenylacetic acid; 3,4,5-trifluorophenylacetic acid; 3-chloro-2-fluorophenylacetic acid; α-fluorophenylacetic acid; 4-chloro-2-fluorophenyl-acetic acid; 2-chloro-4-fluorophenylacetic acid; α,α-difluorophenylacetic acid; ethyl 2,2-difluoro-2-phenylacetate; and fluorinated or nonfluorinated acetic acid, for example methyl trifluoroacetate; allyl trifluoroacetate; ethyl trifluoroacetate; isopropyl trifluoroacetate; 2,2,2-trifluoroethyl trifluoroacetate; difluoroacetic acid; trifluoroacetic acid; methyl chlorodifluoroacetate; ethyl bromodifluoroacetate; chlorodifluoroacetic acid; ethyl chlorofluoroacetate; ethyl difluoroacetate; (3-chlorophenyl)difluoroacetic acid; (3,5-difluoro-phenyl)difluoroacetic acid; (4-butylphenyl)difluoroacetic acid; (4-tert-butyl-phenyl)difluoroacetic acid; (3,4-dimethylphenyl)difluoroacetic acid; (3-chloro-4-fluorophenyl)difluoroacetic acid; (4-chlorophenyl) difluoroacetic acid; 2-biphenyl-3',5'-difluoroacetic acid; 3-biphenyl-3',5'-difluoroacetic acid; 4-biphenyl-3',5'-difluoroacetic acid; 2-biphenyl-3',4'-difluoroacetic acid; 3-biphenyl-3',4'-difluoroacetic acid; 4-biphenyl-3',4'-difluoroacetic acid and 2,2-difluoropropionic acid or the higher homologs thereof. If the ligands L have acidic groups, the groups may be in deprotonated form in a preferred embodiment.

Particularly preferred metal complexes include $Bi(O_2CCF_3)_3$, $Bi(O_2CC_6H_2(2,3,4-F_3))_3$ and bismuth tris (pentafluorobenzoate).

The proportion of metal complex for use in accordance with the invention in a composition of the present invention may be within a wide range. Advantageously, it is possible to use a composition having a weight ratio of polymer for use in accordance with the invention to metal complex for use in accordance with the invention in the range from 1000:1 to 1:2, preferably 400:1 to 1:1, more preferably in the range from 100:1 to 3:2, most preferably in the range from 20:1 to 2:1. The proportion of metal complex for use in accordance with the invention may preferably be 0.1% to 70% by weight, more preferably 0.25% to 50% by weight, even more preferably 1% to 40% by weight and especially preferably 5% to 30% by weight, based on the sum total of polymer and metal complex. Use of a greater or lesser proportion of metal complex is possible, but the efficiency of the composition, of the functional layers obtainable therefrom or of the optoelectronic components comprising these layers decreases unexpectedly in this case. The proportion of metal complex for use in accordance with the invention may preferably be 0.1% to 70% by weight, more preferably 0.25% to 50% by weight, even more preferably 0.5% to 40% by weight and especially preferably 5% to 30% by weight, based on the weight of the composition. The proportion of polymer for use in accordance with the invention may preferably be 30% to 99.9% by weight, more preferably 50% to 99.75% by weight, even more preferably 60% to 99.5% by weight and especially preferably 70% to 95% by weight, based on the weight of the composition. The percentages by weight are based here on metal complexes or polymers having the essential features detailed above. Other metal complexes or polymers are not taken into account in these weight figures.

The present invention further provides a process for producing an inventive composition, which is characterized in that a polymer having structural units of the formula (I) is contacted with a metal complex comprising a metal atom of groups 13 to 15 and a ligand of the structure (L-I).

The way in which the metal complex is contacted with the polymer is uncritical in this context. For example, a solution of a polymer may be mixed with a solution of a metal complex. In addition, a solid polymer can be contacted with a solution of a metal complex. Also, a solid metal complex can be introduced into a polymer solution. Also, a gaseous metal complex can be deposited onto solid polymer. Preference is given to producing a solution of a polymer and a metal complex.

The present invention further provides solutions and formulations composed of one or more inventive compositions. The way in which such solutions can be prepared is known to those skilled in the art and is described, for example, in WO 02/072714 A1, WO 03/019694 A2 and the literature cited therein.

These solutions can be used in order to produce thin polymer layers, for example by surface coating methods (e.g. spin-coating) or by printing methods (e.g. inkjet printing).

Polymers containing structural units having a crosslinkable Q group are particularly suitable for producing films or coatings, especially for producing structured coatings, for example by thermal or light-induced in situ polymerization and in situ crosslinking, for example in situ UV photopolymerization or photopatterning. It is possible here to use either corresponding polymers in pure form or else formulations or mixtures of these polymers as described above. These can be used with or without addition of solvents and/or binders. Suitable materials, processes and apparatuses for the above-described methods are described, for example, in WO 2005/083812 A2. Possible binders are, for example, polystyrene, polycarbonate, poly(meth)acrylates, polyacrylates, polyvinyl butyral and similar optoelectronically neutral polymers.

Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents. Preferred solvents are especially ethers and/or esters.

The present invention thus further provides for the use of an inventive composition, comprising a polymer containing structural units having a crosslinkable Q group, for preparation of a crosslinked polymer. The crosslinkable group, which is more preferably a vinyl group or alkenyl group, is preferably incorporated into the polymer by the WITTIG reaction or a WITTIG-like reaction. If the crosslinkable group is a vinyl group or alkenyl group, the crosslinking can take place via free-radical or ionic polymerization, which can be induced thermally or by radiation. Preference is given to free-radical polymerization which is induced thermally, preferably at temperatures of less than 250° C., more preferably at temperatures of less than 230° C.

The crosslinked polymers prepared by the process according to the invention are insoluble in all standard solvents. In this way, it is possible to produce defined layer thicknesses which are not dissolved or partly dissolved again by the application of subsequent layers.

Preferably, the inventive composition can be produced prior to crosslinking of the polymer. Accordingly, for example, a polymer layer produced on a substrate or another layer can be contacted prior to crosslinking with a metal complex usable in accordance with the invention. More preferably, an inventive composition can be applied from solution to a substrate or another layer and optionally crosslinked.

The present invention thus also relates to a composition comprising a crosslinked polymer obtainable by the aforementioned process. The crosslinked polymer is—as described above—preferably produced in the form of a crosslinked polymer layer. Because of the insolubility of the crosslinked polymer in all solvents, a further layer can be applied from a solvent to the surface of such a crosslinked polymer layer by the above-described techniques.

The present invention also encompasses what are called hybrid devices in which one or more layers which are processed from solution and layers which are produced by vapour deposition of low molecular weight substances may occur.

The inventive compositions can be used in electronic or optoelectronic devices or for production thereof.

The present invention thus further provides for the use of the inventive compositions in electronic or optoelectronic devices, preferably in organic electroluminescent devices (OLEDs), organic field-effect transistors (OFETs), organic integrated circuits (O-ICs), organic thin-film transistors (TFTs), organic solar cells (O-SCs), organic laser diodes (O-laser), organic photovoltaic (OPV) elements or devices or organic photoreceptors (OPCs), more preferably in organic electroluminescent devices (OLEDs).

In the case of the aforementioned hybrid device, in conjunction with organic electroluminescent devices, reference is made to combined PLED/SMOLED (polymeric light-emitting diode/small molecule organic light-emitting diode) systems.

The way in which OLEDS can be produced is known to those skilled in the art and is described in detail, for example, as a general process in WO 2004/070772 A2, which has to be adapted appropriately to the individual case.

As described above, the inventive compositions are very particularly suitable as electroluminescent materials in OLEDs or displays produced in this way.

Electroluminescent materials in the context of the present invention are considered to mean materials which can find use as the active layer. "Active layer" means that the layer is capable of emitting light on application of an electrical field (light-emitting layer) and/or that it improves the injection and/or transport of the positive and/or negative charges (charge injection or charge transport layer).

The present invention therefore preferably also provides for the use of the inventive compositions in OLEDs, especially as electroluminescent material.

The present invention further provides electronic or optoelectronic components, preferably organic electroluminescent devices (OLEDs), organic field-effect transistors (OFETs), organic integrated circuits (O-ICs), organic thin-film transistors (TFTs), organic solar cells (O-SCs), organic laser diodes (O-laser), organic photovoltaic (OPV) elements or devices and organic photoreceptors (OPCs), more preferably organic electroluminescent devices, having one or more active layers, wherein at least one of these active layers comprises one or more inventive compositions. The active layer may, for example, be a light-emitting layer, a charge transport layer and/or a charge injection layer.

More preferably, the active layer may comprise a composition of the present invention comprising a crosslinked polymer.

In the present application text and also in the examples that follow hereinafter, the main aim is the use of the inventive compositions in relation to OLEDs and corresponding displays. In spite of this restriction of the description, it is possible for the person skilled in the art, without exercising further inventive skill, to utilize the inventive compositions as semiconductors for the further above-described uses in other electronic devices as well.

The examples which follow are intended to illustrate the invention without restricting it. More particularly, the features, properties and advantages that are described therein for the defined compounds that form the basis of the example in question are also applicable to other compounds that are not referred to in detail but are covered by the scope of protection of the claims, unless the opposite is stated elsewhere.

WORKING EXAMPLES

Part A: Synthesis of the Monomers

The monomers for production of the polymers of the inventive compositions are already described in the prior art, are commercially available or are prepared according to a literature method, and are summarized in the following table:

| Monomer | Structure | Synthesis according to |
|---|---|---|
| M1 | | WO 2010/097155 A1 |
| M2 | | WO 99/048160 A1 |

-continued
| Monomer | Structure | Synthesis according to |
|---|---|---|
| M3 | 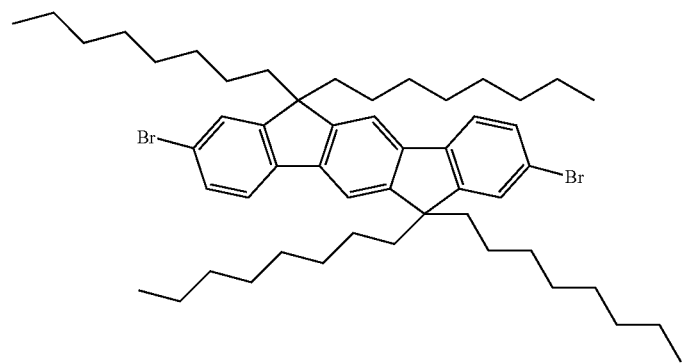 [SMILES: CCCCCCCCC1(CCCCCCCC)c2cc(Br)ccc2-c2cc3c(cc21)-c1ccc(Br)cc1C3(CCCCCCCC)CCCCCCCC] | Macromolecules 2000, 33, 2016-2020 |
| M4 | 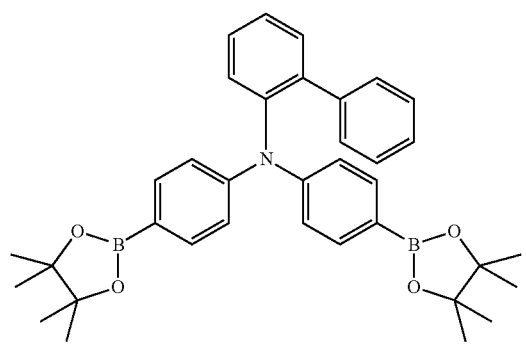 | WO 2013/156130 |
| M5 | 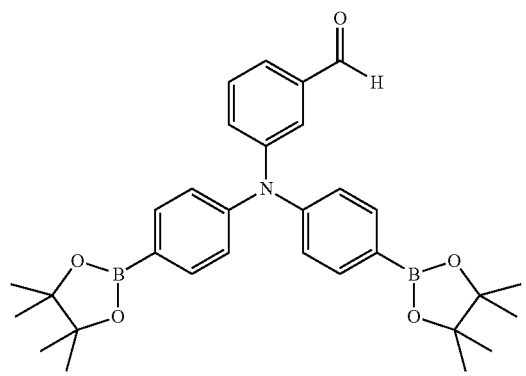 | WO 2013/156130 |

| Monomer | Structure | Synthesis according to |
|---|---|---|
| M6 | | WO 2013/156130 |
| M7 | | WO 2013/156130 (analogously to Mo14) |
| M8 | | J. Mater. Chem., 2012, 22, 7945-7953 |
| M9 | | Chem. Eur. J. 2006, 12, 4351-4361 |

Part B: Synthesis of the Polymers

The comparative polymer V1 and the inventive polymers P1 to P8 are prepared by SUZUKI coupling by the process described in WO 2010/097155 from the monomers disclosed in Part A.

The polymers V1 and P1 to P8 prepared in this way contain the structural units, after elimination of the leaving groups, in the percentages reported in Table B1 (percentages=mol %). In the case of the polymers which are prepared from monomers having aldehyde groups, the latter are converted to crosslinkable vinyl groups after the polymerization by WITTIG reaction by the process described in WO 2010/097155. The polymers listed correspondingly in Table B1 and used in Part C thus have crosslinkable vinyl groups rather than the aldehyde groups originally present.

The palladium and bromine contents of the polymers are determined by ICP-MS. The values determined are below 10 ppm.

The molecular weights Mw and the polydispersities D are determined by means of gel permeation chromatography (GPC) (model: Agilent HPLC System Series 1100, column: PL-RapidH from Polymer Laboratories; solvent: THF with 0.12% by volume of o-dichlorobenzene; detection: UV and refractive index; temperature: 40° C.). Calibration is effected with polystyrene standards.

The results are collated in Table B1.

TABLE B1

| Polymers | Monomers | | | | | | Molecular weight $M_w$ (g/mol) | Polydispersity |
|---|---|---|---|---|---|---|---|---|
| V1 | | | M8 | 50% | M9 | 50% | 315 000 | 2.8 |
| P1 | M4 | 50% | M3 | 50% | | | 339 000 | 3.1 |
| P2 | M4 | 40% | M3 | 50% | M1 | 10% | 328 000 | 2.9 |
| P3 | M4 | 50% | M6 | 50% | | | 275 000 | 3.2 |
| P4 | M4 | 40% | M6 | 50% | M1 | 10% | 123 000 | 3.3 |
| P5 | M4 | 40% | M3 | 50% | M5 | 10% | 300 000 | 2.7 |
| P6 | M4 | 40% M7 50% | M1 | 10% | | | 100 000 | 4.5 |
| P7 | | | M2 | 50% | M3 | 50% | 438 000 | 3.3 |
| P8 | | | M2 | 40% | M1 | 10% M3 50% | 417 000 | 3.1 |

Part C: Dopants

The dopant for production of the inventive compositions is already described in the prior art and is prepared according to a literature method.

| Dopant | Structure | Synthesis according to |
|---|---|---|
| D1 | [Bi—O—C(=O)—C₆F₃(F)(F)]₃ structure | WO 2013/182389 |

Part D: Device Examples

The inventive composition, composed of polymer and metal complex, can be processed from solution and leads, compared to vacuum-processed OLEDs, to much more easily producible OLEDs having properties that are nevertheless good.

Whether the crosslinkable variants of the inventive compositions (comprising crosslinkable polymers) after crosslinking give rise to a completely insoluble layer is tested analogously to WO 2010/097155.

Table D1 lists the remaining layer thickness of the original 20 nm after the washing operation described in WO 2010/097155. If there is no decrease in the layer thickness, the composition of polymer and metal complex is insoluble and hence the crosslinking is sufficient.

TABLE D1

Check of the residual layer thickness of the original 20 nm after the wash test

| Polymer | Metal complex | Mass ratio of polymer:metal complex | Residual layer thickness after wash test (in nm) Crosslinking at 220° C. |
|---|---|---|---|
| V1 | D1 | 85:15 | 3.5 |
| P2 | D1 | 85:15 | 20 |
| P4 | D1 | 85:15 | 20 |
| P6 | D1 | 85:15 | 20 |
| P8 | D1 | 85:15 | 20 |

As can be inferred from Table D1, the composition comprising comparative polymer V1 which does not bear any crosslinking group hardly crosslinks at all at 220° C. The mixtures with the inventive polymers P2, P4, P6 and P8 crosslink completely at 220° C.

There are already many descriptions of the production of such solution-based OLEDs in the literature, for example in WO 2004/037887 and WO 2010/097155. The process is matched to the circumstances described hereinafter (variation in layer thickness, materials).

The inventive polymers are used in three different layer sequences:

Structure A is as follows:
substrate,
ITO (50 nm),
hole injection layer (HIL) (200 nm),
cathode.

Structure B is as follows:
substrate,
ITO (50 nm),
HIL (20 nm),
hole transport layer (HTL) (40 nm),
emission layer (EML) (30 nm),
electron transport layer (ETL) (20 nm),
cathode.

Structure C is as follows:
substrate,
ITO (50 nm),
HIL (20 nm),
HTL (20 nm),
EML (60 nm),
hole blocker layer (HBL) (10 nm),
ETL (40 nm),
cathode.

Substrates used are glass plates coated with structured ITO (indium tin oxide) of thickness 50 nm. The hole injection, hole transport and emission layers are applied to these coated glass plates.

The hole injection layers used are the inventive compositions, composed of polymer and metal complex, and comparative mixtures, each dissolved in the solvent mixture anisole:xylene (2:1). The typical solids content of such solutions is about 8 to 35 g/l when layer thicknesses between 20 nm and 200 nm are to be achieved by means of spin-coating. The layers are spun on in an inert gas atmosphere, argon in the present case, and baked at 180° C. or 220° C. for 60 minutes.

The hole transport layers in structure C are processed from toluene. The typical solids content of such solutions is about 5 g/l when layer thicknesses of 20 nm are to be achieved by means of spin-coating. The layers are spun on in an inert gas atmosphere, argon in the present case, and baked at 180° C. or 220° C. for 60 minutes.

In structure B, the hole transport layer is formed by thermal evaporation in a vacuum chamber. The materials used in the present case are shown in Table D2.

TABLE D2

Structural formulae of the in the hole-transporting materials processed from vacuum

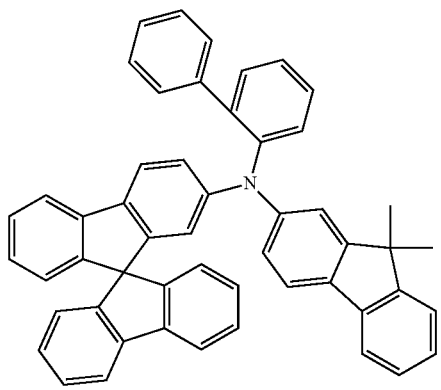 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

HT1

The emission layer is always composed of at least one matrix material (host material) and an emitting dopant (emitter). In addition, compositions composed of a plurality of matrix materials and co-dopants may occur. Details given in such a form as H1 (92%):dopant (8%) mean here that the material H1 is present in the emission layer in a proportion by weight of 92% and the dopant in a proportion by weight of 8%. The mixture for the emission layer is dissolved in toluene for structure C. The typical solids content of such solutions is about 18 g/l when, as here, the layer thickness of 60 nm which is typical of a device is to be achieved by means of spin-coating. The layers are spun on in an inert gas atmosphere, argon in the present case, and baked at 180° C. for 10 minutes. In structure B, the emission layer is formed by thermal evaporation in a vacuum chamber. This layer may consist of more than one material, the materials being added to one another by co-evaporation in a particular proportion by volume. Details given in such a form as H3:dopant (95%:5%) mean here that the H3 and dopant materials are present in the layer in a proportion by volume of 95%:5%.

The materials used in the present case are shown in Table D3.

TABLE D3

Structural formulae of the materials used in the emission layer

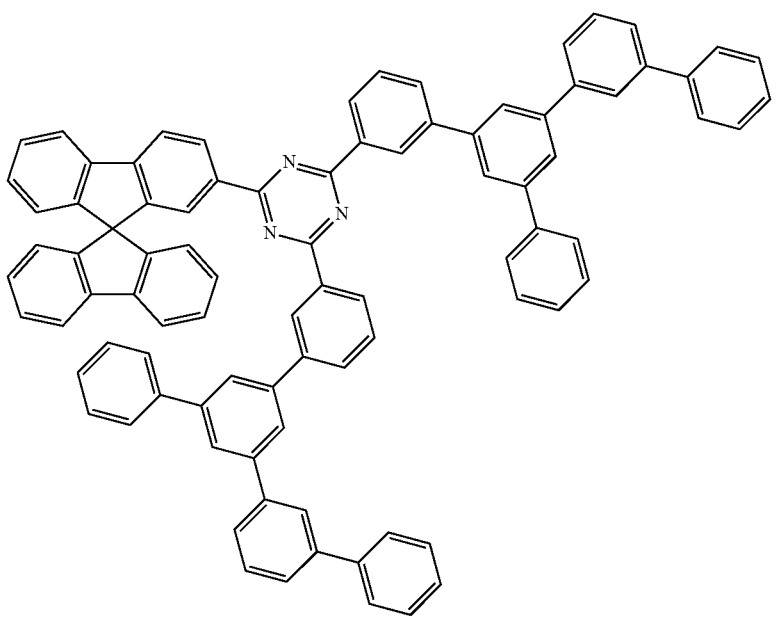 [SMILES: c1ccc(-c2cccc(-c3cc(-c4ccccc4)cc(-c4cccc(-c5nc(-c6cccc(-c7cc(-c8ccccc8)cc(-c8cccc(-c9ccccc9)c8)c7)c6)nc(-c6ccc7c(c6)C6(c8ccccc8-c8ccccc86)c6ccccc6-7)n5)c4)c3)c2)cc1]

M1

TABLE D3-continued
Structural formulae of the materials used in the emission layer
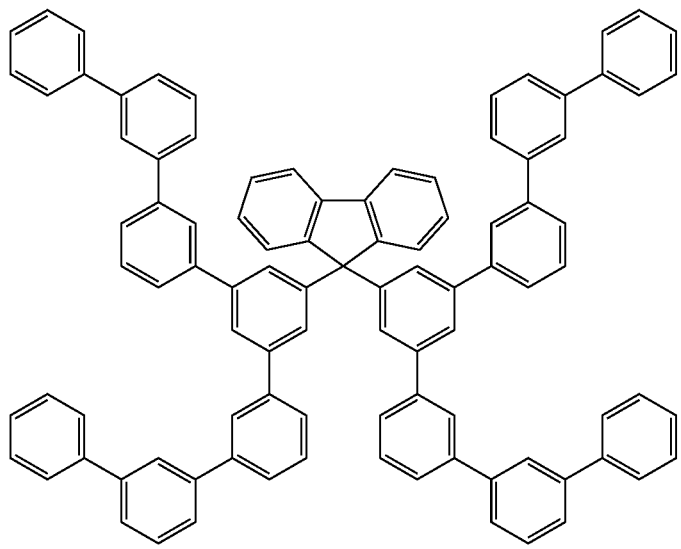 [SMILES: c1ccc(-c2cccc(-c3cccc(-c4cc(-c5cccc(-c6cccc(-c7ccccc7)c6)c5)cc(C5(c6cc(-c7cccc(-c8cccc(-c9ccccc9)c8)c7)cc(-c7cccc(-c8cccc(-c9ccccc9)c8)c7)c6)c6ccccc6-c6ccccc65)c4)c3)c2)cc1]
M2
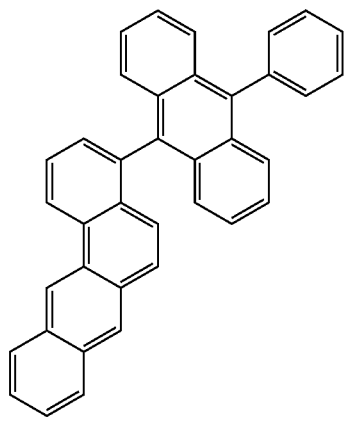 [SMILES: c1ccc(-c2c3ccccc3c(-c3cccc4c3ccc3cc5ccccc5cc34)c3ccccc23)cc1]
M3
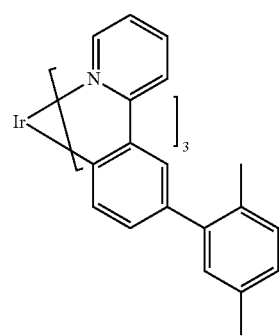
TEG TABLE D3-continued Structural formulae of the materials used in the emission layer

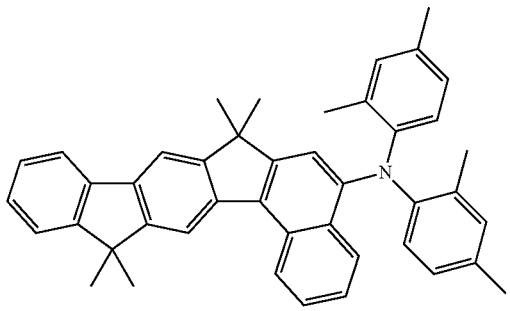 [SMILES: Cc1ccc(N(c2ccc(C)cc2C)c2cc3c(c4ccccc24)-c2cc4c(cc2C3(C)C)-c2ccccc2C4(C)C)c(C)c1]
SEB

The materials for the hole blocker layer and electron transport layer are likewise applied by thermal vapour deposition in a vacuum chamber and are shown in Table D4. The hole blocker layer consists of ETM1. The electron transport layer consists of the two materials ETM1 and ETM2, which are added to one another by co-evaporation in a proportion by volume of 50% each.

TABLE D4

HBL and ETL materials used

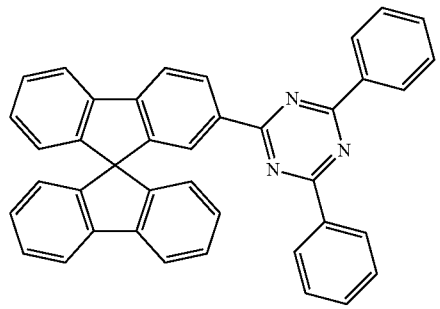 [SMILES: c1ccc(-c2nc(-c3ccccc3)nc(-c3ccc4c(c3)C3(c5ccccc5-c5ccccc53)c3ccccc3-4)n2)cc1]
ETM1

TABLE D4-continued

HBL and ETL materials used

ETM2

The cathode is formed by the thermal evaporation of an aluminium layer of thickness 100 nm.

The exact structure of the OLEDs can be found in Table D5. The HTL column lists the polymer used, and the temperature at which the layer is baked and optionally crosslinked.

TABLE D5

| | Structure of the OLEDs | | | | | | | |
|---|---|---|---|---|---|---|---|---|
| | | HIL | | | | HTL | | |
| | | | | Mass ratio of | | | | |
| Example | Structure | Polymer | Metal complex | polymer:metal complex | T [° C.] | Polymer | T [° C.] | EML Composition |
| D1 | B | P7 | D1 | 85:15 | 180 | — | — | M3 95%; SEB 5% |
| D2 | C | P8 | D1 | 85:15 | 180 | P2 | 180 | M1 30%; M2 55%; TEG 15% |
| D3 | A | P1 | — | — | 180 | — | — | — |
| D4 | A | P1 | D1 | 85:15 | 180 | — | — | — |
| D5 | A | P3 | — | — | 180 | — | — | — |
| D6 | A | P3 | D1 | 85:15 | 180 | — | — | — |
| D7 | B | P3 | D1 | 85:15 | 180 | — | — | M3 95%; SEB 5% |
| D8 | B | P1 | D1 | 85:15 | 180 | — | — | M3 95%; SEB 5% |
| D9 | C | P2 | D1 | 85:15 | 180 | P2 | 180 | M1 30%; M2 55%; TEG 15% |

TABLE D5-continued

Structure of the OLEDs

| | | HIL | | | | HTL | | |
|---|---|---|---|---|---|---|---|---|
| Example | Structure | Polymer | Metal complex | Mass ratio of polymer:metal complex | T [° C.] | Polymer | T [° C.] | EML Composition |
| D10 | C | P4 | D1 | 85:15 | 220 | P2 | 180 | M1 30%; M2 55%; TEG 15% |
| D11 | B | V1 | D1 | 85:15 | 180 | — | — | M3 95%; SEB 5% |

The OLEDs are characterized in a standard manner. For this purpose, the electroluminescence spectra, current-voltage-luminance characteristics (IUL characteristics) assuming Lambertian radiation characteristics and, in the case of structures B and C, the (operating) lifetime are determined. The IUL characteristics are used to determine parameters such as the operating voltage (in V) and the external quantum efficiency (in %) at a particular brightness. LD80 @ 1000 cd/m² is the lifetime until the OLED, given a starting brightness of 1000 cd/m², has dropped to 80% of the starting intensity, i.e. to 800 cd/m².

The properties of the different OLEDs are summarized in Tables D6 a and b. Examples D11 and D12 are comparative examples; all the other examples show properties of inventive OLEDs.

Tables D6a and D6b:
Properties of the OLEDs

TABLE D6a

| Example | Voltage at 1 mA/cm² [V] |
|---|---|
| D3 | 6 |
| D4 | 1.2 |
| D5 | 3.2 |
| D6 | 0.4 |

TABLE D6b

| Example | Efficiency at 1000 cd/m² % EQE | Voltage at 1000 cd/m² [V] | LD80 at 1000 cd/m² [h] |
|---|---|---|---|
| D1 | 8.1 | 4.4 | 205 |
| D2 | 16.5 | 4.9 | 195 |
| D7 | 7.9 | 4.5 | 266 |
| D8 | 8.2 | 4.3 | 305 |
| D9 | 16.5 | 4.9 | 215 |
| D10 | 16.3 | 4.5 | 240 |
| D11 | 8.1 | 4.4 | 108 |

Table D6 a shows that the voltages of components made from inventive mixtures (polymer and metal complex) are significantly lower than their equivalents without metal complex. The inventive mixtures are thus suitable as hole injection materials which lower the operating voltage of the OLED.

Table D6 b shows that the use of the inventive mixtures leads to an improvement in lifetime over the prior art.

The invention claimed is:

1. A composition comprising at least one polymer and at least one metal complex, wherein the polymer comprises at least one structural unit of formula (I):

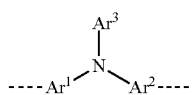
(I)

wherein
$Ar^1$, $Ar^2$ and $Ar^3$
are the same or different in each instance and are a mono- or polycyclic, aromatic or heteroaromatic ring system optionally substituted by one or more R radicals;
R is the same or different in each instance and is H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy, or thioalkoxy group having 1 to 40 carbon atoms or an alkenyl or alkynyl group having 2 to 40 carbon atoms or a branched or cyclic alkyl, alkoxy, or thioalkoxy group having 3 to 40 carbon atoms, each of which is optionally substituted by one or more $R^1$ radicals, wherein one or more nonadjacent $CH_2$ groups are optionally replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S, or $CONR^1$ and wherein one or more hydrogen atoms are optionally replaced by D, F, Cl, Br, I, or CN, an aromatic or heteroaromatic ring system which has 5 to 60 aromatic ring atoms and is optionally substituted in each case by one or more $R^1$ radicals, an aryloxy or heteroaryloxy group which has 5 to 60 aromatic ring atoms and is optionally substituted by one or more $R^1$ radicals, an aralkyl or heteroaralkyl group which has 5 to 60 aromatic ring atoms and is optionally substituted by one or more $R^1$ radicals, or a diarylamino group, diheteroarylamino group, or arylheteroarylamino group which has 10 to 40 aromatic ring atoms and is optionally substituted by one or more $R^1$ radicals; an wherein two or more R radicals together optionally define a mono- or polycyclic, aliphatic, aromatic and/or benzofused ring system;
$R^1$ is the same or different in each instance and is H, D, F or an aliphatic, aromatic and/or heteroaromatic hydrocarbyl radical having 1 to 20 carbon atoms, wherein one or more hydrogen atoms are optionally replaced by F; and wherein two or more $R^1$ substituents together optionally define a mono- or polycyclic, aliphatic or aromatic ring system; and
the dotted lines denote bonds to adjacent structural units in the polymer;

the metal complex comprises an atom selected from the group consisting of silicon, germanium, tin, lead, arsenic, antimony, and bismuth and a ligand of structure (L-I):

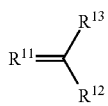

(L-I)

wherein
R$^{11}$ and R$^{12}$
may independently be oxygen, sulfur, selenium, NH, or NR$^{14}$, wherein R$^{14}$ is selected from the group comprising alkyl or aryl and may be bonded to R$^{13}$; and
R$^{13}$ is a straight-chain alkyl, alkoxy, or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, each of which are optionally substituted by one or more R$^1$ radicals, wherein one or more nonadjacent CH$_2$ groups are optionally replaced by R$^1$C=CR$^1$, C≡C, Si(R$^1$)$_2$, C=O, C=S, C=NR$^1$, P(=O)(R$^1$), SO, SO$_2$, NR$^1$, O, S, or CONR$^1$ and wherein one or more hydrogen atoms are optionally replaced by D, F, Cl, Br, I, or CN, an aromatic or heteroaromatic ring system which has 5 to 60 aromatic ring atoms and are optionally substituted in each case by one or more R$^1$ radicals, an aryloxy or heteroaryloxy group which has 5 to 60 aromatic ring atoms and is optionally substituted by one or more R$^1$ radicals, an aralkyl or heteroaralkyl group which has 5 to 60 aromatic ring atoms and is optionally substituted by one or more R$^1$ radicals, or a diarylamino group, diheteroarylamino group, or arylheteroarylamino group which has 10 to 40 aromatic ring atoms and is optionally substituted by one or more R$^1$ radicals; and wherein the R$^{13}$ radical optionally defines a ring system with one or both of the R$^{11}$ and R$^{12}$ radicals.

2. The composition of claim 1, wherein the Ar$^3$ radical of formula (I) is substituted by Ar$^4$ in at least one ortho position based on the position of the nitrogen atom shown in formula (I), wherein Ar$^4$ is a mono- or polycyclic, aromatic or heteroaromatic ring system which has 5 to 60 aromatic ring atoms and is optionally substituted by one or more R radicals.

3. The composition of claim 2, wherein the polymer comprises at least one structural unit of formula (I) selected from the structural unit of formula (Ia):

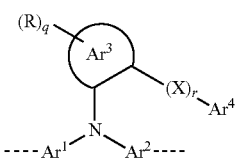

(Ia)

wherein
q is 0, 1, 2, 3, 4, 5, or 6;
X is CR$_2$, NR, SiR$_2$, O, S, C=O or P=O; and
r is 0 or 1.

4. The composition of claim 2, wherein Ar$^3$ is substituted by Ar$^4$ in one of the two ortho positions, and Ar$^3$ is additionally joined to Ar$^4$ in the meta position adjacent to the substituted ortho position.

5. The composition of claim 2, wherein the polymer comprises at least one structural unit of formula (I) selected from the structural unit of formula (Ib):

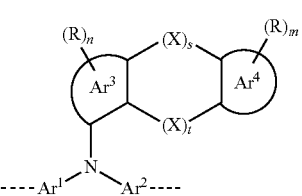

(Ib)

wherein
X is CR$_2$, NR, SiR$_2$, O, S, C=O, or P=O;
m is 0, 1, 2, 3 or 4;
n is 0, 1, 2, or 3; and
s and t are each 0 or 1, wherein the sum of (s+t)=1 or 2.

6. The composition of claim 2, wherein the at least one structural unit of formula (I) is selected from structural units of formulae (II), (III), and (IV):

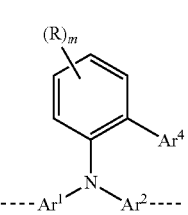

(II)

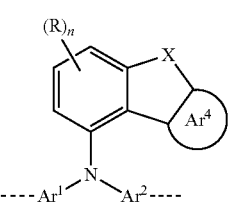

(III)

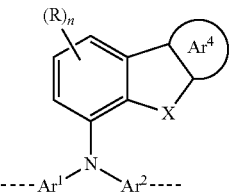

(IV)

wherein
X is CR$_2$, NR, SiR$_2$, O, S, C=O, or P=O;
m is 0, 1, 2, 3 or 4;
n is 0, 1, 2, or 3.

7. The composition of claim 6, wherein the at least one structural unit of formula (II) is selected from the structural unit of formula (V):

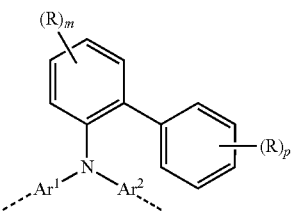

wherein
p is 0, 1, 2, 3, 4, or 5.

8. The composition of claim 6, wherein the at least one structural unit of formula (III) is selected from the structural unit of the following formula (VI):

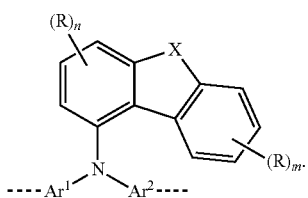

9. The composition of claim 6, wherein the at least one structural unit of formula (IV) is selected from the structural unit of formula (VII):

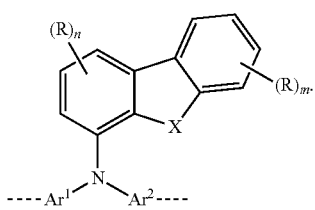

10. The composition of claim 1, wherein the polymer comprises at least one structural unit of formula (I) selected from the structural unit of formula (VIIIa):

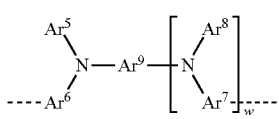

or the structural unit of formula (VIIIb):

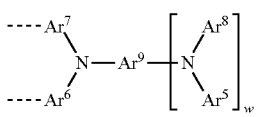

wherein
w is 1, 2, or 3;
$Ar^5$ to $Ar^9$ are each the same or different at each instance and are a mono- or polycyclic, aromatic or heteroaromatic ring system optionally substituted by one or more R radicals; and
the dotted lines denote bonds to adjacent structural units in the polymer.

11. The composition of claim 10, wherein at least one of the $Ar^5$ and/or $Ar^8$ radicals of formulae (VIIIa) and/or (VIIIb) is substituted by $Ar^4$ in at least one ortho position, based on the position of the nitrogen atom shown in formula (VIIIa) and/or (VIIIb), where $Ar^4$ is a mono- or polycyclic, aromatic or heteroaromatic ring system which has 5 to 60 aromatic ring atoms and is optionally substituted by one or more R radicals.

12. The composition of claim 10, wherein the at least one structural unit of formula (VIIIa) is selected from the structural units of formulae (VIIIa-1a), (VIIIa-1b), (VIIIa-1c), and (VIIIa-1d):

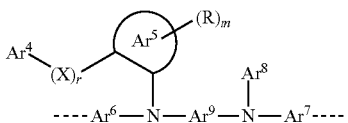

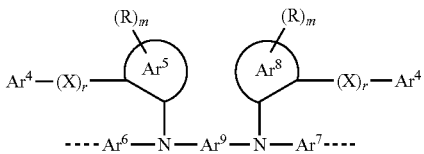

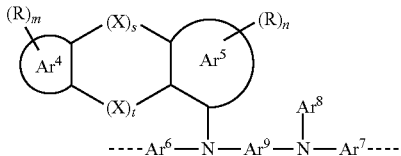

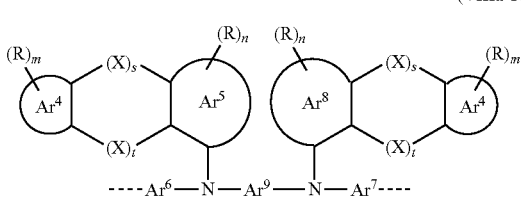

wherein
$Ar^4$ is a mono- or polycyclic, aromatic or heteroaromatic ring system which has 5 to 60 aromatic ring atoms and is optionally substituted by one or more R radicals;
X is $CR_2$, NR, $SiR_2$, O, S, C=O, or P=O;
m is 0, 1, 2, 3 or 4;
n is 0, 1, 2, or 3;
r is 0 or 1; and
s and t are each 0 or 1, wherein the sum of (s+t)=1 or 2.

13. The composition of claim 10, wherein the at least one structural unit of formula (VIIIa) is selected from structural units of formulae (IX), (X), (XI), (XII), (XIII), (XIV), (XV), and (XVI):

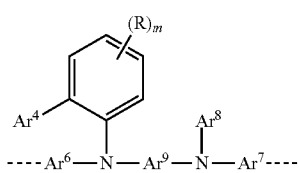
(IX)

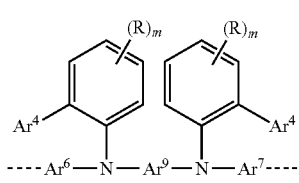
(X)

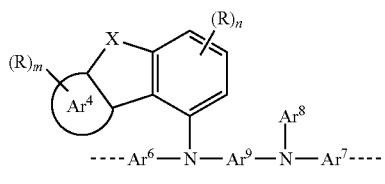
(XI)

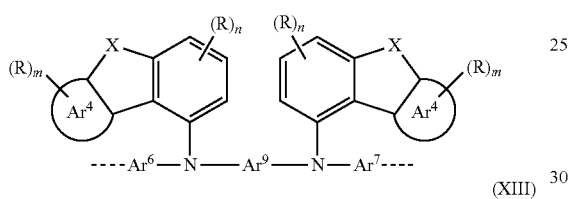
(XII)

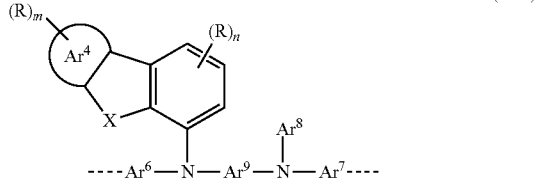
(XIII)

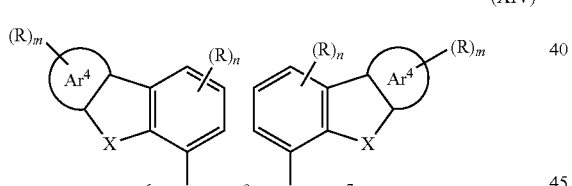
(XIV)

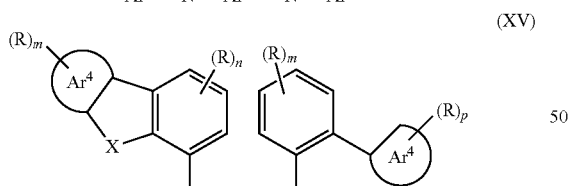
(XV)

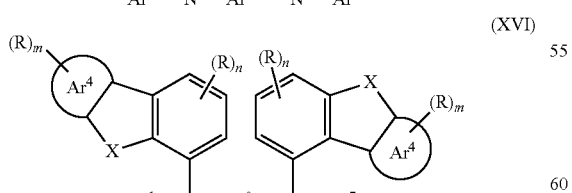
(XVI)

wherein $Ar^4$ is a mono- or polycyclic, aromatic or heteroaromatic ring system which has 5 to 60 aromatic ring atoms and is optionally substituted by one or more R radicals;

X is $CR_2$, NR, $SiR_2$, O, S, C=O, or P=O;

m is 0, 1, 2, 3 or 4;

n is 0, 1, 2, or 3; and p is 0, 1, 2, 3, 4, or 5.

14. The composition of claim 1, wherein at least one of the structural units of formulae (I) comprises at least one crosslinkable Q group.

15. The composition of claim 1, wherein the mono- or polycyclic, aromatic or heteroaromatic $Ar^3$ groups are selected from:

E1

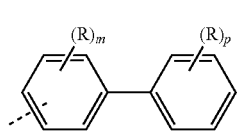
E2

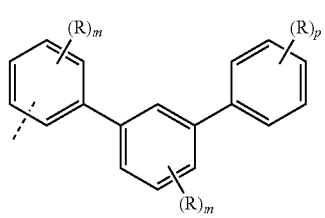
E3

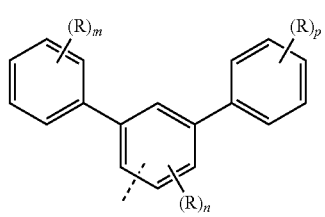
E4

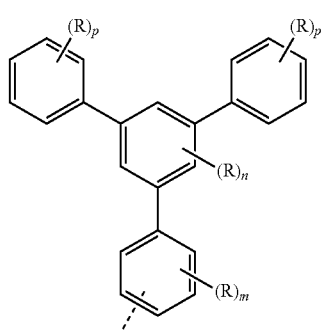
E5

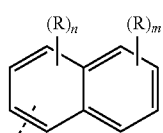
E6

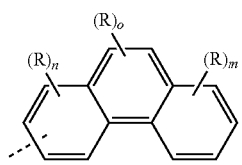
E7

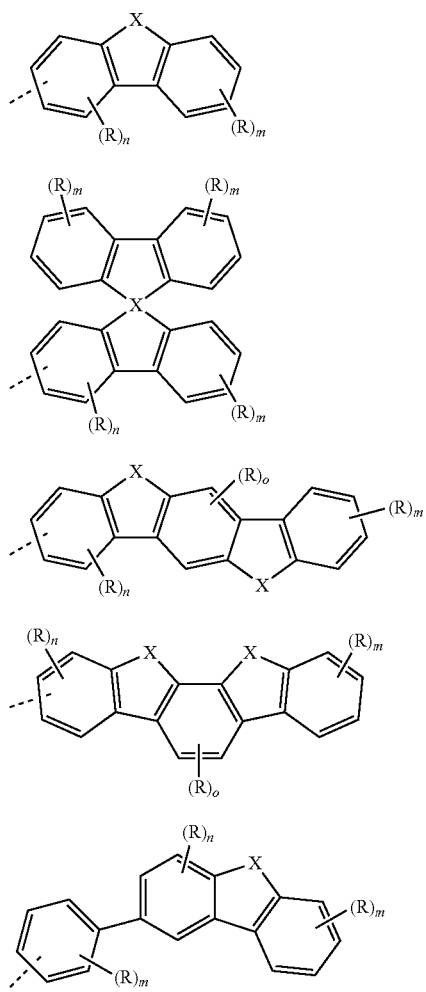
wherein
  X is $CR_2$, NR, $SiR_2$, O, S, C=O, or P=O;
  the dotted lines denote bonds to adjacent structural units in the polymer;
  m is 0, 1, 2, 3, or 4;
  n is 0, 1, 2, or 3;
  • is 0, 1, or 2; and
  p is 0, 1, 2, 3, 4, or 5.
16. The composition of claim 1, wherein the mono- or polycyclic, aromatic or heteroaromatic $Ar^1$ and $Ar^2$ groups are selected from:
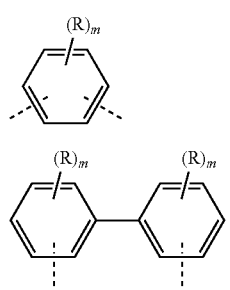
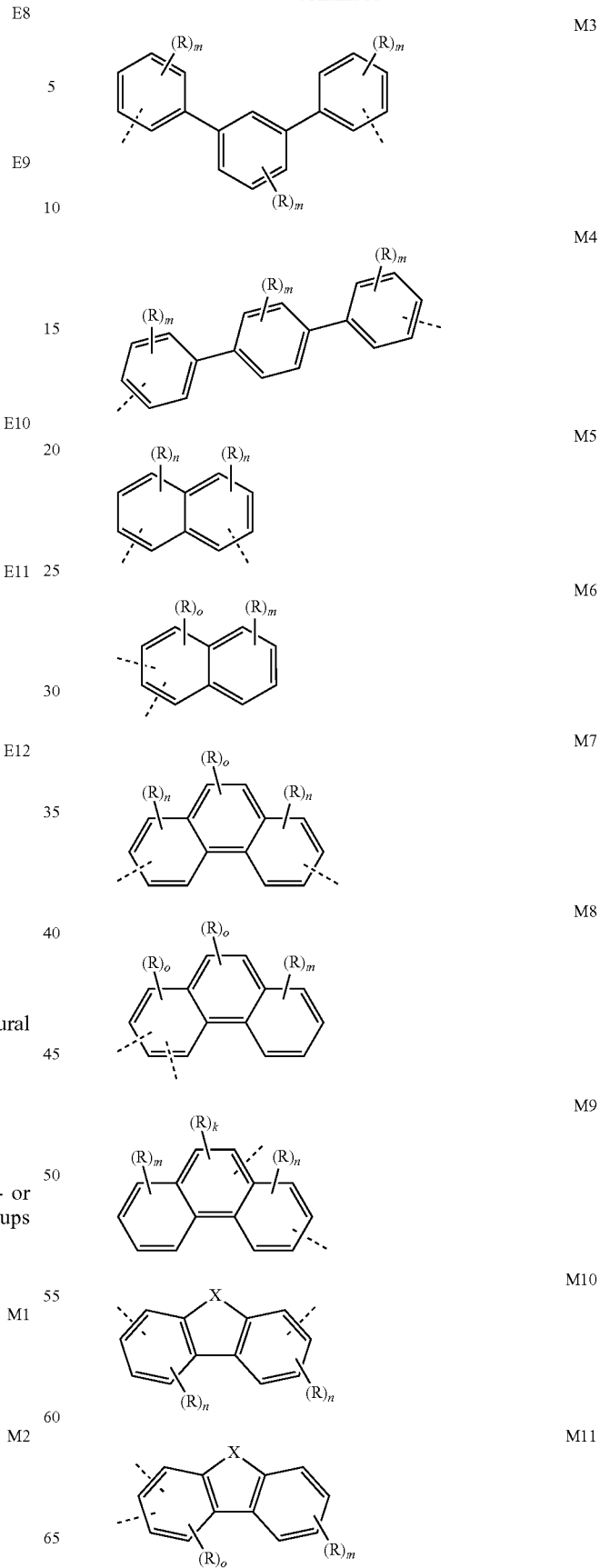

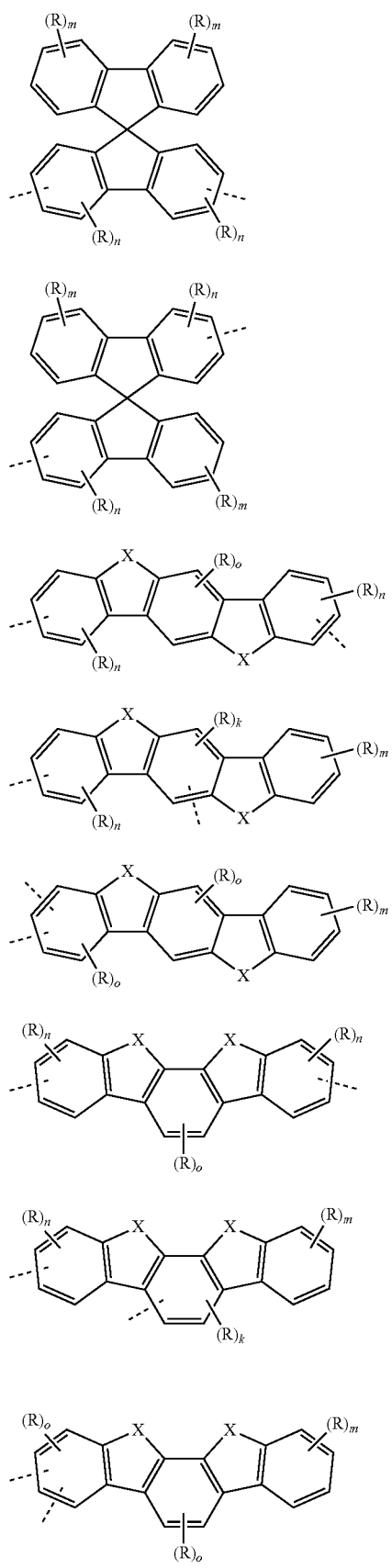

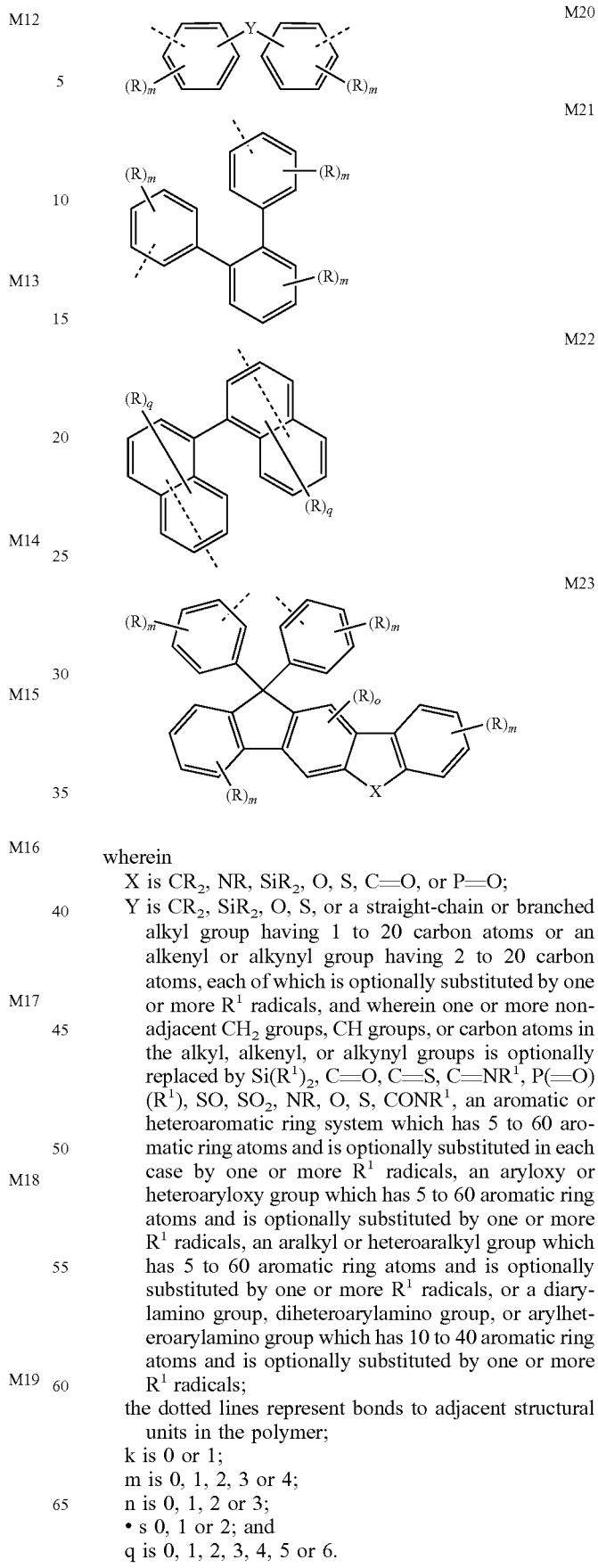

wherein
X is $CR_2$, NR, $SiR_2$, O, S, C=O, or P=O;
Y is $CR_2$, $SiR_2$, O, S, or a straight-chain or branched alkyl group having 1 to 20 carbon atoms or an alkenyl or alkynyl group having 2 to 20 carbon atoms, each of which is optionally substituted by one or more $R^1$ radicals, and wherein one or more non-adjacent $CH_2$ groups, CH groups, or carbon atoms in the alkyl, alkenyl, or alkynyl groups is optionally replaced by $Si(R^1)_2$, C=O, C=S, C=$NR^1$, P(=O)($R^1$), SO, $SO_2$, NR, O, S, $CONR^1$, an aromatic or heteroaromatic ring system which has 5 to 60 aromatic ring atoms and is optionally substituted in each case by one or more $R^1$ radicals, an aryloxy or heteroaryloxy group which has 5 to 60 aromatic ring atoms and is optionally substituted by one or more $R^1$ radicals, an aralkyl or heteroaralkyl group which has 5 to 60 aromatic ring atoms and is optionally substituted by one or more $R^1$ radicals, or a diarylamino group, diheteroarylamino group, or arylheteroarylamino group which has 10 to 40 aromatic ring atoms and is optionally substituted by one or more $R^1$ radicals;
the dotted lines represent bonds to adjacent structural units in the polymer;
k is 0 or 1;
m is 0, 1, 2, 3 or 4;
n is 0, 1, 2 or 3;
• s 0, 1 or 2; and
q is 0, 1, 2, 3, 4, 5 or 6.

17. The composition of claim 14, wherein the crosslinkable Q group is selected from the group consisting of (1) terminal or cyclic alkenyl or terminal dienyl and alkynyl groups, (2) alkenyloxy, dienyloxy, or alkynyloxy groups, (3) acrylic acid groups, (4) oxetane and oxirane groups, (5) silane groups, and (6) cyclobutane groups.

18. The composition of claim 17, wherein the crosslinkable Q group is selected from:

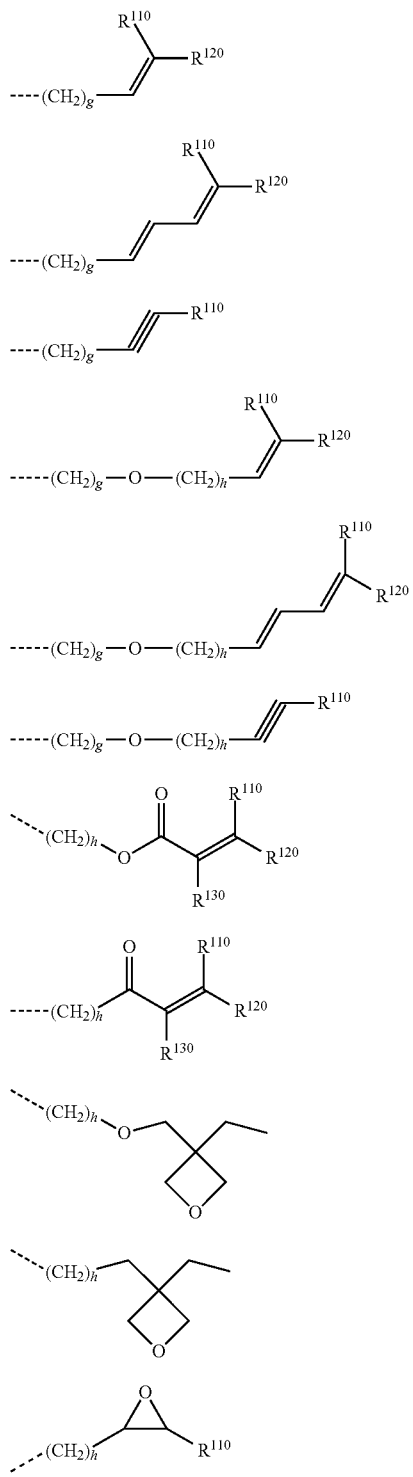

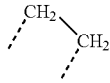

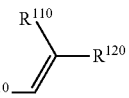

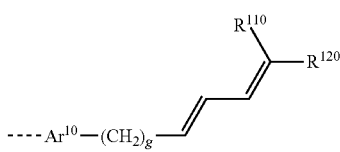

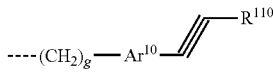

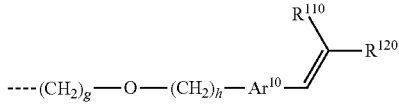

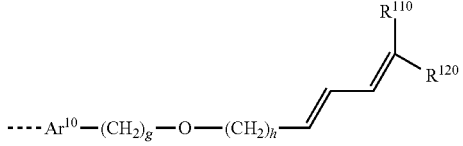

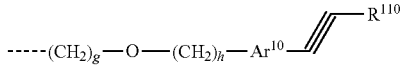

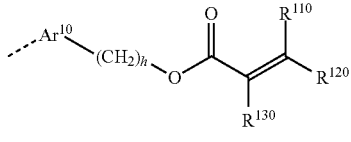

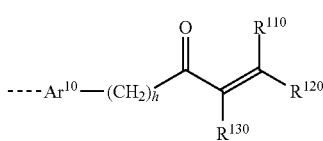

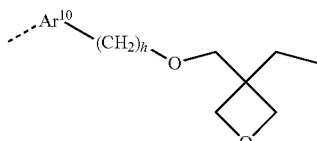

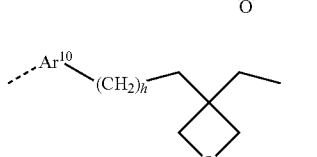

-continued

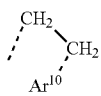

(Q24)

wherein
the $R^{110}$, $R^{120}$ and $R^{130}$ radicals in the formulae Q1 to Q8, Q11, Q13 to Q20 and Q23 are the same or different at each instance and are H or a straight-chain or branched alkyl group having 1 to 6 carbon atoms;
$Ar^{10}$ in the formulae Q13 to Q 24 is a mono- or polycyclic, aromatic or heteroaromatic ring system which is optionally substituted by one or more R radicals;
g is an integer from 0 to 8;
h is an integer from 1 to 8; and
the dotted bond in the formulae Q1 to Q11 and Q13 to Q23 and the dotted bonds in the formulae Q12 and Q24 denote the linkage of the crosslinkable group to one of the mono- or polycyclic, aromatic or heteroaromatic ring systems $Ar^1$ to $Ar^3$.

19. The composition of claim 1, wherein the proportion of structural units of formulae (I) in the polymer is in the range from 1 to 100 mol %, based on 100 mol % of all copolymerized monomers present as structural units in the polymer.

20. The composition of claim 1, wherein the polymer, as well as structural units of the formulae (I), comprises at least one further structural unit of formula (XIX) other than the structural units of formulae (I):

—$Ar^{11}$— (XII)

wherein $Ar^{11}$ is a mono- or polycyclic, aromatic or heteroaromatic ring system optionally substituted by one or more R radicals.

21. The composition of claim 14, wherein the proportion of structural units of the formula (I) having a crosslinkable Q group in the polymer is in the range from 0.1 to 50 mol %, based on 100 mol % of all copolymerized monomers present as structural units in the polymer.

22. The composition of claim 1, wherein the $R^{13}$ radical in formula (L-I) is selected from the group comprising alkyl, long-chain alkyl, alkoxy, long-chain alkoxy, cycloalkyl, haloalkyl, aryl, arylene, halogenaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, wherein, in the case of suitable radicals, one or more nonadjacent $CH_2$ groups independently are optionally replaced by —O—, —S—, —NH—, —NR—, —SiR$_2$—, —CO—, —COO—, —OCO—, —OCO—O—, —SO$_2$—, —S—CO—, —CO—S—, —CR=CR— or —C≡C—, in such a way that oxygen and/or sulfur atoms are not bonded directly to one another, and are likewise optionally replaced by aryl or heteroaryl, wherein terminal $CH_3$ groups are regarded as $CH_2$ groups in the sense of $CH_2$—H.

23. The composition of claim 1, wherein the metal atom of the metal complex is selected from the group comprising bismuth, tin, and mixtures thereof.

24. The composition of claim 1, wherein the metal complex has the structure $ML_m$ where M is a metal atom, L is a ligand, and m is an integer from 1 to 10 and, if m is greater than 1, all L are independent of one another.

25. The composition of claim 1, wherein the $R^{13}$ radical has at least one substituent selected from halogen, pseudohalogen, —CN, and —NO$_2$.

26. The composition of claim 1, wherein the $R^{13}$ radical corresponds to one of the formulae ($R^{13}$-I), ($R^{13}$-II), and ($R^{13}$-III):

($R^{13}$-I)

($R^{13}$-II)

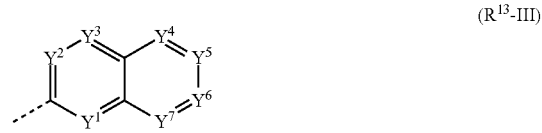

($R^{13}$-III)

wherein the $Y^1$ to $Y^7$ groups are each independently selected from the group comprising C—F, C—CF$_3$, C—NO$_2$, C—CN, C-halogen, C-pseudohalogen, and N.

27. The composition of claim 1, wherein the metal complex comprises a ligand L selected from the group of the unsubstituted, partly fluorinated, and perfluorinated organic carboxylic acids.

28. The composition of claim 1, wherein the weight ratio of polymer to metal complex is in the range from 1000:1 to 1:2.

29. A process for producing a composition according claim 1, wherein a polymer having structural units of formula (I) is contacted with a metal complex comprising a metal atom of groups 13 to 15 and a ligand of the structure (L-I).

30. A solution or formulation comprising at least one composition according to claim 1 in one or more solvents.

31. An electronic or optoelectronic component comprising one or more active layers, wherein at least one of the one or more active layers comprises one or more compositions according to claim 1.

32. The electronic or optoelectronic component of claim 31, wherein the electronic or optoelectronic component is selected from the group consisting of organic electroluminescent devices, organic light-emitting electrochemical cells, organic field-effect transistors, organic integrated circuits, organic thin-film transistors, organic solar cells, organic laser diodes, organic photovoltaic elements, organic photovoltaic devices, and organic photoreceptors.

33. The electronic or optoelectronic component of claim 32, wherein the active layer comprising one or more compositions.

* * * * *